(12) United States Patent
Lewis, II et al.

(10) Patent No.: US 11,785,745 B2
(45) Date of Patent: *Oct. 10, 2023

(54) VERTICAL EXHAUST DUCT FOR ELECTRONIC EQUIPMENT ENCLOSURE

(71) Applicant: CHATSWORTH PRODUCTS, INC., Simi Valley, CA (US)

(72) Inventors: Richard Evans Lewis, II, Austin, TX (US); Dennis W. Vanlith, Round Rock, TX (US)

(73) Assignee: Chatsworth Products, Inc., Simi Valley, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 18/092,386

(22) Filed: Jan. 2, 2023

(65) Prior Publication Data

US 2023/0156974 A1 May 18, 2023

Related U.S. Application Data

(63) Continuation of application No. 17/676,752, filed on Feb. 21, 2022, now Pat. No. 11,547,020, which is a
(Continued)

(51) Int. Cl.
*G06F 1/16* (2006.01)
*H05K 5/00* (2006.01)
(Continued)

(52) U.S. Cl.
CPC ....... *H05K 7/20754* (2013.01); *H05K 7/1488* (2013.01); *H05K 7/20745* (2013.01)

(58) Field of Classification Search
CPC .......... H05K 7/20572; H05K 7/20581; H05K 7/20645; H05K 7/20736; H05K 7/20754; H05K 7/1488; H05K 7/20745
See application file for complete search history.

(56) References Cited

U.S. PATENT DOCUMENTS

| 228,883 A | 6/1880 | Freeman |
| 1,129,040 A | 2/1915 | McClure |

(Continued)

FOREIGN PATENT DOCUMENTS

| AU | 2008254682 | 11/2012 |
| DE | 2509487 A1 | 9/1976 |

(Continued)

OTHER PUBLICATIONS

Information Disclosure Statement (IDS) Letter Regarding Common Patent Application(s), dated Mar. 14, 2023.
(Continued)

*Primary Examiner* — Anthony M Haughton
(74) *Attorney, Agent, or Firm* — Tillman Wright, PLLC; James D. Wright; David R. Higgins

(57) ABSTRACT

An electronic equipment enclosure includes a frame structure at least partially enclosed by a plurality of panels defining a compartment in which one or more electronic components are mounted and an exhaust air duct that is adapted to segregate hot air being exhausted from the compartment from cool air entering the compartment, thereby improving thermal management of the enclosure. The exhaust duct includes a lower duct section extending upward from the top panel of the compartment and an upper duct section telescoping upward from an upper end of the lower duct section. Each duct section includes four panels connected together by hinged corner fittings such that the section is collapsible. The upper duct section includes an outwardly flared portion.

20 Claims, 26 Drawing Sheets

Related U.S. Application Data continuation of application No. 17/008,034, filed on Aug. 31, 2020, now Pat. No. 11,259,446, which is a continuation of application No. 16/792,758, filed on Feb. 17, 2020, now Pat. No. 10,765,037, which is a continuation of application No. 16/450,353, filed on Jun. 24, 2019, now Pat. No. 10,568,239, which is a continuation of application No. 16/180,677, filed on Nov. 5, 2018, now Pat. No. 10,334,761, which is a continuation of application No. 15/784,751, filed on Oct. 16, 2017, now Pat. No. 10,123,462, which is a continuation of application No. 14/822,126, filed on Aug. 10, 2015, now Pat. No. 9,801,309, which is a continuation of application No. 14/286,335, filed on May 23, 2014, now Pat. No. 9,119,329, which is a continuation of application No. 13/348,820, filed on Jan. 12, 2012, now Pat. No. 8,737,068, which is a continuation of application No. 12/555,697, filed on Sep. 8, 2009, now Pat. No. 8,107,238, which is a continuation-in-part of application No. 11/533,359, filed on Sep. 19, 2006, now abandoned.

(60) Provisional application No. 60/718,548, filed on Sep. 19, 2005, provisional application No. 61/095,147, filed on Sep. 8, 2008.

(51) Int. Cl.
  *H05K 7/00* (2006.01)
  *H05K 7/20* (2006.01)
  *H05K 7/14* (2006.01)

(56) References Cited

U.S. PATENT DOCUMENTS

| | | |
|---|---|---|
| 1,279,978 A | 9/1918 | Brooks |
| 1,484,491 A | 2/1924 | Gutermann |
| 1,889,711 A | 11/1932 | Talley et al. |
| 1,935,690 A | 11/1933 | Zack |
| 2,039,886 A | 5/1936 | Cohn |
| 2,201,312 A | 5/1940 | Hauser |
| 2,226,523 A | 12/1940 | Peck |
| 2,227,587 A | 1/1941 | Jones et al. |
| 2,330,769 A | 9/1943 | Wichner |
| 2,338,801 A | 1/1944 | Callan |
| 2,352,876 A | 7/1944 | Wilson |
| 2,378,272 A | 6/1945 | Whitaker |
| 2,457,002 A | 12/1948 | Spiro |
| 2,477,315 A | 7/1949 | Smith |
| 2,521,351 A | 9/1950 | Dimmendaal |
| 2,780,981 A | 2/1957 | Miller |
| 2,912,013 A | 11/1959 | Freyholdt et al. |
| 3,143,195 A | 8/1964 | Schroeder |
| 3,192,306 A | 6/1965 | Skonnord |
| 3,212,529 A | 10/1965 | Ullman et al. |
| 3,251,382 A | 5/1966 | Tatsch |
| 3,325,585 A | 6/1967 | Brenneman |
| 3,343,567 A | 9/1967 | Mulligan et al. |
| 3,362,403 A | 1/1968 | Fleming et al. |
| 3,364,838 A | 1/1968 | Bradley |
| 3,387,809 A | 6/1968 | Zwerling |
| 3,407,016 A | 10/1968 | Kronenberger |
| 3,411,427 A | 11/1968 | Graham et al. |
| 3,482,861 A | 12/1969 | Keating |
| 3,493,237 A | 2/1970 | Kleindienst |
| 3,503,166 A | 3/1970 | Lipper et al. |
| 3,563,627 A | 2/1971 | Whipps |
| 3,672,706 A | 6/1972 | Chilcoat |
| 3,818,948 A | 6/1974 | Hedges |
| 3,827,342 A | 8/1974 | Hughes |
| 3,915,481 A | 10/1975 | Marsh, Jr. |
| 3,937,133 A | 2/1976 | Bertin et al. |
| 3,975,877 A | 8/1976 | Walton |
| 4,007,941 A | 2/1977 | Stancati |
| 4,218,079 A | 8/1980 | Arnoldt |
| 4,323,110 A | 4/1982 | Rubbright et al. |
| 4,347,782 A | 9/1982 | Hoecke |
| 4,357,860 A | 11/1982 | Krzak |
| 4,495,234 A | 1/1985 | Tominaga et al. |
| 4,495,545 A | 1/1985 | Dufresne et al. |
| 4,522,669 A | 6/1985 | Nordin et al. |
| 4,543,677 A | 10/1985 | Haglund et al. |
| 4,633,766 A | 1/1987 | Nation et al. |
| 4,648,007 A | 3/1987 | Garner |
| 4,774,631 A | 9/1988 | Okuyama et al. |
| 4,791,980 A | 12/1988 | Hagar et al. |
| 4,859,143 A | 8/1989 | Larrabee et al. |
| 4,895,378 A | 1/1990 | Newquist et al. |
| 4,944,082 A | 7/1990 | Jones et al. |
| 5,107,622 A | 4/1992 | Fuchs et al. |
| 5,123,874 A | 6/1992 | White, III |
| 5,162,976 A | 11/1992 | Moore et al. |
| 5,194,312 A | 3/1993 | Verig |
| 5,216,579 A | 6/1993 | Basara et al. |
| 5,219,403 A | 6/1993 | Murphy |
| 5,256,105 A | 10/1993 | Austin |
| 5,294,748 A | 3/1994 | Schwenk et al. |
| 5,347,430 A | 9/1994 | Curlee et al. |
| 5,364,163 A | 11/1994 | Hardison |
| 5,460,441 A | 10/1995 | Hastings et al. |
| 5,473,114 A | 12/1995 | Vogel et al. |
| 5,488,543 A | 1/1996 | Mazura et al. |
| 5,515,655 A | 5/1996 | Hoffmann |
| 5,524,104 A | 6/1996 | Iwata et al. |
| 5,528,454 A | 6/1996 | Niklos |
| 5,536,079 A | 7/1996 | Kostic |
| 5,544,012 A | 8/1996 | Koike |
| 5,545,845 A * | 8/1996 | Flores .................. H05K 7/183 174/374 |
| 5,566,954 A | 10/1996 | Hahn |
| 5,570,740 A | 11/1996 | Flores et al. |
| 5,619,014 A | 4/1997 | Faulkner |
| 5,647,184 A | 7/1997 | Davis |
| 5,660,212 A | 8/1997 | Elder |
| 5,671,805 A | 9/1997 | Stahl et al. |
| 5,851,143 A | 12/1998 | Hamid |
| 5,865,478 A * | 2/1999 | Lin ..................... F24F 13/0209 285/414 |
| 5,918,644 A | 7/1999 | Haack et al. |
| 5,941,767 A | 8/1999 | Fukuda |
| 5,943,219 A * | 8/1999 | Bellino ................ H05K 9/0015 174/383 |
| 5,957,506 A | 9/1999 | Stepp |
| 5,979,854 A | 11/1999 | Lundgren et al. |
| 5,995,368 A | 11/1999 | Lee et al. |
| 5,997,117 A | 12/1999 | Krietzman |
| 6,034,873 A | 3/2000 | Stahl et al. |
| 6,036,290 A | 3/2000 | Jancsek et al. |
| 6,044,193 A | 3/2000 | Szetesi et al. |
| 6,052,277 A | 4/2000 | Liu et al. |
| 6,067,233 A | 5/2000 | English et al. |
| 6,075,698 A | 6/2000 | Hogan et al. |
| 6,104,003 A | 8/2000 | Jones |
| D432,098 S | 10/2000 | Nelson et al. |
| 6,127,663 A | 10/2000 | Jones |
| 6,131,960 A | 10/2000 | McHughs |
| 6,163,454 A | 12/2000 | Strickler |
| 6,185,098 B1 | 2/2001 | Benavides |
| 6,198,628 B1 | 3/2001 | Smith |
| 6,209,269 B1 | 4/2001 | Valderrama |
| 6,222,729 B1 | 4/2001 | Yoshikawa |
| 6,226,950 B1 | 5/2001 | Davis |
| 6,231,704 B1 | 5/2001 | Carpinetti |
| 6,250,727 B1 | 6/2001 | Kan et al. |
| 6,304,438 B1 | 10/2001 | Liu et al. |
| 6,305,180 B1 | 10/2001 | Miller et al. |
| 6,311,735 B1 | 11/2001 | Small |
| 6,333,851 B1 | 12/2001 | Shih |
| 6,364,374 B1 | 4/2002 | Noone et al. |
| 6,381,147 B1 | 4/2002 | Hayward et al. |
| 6,383,242 B1 | 5/2002 | Rogers et al. |
| 6,459,579 B1 | 10/2002 | Farmer et al. |

(56) References Cited

U.S. PATENT DOCUMENTS

| | | |
|---|---|---|
| 6,462,944 B1 | 10/2002 | Lin |
| 6,490,156 B2 | 12/2002 | Chen |
| 6,494,050 B2 | 12/2002 | Spinazzola et al. |
| 6,525,935 B2 | 2/2003 | Casebolt |
| 6,529,371 B1 | 3/2003 | Laio |
| 6,532,152 B1 | 3/2003 | White et al. |
| 6,539,677 B1 | 4/2003 | Lanka |
| 6,554,697 B1 | 4/2003 | Koplin |
| 6,557,357 B2 | 5/2003 | Spinazzola et al. |
| 6,574,970 B2 | 6/2003 | Spinazzola et al. |
| 6,592,448 B1 | 7/2003 | Williams |
| 6,600,100 B2 | 7/2003 | Ho et al. |
| 6,616,524 B2 * | 9/2003 | Storck, Jr. .......... H05K 7/20745 361/678 |
| 6,646,872 B1 | 11/2003 | Chen |
| 6,646,878 B2 | 11/2003 | Chan |
| 6,652,373 B2 | 11/2003 | Sharp et al. |
| 6,668,565 B1 | 12/2003 | Johnson et al. |
| 6,669,400 B1 | 12/2003 | Sergi |
| 6,669,552 B1 | 12/2003 | Beer |
| 6,672,955 B2 | 1/2004 | Charron |
| 6,745,579 B2 | 6/2004 | Spinazzola et al. |
| 6,766,832 B2 * | 7/2004 | DiMarco .............. F24F 13/0272 138/155 |
| 6,788,535 B2 | 9/2004 | Dodgen et al. |
| 6,791,841 B1 | 9/2004 | Tirrell et al. |
| 6,801,427 B2 | 10/2004 | Gan et al. |
| 6,819,563 B1 | 11/2004 | Chu et al. |
| 6,843,277 B2 | 1/2005 | Meguro et al. |
| 6,848,720 B2 | 2/2005 | Carns et al. |
| 6,854,284 B2 | 2/2005 | Bash et al. |
| 6,867,967 B2 | 3/2005 | Mok |
| 6,896,612 B1 | 5/2005 | Novotny |
| 6,904,968 B2 * | 6/2005 | Beitelmal ............... G06F 1/206 165/80.2 |
| 6,912,131 B2 | 6/2005 | Kabat |
| 6,957,670 B1 | 10/2005 | Kajino |
| 7,011,576 B2 | 3/2006 | Sharp et al. |
| 7,016,194 B1 | 3/2006 | Wong |
| 7,022,008 B1 | 4/2006 | Crocker |
| 7,033,267 B2 | 4/2006 | Rasmussen |
| 7,112,131 B2 | 9/2006 | Rasmussen et al. |
| 7,144,320 B2 | 12/2006 | Turek et al. |
| 7,145,772 B2 * | 12/2006 | Fink ..................... H05K 7/2079 62/414 |
| 7,154,748 B2 | 12/2006 | Yamada |
| 7,182,208 B2 | 2/2007 | Tachibana |
| 7,195,290 B2 | 3/2007 | Duffy |
| 7,212,403 B2 | 5/2007 | Rockenfell |
| 7,212,787 B2 | 5/2007 | Wu et al. |
| 7,226,353 B2 * | 6/2007 | Bettridge .......... H05K 7/20736 361/695 |
| 7,236,362 B2 | 6/2007 | Wang et al. |
| 7,255,640 B2 | 8/2007 | Aldag et al. |
| 7,259,961 B2 | 8/2007 | Lucero et al. |
| 7,259,963 B2 * | 8/2007 | Germagian ........ H05K 7/20745 361/691 |
| 7,286,345 B2 | 10/2007 | Casebolt |
| 7,309,279 B2 | 12/2007 | Sharp et al. |
| 7,349,209 B2 | 3/2008 | Campbell et al. |
| 7,355,850 B2 | 4/2008 | Baldwin |
| 7,372,695 B2 | 5/2008 | Coglitore et al. |
| 7,427,713 B2 | 9/2008 | Adducci et al. |
| 7,430,118 B1 | 9/2008 | Noteboom et al. |
| 7,438,124 B2 | 10/2008 | Bhatti et al. |
| 7,438,638 B2 | 10/2008 | Lewis, II et al. |
| 7,476,804 B2 | 1/2009 | Adducci et al. |
| 7,485,803 B2 | 2/2009 | Adducci et al. |
| 7,486,512 B2 | 2/2009 | Campbell et al. |
| 7,490,872 B2 | 2/2009 | Yamamoto et al. |
| 7,495,169 B2 | 2/2009 | Adducci et al. |
| 7,498,512 B2 | 3/2009 | Adducci et al. |
| 7,500,911 B2 | 3/2009 | Johnson et al. |
| 7,504,581 B2 | 3/2009 | Adducci et al. |
| 7,508,663 B2 * | 3/2009 | Coglitore ........... H05K 7/20736 165/122 |
| 7,542,287 B2 | 6/2009 | Lewis, II et al. |
| 7,592,541 B2 | 9/2009 | Adducci et al. |
| 7,604,535 B2 | 10/2009 | Germagian et al. |
| 7,608,779 B2 | 10/2009 | Adducci et al. |
| 7,643,291 B2 | 1/2010 | Mallia et al. |
| 7,646,602 B1 | 1/2010 | Tamarkin et al. |
| 7,667,135 B2 | 2/2010 | Adducci et al. |
| 7,718,891 B2 | 5/2010 | Adducci et al. |
| 7,751,188 B1 | 7/2010 | French et al. |
| 7,752,858 B2 | 7/2010 | Johnson et al. |
| 7,764,495 B2 | 7/2010 | Hruby et al. |
| 7,772,489 B2 | 8/2010 | Adducci et al. |
| 7,781,675 B2 | 8/2010 | Adducci et al. |
| 7,795,532 B2 | 9/2010 | Walker |
| 7,800,900 B1 | 9/2010 | Noteboom et al. |
| 7,804,685 B2 | 9/2010 | Krietzman |
| 7,878,888 B2 | 2/2011 | Rasmussen et al. |
| 7,880,084 B2 | 2/2011 | Adducci et al. |
| 7,894,190 B2 | 2/2011 | Davis et al. |
| 7,895,855 B2 | 3/2011 | Gooch |
| 7,944,692 B2 | 5/2011 | Grantham et al. |
| 7,952,869 B2 | 5/2011 | Lewis, II et al. |
| 7,957,139 B2 | 6/2011 | Davis et al. |
| 3,004,839 A1 | 8/2011 | Sato et al. |
| 8,035,965 B2 | 10/2011 | Adducci et al. |
| 8,040,673 B2 | 10/2011 | Krietzman |
| 8,087,979 B2 | 1/2012 | Rasmussen |
| 8,107,238 B2 | 1/2012 | Krietzman et al. |
| 8,217,315 B2 | 7/2012 | Suetsugu |
| 8,235,349 B1 | 8/2012 | Conklin et al. |
| 8,237,052 B2 | 8/2012 | Adducci et al. |
| 8,257,155 B2 | 9/2012 | Lewis, II |
| 8,385,850 B1 | 2/2013 | Thompson et al. |
| 8,395,046 B2 | 3/2013 | Nicewicz et al. |
| 8,403,736 B2 | 3/2013 | Rasmussen et al. |
| 8,405,982 B2 | 3/2013 | Grantham et al. |
| 8,405,984 B2 | 3/2013 | Donowho et al. |
| 8,427,830 B2 | 4/2013 | Absalom |
| 8,523,643 B1 | 9/2013 | Roy |
| 8,653,363 B2 | 2/2014 | Behrens et al. |
| 8,730,665 B2 | 5/2014 | Lewis, II et al. |
| 8,737,068 B2 | 5/2014 | Krietzman et al. |
| 8,867,206 B2 | 10/2014 | Hruby et al. |
| 8,888,158 B2 | 11/2014 | Slessman |
| 8,973,951 B2 | 3/2015 | Nicewicz |
| 9,066,450 B2 | 6/2015 | Bednarcik et al. |
| 9,084,369 B2 | 7/2015 | Lewis, II et al. |
| 9,119,329 B2 | 8/2015 | Krietzman et al. |
| 9,210,833 B2 | 12/2015 | Caveney et al. |
| 9,313,927 B2 | 4/2016 | Krietzman |
| 9,351,427 B2 | 5/2016 | Lewis, II et al. |
| 9,420,727 B2 | 8/2016 | Lewis, II et al. |
| 9,426,903 B1 | 8/2016 | Morales |
| 9,549,487 B2 | 1/2017 | Lewis, II et al. |
| 9,572,286 B2 | 2/2017 | Greeson et al. |
| 9,585,266 B2 | 2/2017 | Krietzman et al. |
| 9,714,529 B1 | 7/2017 | Conklin et al. |
| 9,795,060 B2 | 10/2017 | Greeson et al. |
| 9,801,309 B2 | 10/2017 | Krietzman et al. |
| 9,949,406 B2 | 4/2018 | Lewis, II et al. |
| 9,955,616 B2 | 4/2018 | Krietzman et al. |
| 9,974,198 B2 | 5/2018 | Lewis, II et al. |
| 10,123,462 B2 | 11/2018 | Krietzman et al. |
| 10,133,320 B2 | 11/2018 | Lewis, II et al. |
| 10,306,812 B2 | 5/2019 | Krietzman |
| 10,334,761 B2 | 6/2019 | Krietzman et al. |
| 10,440,847 B2 | 10/2019 | Lewis, II et al. |
| 10,568,239 B2 | 2/2020 | Krietzman et al. |
| 10,568,246 B2 | 2/2020 | Krietzman et al. |
| 10,624,232 B2 | 4/2020 | Krietzman |
| 10,674,634 B2 | 6/2020 | Lewis, II et al. |
| 10,765,037 B2 | 9/2020 | Lewis, II et al. |
| 10,791,640 B2 | 9/2020 | Lewis, II et al. |
| 11,083,108 B2 | 8/2021 | Lewis, II et al. |
| 11,132,035 B2 | 9/2021 | Lewis, II |
| 11,166,395 B2 | 11/2021 | Krietzman |
| 11,212,928 B2 | 12/2021 | Lewis, II et al. |

(56) References Cited

U.S. PATENT DOCUMENTS

| | | |
|---|---|---|
| 11,259,446 B2 | 2/2022 | Lewis et al. |
| 11,464,132 B2 | 10/2022 | Krietzman |
| 11,547,020 B2 | 1/2023 | Lewis, II et al. |
| 2001/0029163 A1 | 10/2001 | Spinazzola et al. |
| 2002/0007643 A1 | 1/2002 | Spinazzola et al. |
| 2002/0059804 A1 | 5/2002 | Spinazzola et al. |
| 2002/0101721 A1 | 8/2002 | Blood |
| 2002/0108386 A1 | 8/2002 | Spinazzola et al. |
| 2002/0153725 A1 | 10/2002 | Myers |
| 2003/0050003 A1 | 3/2003 | Charron |
| 2003/0116213 A1 | 6/2003 | DiMarco |
| 2004/0007348 A1 | 1/2004 | Stoller |
| 2004/0050808 A1 | 3/2004 | Krampotich et al. |
| 2004/0099747 A1 | 5/2004 | Johnson et al. |
| 2004/0105222 A1 | 6/2004 | Chen et al. |
| 2004/0182799 A1 | 9/2004 | Tachibana |
| 2004/0190270 A1 | 9/2004 | Aldag et al. |
| 2004/0190929 A1 | 9/2004 | Yoshiki |
| 2004/0201333 A1 | 10/2004 | Chen |
| 2004/0223300 A1 | 11/2004 | Fink et al. |
| 2004/0257766 A1 | 12/2004 | Rasmussen et al. |
| 2005/0054282 A1 | 3/2005 | Green et al. |
| 2005/0153649 A1 | 7/2005 | Bettridge et al. |
| 2005/0168945 A1 | 8/2005 | Coglitore |
| 2005/0170770 A1 | 8/2005 | Johnson et al. |
| 2005/0180770 A1* | 8/2005 | Wong ............ G06F 3/1246 399/82 |
| 2005/0207116 A1 | 9/2005 | Yatskov et al. |
| 2005/0225936 A1 | 10/2005 | Day |
| 2005/0237716 A1 | 10/2005 | Chu et al. |
| 2005/0280986 A1 | 12/2005 | Coglitore et al. |
| 2005/0286222 A1 | 12/2005 | Lucero |
| 2005/0286223 A1 | 12/2005 | Morales |
| 2006/0032455 A1 | 2/2006 | Bonner et al. |
| 2006/0141921 A1 | 6/2006 | Turek et al. |
| 2006/0213498 A1 | 9/2006 | Sellwood |
| 2006/0276121 A1 | 12/2006 | Rasmussen |
| 2006/0283816 A1 | 12/2006 | Moore et al. |
| 2006/0288651 A1 | 12/2006 | Zeng et al. |
| 2007/0025073 A1 | 2/2007 | Liu |
| 2007/0044416 A1 | 3/2007 | Van Dijk |
| 2007/0064389 A1 | 3/2007 | Lewis, II et al. |
| 2007/0064391 A1 | 3/2007 | Lewis, II et al. |
| 2007/0129000 A1 | 6/2007 | Rasmussen et al. |
| 2007/0171610 A1 | 7/2007 | Lewis |
| 2007/0171613 A1 | 7/2007 | McMahan et al. |
| 2007/0173189 A1 | 7/2007 | Lewis |
| 2007/0183129 A1 | 8/2007 | Lewis, II et al. |
| 2007/0210679 A1 | 9/2007 | Adducci et al. |
| 2007/0210680 A1 | 9/2007 | Appino et al. |
| 2007/0210681 A1 | 9/2007 | Adducci et al. |
| 2007/0210683 A1 | 9/2007 | Adducci et al. |
| 2007/0210686 A1 | 9/2007 | Adducci et al. |
| 2007/0221393 A1 | 9/2007 | Adducci et al. |
| 2007/0254583 A1 | 11/2007 | Germagian et al. |
| 2007/0259616 A1 | 11/2007 | Scattolin et al. |
| 2007/0293138 A1 | 12/2007 | Adducci et al. |
| 2008/0002358 A1 | 1/2008 | Casebolt |
| 2008/0029081 A1 | 2/2008 | Gagas et al. |
| 2008/0067904 A1 | 3/2008 | Adducci et al. |
| 2008/0068791 A1 | 3/2008 | Ebermann |
| 2008/0074849 A1 | 3/2008 | Adducci et al. |
| 2008/0094797 A1 | 4/2008 | Coglitore et al. |
| 2008/0098763 A1 | 5/2008 | Yamaoka |
| 2008/0134745 A1 | 6/2008 | Hermanson |
| 2008/0174217 A1 | 7/2008 | Walker |
| 2008/0174954 A1 | 7/2008 | VanGilder et al. |
| 2008/0180908 A1 | 7/2008 | Wexler |
| 2008/0212265 A1 | 9/2008 | Mazura et al. |
| 2008/0266789 A1 | 10/2008 | Hruby et al. |
| 2009/0021907 A1 | 1/2009 | Mann et al. |
| 2009/0059523 A1 | 3/2009 | Mallia et al. |
| 2009/0061755 A1 | 3/2009 | Calder et al. |
| 2009/0086432 A1 | 4/2009 | Campbell et al. |
| 2009/0190307 A1 | 7/2009 | Krietzman |
| 2009/0227197 A1 | 9/2009 | Lewis, II et al. |
| 2009/0239460 A1 | 9/2009 | Lucia et al. |
| 2009/0239461 A1 | 9/2009 | Lewis, II et al. |
| 2010/0003911 A1 | 1/2010 | Graczyk et al. |
| 2010/0027216 A1 | 2/2010 | Matsushima et al. |
| 2010/0061059 A1 | 3/2010 | Krietzman et al. |
| 2010/0085707 A1 | 4/2010 | Moss |
| 2010/0114356 A1 | 5/2010 | Schmitt et al. |
| 2010/0172092 A1 | 7/2010 | Davis et al. |
| 2010/0172093 A1 | 7/2010 | Davis et al. |
| 2010/0178202 A1 | 7/2010 | Isobe et al. |
| 2010/0216388 A1 | 8/2010 | Fresh et al. |
| 2010/0248610 A1 | 9/2010 | Caveney et al. |
| 2010/0252233 A1 | 10/2010 | Absalom |
| 2011/0019362 A1 | 1/2011 | Krietzman |
| 2011/0072729 A1 | 3/2011 | Otsuka et al. |
| 2011/0148261 A1 | 6/2011 | Donowho et al. |
| 2011/0205705 A1 | 8/2011 | Graybill et al. |
| 2011/0222241 A1 | 9/2011 | Shearman et al. |
| 2011/0237174 A1 | 9/2011 | Felisi et al. |
| 2011/0278250 A1 | 11/2011 | Malekmadani |
| 2011/0278999 A1 | 11/2011 | Caveney et al. |
| 2011/0287704 A1 | 11/2011 | Lewis, II et al. |
| 2011/0290553 A1 | 12/2011 | Behrens et al. |
| 2011/0307102 A1 | 12/2011 | Czamara et al. |
| 2012/0013229 A1 | 1/2012 | Krietzman |
| 2012/0015553 A1 | 1/2012 | Rosendahl |
| 2012/0049706 A1 | 3/2012 | Cottuli et al. |
| 2012/0063087 A1 | 3/2012 | Wei |
| 2012/0071076 A1 | 3/2012 | Wei et al. |
| 2012/0112612 A1 | 5/2012 | Krietzman |
| 2012/0194999 A1 | 8/2012 | Krietzman et al. |
| 2012/0267991 A1 | 10/2012 | Adducci et al. |
| 2013/0029579 A1 | 1/2013 | Lewis, II |
| 2013/0160271 A1 | 6/2013 | Krietzman et al. |
| 2013/0163185 A1 | 6/2013 | Gilges et al. |
| 2013/0165035 A1 | 6/2013 | Krietzman et al. |
| 2013/0309957 A1 | 11/2013 | Fleming et al. |
| 2014/0196394 A1 | 7/2014 | Greeson et al. |
| 2014/0323029 A1 | 10/2014 | Lewis, II et al. |
| 2014/0334099 A1 | 11/2014 | Krietzman et al. |
| 2015/0065028 A1 | 3/2015 | Krietzman |
| 2015/0173253 A1 | 6/2015 | Lewis, II et al. |
| 2015/0181750 A1 | 6/2015 | Bailey et al. |
| 2015/0208554 A1 | 7/2015 | Leigh et al. |
| 2015/0264839 A1 | 9/2015 | Lewis, II et al. |
| 2015/0282390 A1 | 10/2015 | Lewis, II et al. |
| 2015/0319872 A1 | 11/2015 | Lewis, II et al. |
| 2015/0351289 A1 | 12/2015 | Krietzman et al. |
| 2015/0366094 A1 | 12/2015 | Segroves et al. |
| 2016/0088773 A1 | 3/2016 | Greeson et al. |
| 2016/0249488 A1 | 8/2016 | Krietzman |
| 2016/0302317 A1 | 10/2016 | Lewis, II et al. |
| 2017/0042057 A1 | 2/2017 | Segroves et al. |
| 2017/0127569 A1 | 5/2017 | Rimler et al. |
| 2017/0127570 A1 | 5/2017 | Lewis, II et al. |
| 2017/0150652 A1 | 5/2017 | Greeson et al. |
| 2018/0035570 A1 | 2/2018 | Greeson et al. |
| 2018/0042143 A1 | 2/2018 | Krietzman et al. |
| 2018/0263127 A1 | 9/2018 | Lewis, II et al. |
| 2019/0073004 A1 | 3/2019 | Lewis, II |
| 2019/0075685 A1 | 3/2019 | Krietzman et al. |
| 2019/0313551 A1 | 10/2019 | Krietzman et al. |
| 2019/0343023 A1 | 11/2019 | Lewis, II et al. |
| 2019/0350108 A1 | 11/2019 | Davis |
| 2019/0350110 A1 | 11/2019 | Krietzman |
| 2020/0113074 A1 | 4/2020 | Lewis, II et al. |
| 2020/0187387 A1 | 6/2020 | Lewis, II et al. |
| 2020/0205317 A1 | 6/2020 | Davis |
| 2020/0245494 A1 | 7/2020 | Krietzman |
| 2020/0288605 A1 | 9/2020 | Lewis, II et al. |
| 2020/0396868 A1 | 12/2020 | Lewis, II et al. |
| 2021/0014988 A1 | 1/2021 | Lewis, II et al. |
| 2021/0329808 A1 | 10/2021 | Hennrich et al. |
| 2021/0385976 A1 | 12/2021 | Lewis, II et al. |
| 2022/0035426 A1 | 2/2022 | Lewis, II |
| 2022/0053672 A1 | 2/2022 | Krietzman |
| 2022/0061188 A1 | 2/2022 | Greeson et al. |

(56) References Cited

U.S. PATENT DOCUMENTS

| | | |
|---|---|---|
| 2022/0124924 A1 | 4/2022 | Lewis, II et al. |
| 2022/0183190 A1 | 6/2022 | Lewis, II et al. |
| 2023/0014492 A1 | 1/2023 | Krietzman |

FOREIGN PATENT DOCUMENTS

| | | |
|---|---|---|
| EP | 2205054 A1 | 7/2010 |
| GB | 2156473 A | 10/1985 |
| GB | 2354066 A | 3/2001 |
| GB | 2366084 B | 9/2002 |
| JP | H1048950 A | 2/1998 |
| JP | 2000-193792 A | 7/2000 |
| JP | 2000-286580 | 10/2000 |
| JP | 2003-056993 A | 2/2003 |
| JP | 2004-200594 | 7/2004 |
| JP | 2004-252758 | 9/2004 |
| JP | 2007-212092 A | 8/2007 |
| WO | 1999048305 | 9/1999 |
| WO | 2006055506 A2 | 5/2006 |
| WO | 2009089008 A2 | 7/2009 |
| WO | 2009103090 A2 | 8/2009 |
| WO | 2009103090 A3 | 10/2009 |
| WO | 2010028384 A2 | 3/2010 |
| WO | 2010028384 A3 | 5/2010 |
| WO | 2010117699 A1 | 10/2010 |

OTHER PUBLICATIONS

"International Search Report" and "Written Opinion of the International Search Authority" (European Patent Office) in Corning Cable Systems LLC, International Patent Application Serial No. PCT/US2009/000075, dated Aug. 7, 2009 (21 pages).
"International Search Report" and "Written Opinion" of the International Search Authority (Korean Intellectual Property Office) in Chatsworth Products, Inc. et al., International Patent Application Serial No. PCT/US2009/034338, dated Sep. 1, 2009 (7 pages).
"International Search Report" and "Written Opinion of the International Search Authority" (Korean Intellectual Property Office) in Chatsworth Products, Inc. et al., International Patent Application Serial No. PCT/US2009/056256, dated Apr. 7, 2010 (7 pages).
Rasmussen, Neil, "Air Distribution Architecture Options for Mission Critical Facilities", White Paper #55, Revision 1, American Power Conversion (APC), West Kingston, Rhode Island, 2003 (13 pages).
Chatsworth Products, Inc., "Thermal Management Solutions," Signature Solutions Brochure, available at Internet Web Page <www.chatsworth.com/passivecooling>, dated Mar. 2008 (6 pages).
Rack Technologies PTY LTD, Product Catalog, Internet Web Page <http://racktechnologies.com.au/files/rt2005.pdf>, Jun. 16, 2005, retrieved from Internet Archive Wayback Machine <http://web.archive.org/web/20050616212856/http://racktechnologies.com.au/files/rt2005.pdf> as reviewed as of Apr. 29, 2016 (73 pages).
Emerson Network Power, Smart Cooling Solutions Data Center, Oct. 2012, Internet Web Page <http://www.emersonnetworkpower.com/en-EMEA/Products/RACKSANDINTEGRATEDCABINETS/Documents/Knur%20DCD/Smart-Cooling-Solutions-Data-Center-EN.pdf> (51 pages).
Eaton Corporation, Eaton Airflow Management Solutions: Installation Guide for Telescopic Chimney for SSeries Enclosures, Publication No. MN160007EN, dated 2014 (13 pages).
Eaton Corporation, Data Center Products: Eaton Telescopic Chimney, dated 2014 (2 pages).
Hewlett-Packard Development Company, LP, HP 10000 G2 42U Rack Air Duct Installation Guide, dated Aug. 2008 (23 pages).
Panduit Corporation, Panduit Net-Access Vertical Exhaust Duct (VED) Instructions, dated 2009 (4 pages).
Panduit Corporation, Panduit Net-Access Vertical Exhaust System (VES) Specification Sheet, dated 2011 (4 pages).
Panduit Corporation, Panduit Vertical Exhaust Duct for N-Type and S-Type Cabinets: Installation Instructions, dated 2012 (14 pages).
Machine translation of Kawashima (JPH1048950A), retrieved Feb. 3, 2022.
Kratz, Alonzo P. & Fellows, Julian R., "Pressure losses resulting from changes in cross-sectional area in air ducts." University of Illinois at Urbana Champaign, College of Engineering, Engineering Experiment Station, Urbana, IL, dated Feb. 25, 1938 (66 pages).

\* cited by examiner

VERTICAL EXHAUST DUCT FOR ELECTRONIC EQUIPMENT ENCLOSURE

CROSS-REFERENCE TO RELATED APPLICATIONS

The present application is a U.S. continuation patent application of, and claims priority under 35 U.S.C. § 120 to, U.S. nonprovisional patent application Ser. No. 17/676,752, filed Feb. 21, 2022, which '752 application published as U.S. Patent Application Publication No. US 2022/0183190 A1 on Jun. 9, 2022, which '752 application issued as U.S. Pat. No. 11,547,020 on Jan. 3, 2023, which '752 application, the application publication thereof, and the patent issuing therefrom are each expressly incorporated herein by reference in their entirety, and which '752 application is a U.S. continuation patent application of, and claims priority under 35 U.S.C. § 120 to, U.S. nonprovisional patent application Ser. No. 17/008,034, filed Aug. 31, 2020, which '034 application published as U.S. Patent Application Publication No. US 2020/0396868 A1 on Dec. 17, 2020, which '034 application issued as U.S. Pat. No. 11,259,446 on Feb. 22, 2022, which '034 application, the application publication thereof, and the patent issuing therefrom are each expressly incorporated herein by reference in their entirety, and which '034 application is a U.S. continuation patent application of, and claims priority under 35 U.S.C. § 120 to, U.S. nonprovisional patent application Ser. No. 16/792,758, filed Feb. 17, 2020, which '758 application published as U.S. Patent Application Publication No. US 2020/0187387 A1 on Jun. 11, 2020, which '758 application issued as U.S. Pat. No. 10,765,037 on Sep. 1, 2020, which '758 application, the application publication thereof, and the patent issuing therefrom are each expressly incorporated herein by reference in their entirety, and which '758 application is a U.S. continuation patent application of, and claims priority under 35 U.S.C. § 120 to, U.S. nonprovisional patent application Ser. No. 16/450,353, filed Jun. 24, 2019, which '353 application published as U.S. Patent Application Publication No. US 2019/0313551 A1 on Oct. 10, 2019, which '353 application issued as U.S. Pat. No. 10,568,239 on Feb. 18, 2020, which '353 application, the application publication thereof, and the patent issuing therefrom are each expressly incorporated herein by reference in their entirety, and which '353 application is a U.S. continuation patent application of, and claims priority under 35 U.S.C. § 120 to, U.S. nonprovisional patent application Ser. No. 16/180,677, filed Nov. 5, 2018, which '677 application published as U.S. Patent Application Publication No. US 2019/0075685 A1 on Mar. 7, 2019, which '677 application issued as U.S. Pat. No. 10,334,761 on Jun. 25, 2019, which '677 application, the application publication thereof, and the patent issuing therefrom are each expressly incorporated herein by reference in their entirety, and which '677 application is a U.S. continuation patent application of, and claims priority under 35 U.S.C. § 120 to, U.S. nonprovisional patent application Ser. No. 15/784,751, filed Oct. 16, 2017, which '751 application published as U.S. Patent Application Publication No. US 2018/0042143 A1 on Feb. 8, 2018, which '751 application issued as U.S. Pat. No. 10,123,462 on Nov. 6, 2018, which '751 application, the application publication thereof, and the patent issuing therefrom are each expressly incorporated herein by reference in their entirety, and which '751 application is a U.S. continuation patent application of, and claims priority under 35 U.S.C. § 120 to, U.S. nonprovisional patent application Ser. No. 14/822,126, filed Aug. 10, 2015, which '126 application published as U.S. Patent Application Publication No. US 2015/0351289 A1 on Dec. 3, 2015, which '126 application issued as U.S. Pat. No. 9,801,309 on Oct. 24, 2017, which '126 application, the application publication thereof, and the patent issuing therefrom are each expressly incorporated herein by reference in their entirety, and which '126 application is a U.S. continuation patent application of, and claims priority under 35 U.S.C. § 120 to, U.S. nonprovisional patent application Ser. No. 14/286,335, filed May 23, 2014, which '335 application published as U.S. Patent Application Publication No. US 2014/0334099 A1 on Nov. 13, 2014, which '335 application issued as U.S. Pat. No. 9,119,329 on Aug. 25, 2015, which '335 application, the application publication thereof, and the patent issuing therefrom are each expressly incorporated herein by reference in their entirety, and which '335 application is a U.S. continuation patent application of, and claims priority under 35 U.S.C. § 120 to, U.S. nonprovisional patent application Ser. No. 13/348,820, filed Jan. 12, 2012, which '820 application published as U.S. Patent Application Publication No. US 2012/0194999 A1 on Aug. 2, 2012, which '820 application issued as U.S. Pat. No. 8,737,068 on May 27, 2014, which '820 application, the application publication thereof, and the patent issuing therefrom are each expressly incorporated herein by reference in their entirety, and which '820 application is a U.S. continuation patent application of, and claims priority under 35 U.S.C. § 120 to, U.S. nonprovisional patent application Ser. No. 12/555,697, filed Sep. 8, 2009, which '697 application published as U.S. Patent Application Publication No. US 2010/0061059 A1 on Mar. 11, 2010, which '697 application issued as U.S. Pat. No. 8,107,238 on Jan. 31, 2012, which '697 application, the application publication thereof, and the patent issuing therefrom are each expressly incorporated herein by reference in their entirety, and which '697 application is:

(a) a continuation-in-part patent application of, and claims priority under 35 U.S.C. § 120 to, U.S. nonprovisional patent application Ser. No. 11/533,359, filed Sep. 19, 2006, which '359 application published as U.S. Patent Application Publication No. US 2007/0064389 A1 on Mar. 22, 2007, which '359 application and the application publication thereof are each expressly incorporated herein by reference in their entirety, and which '359 application is a U.S. nonprovisional patent application of, and claims priority under 35 U.S.C. § 119(e) to, U.S. provisional patent application Ser. No. 60/718,548, filed Sep. 19, 2005, which '548 application is expressly incorporated herein by reference in its entirety; and (b) a U.S. nonprovisional patent application of, and claims priority under 35 U.S.C. § 119(e) to, U.S. provisional patent application Ser. No. 61/095,147, filed Sep. 8, 2008 which '147 application is expressly incorporated herein by reference in its entirety.

COPYRIGHT STATEMENT

All of the material in this patent document is subject to copyright protection under the copyright laws of the United States and of other countries. The copyright owner has no objection to the facsimile reproduction by anyone of the patent document or the patent disclosure, as it appears in the Patent and Trademark Office patent file or records, but otherwise reserves all copyright rights whatsoever.

BACKGROUND OF THE PRESENT INVENTION

Field of the Present Invention

The present invention relates generally to cabinets for rack-mount computer and data storage equipment, and, in particular, to thermal management of cabinets for rack-mount computer and data storage equipment.

Background

Racks, frames and cabinets for mounting and storing computer and other electronic components or equipment have been well known for many years. Racks and frames are typically simple rectangular frameworks on which electronic components may be mounted, or on which other mounting members, such as shelves or brackets, may be mounted which in turn may support the electronic components. Cabinets are typically frames on which panels or doors, or both, are hung to provide aesthetic improvement, to protect the components from external influences, to provide security for the components stored inside, or for other reasons.

Racks, frames and cabinets have been built in many different sizes and with many different proportions in order to best accommodate the components which they are designed to store. Components stored in these enclosures may include audio and video equipment and the like, but quite frequently include computer equipment and related peripheral devices. These components typically include housings enclosing internal operative elements.

As is also well known, the electronic equipment mounted therein tends to generate large amounts of thermal energy that needs to be exhausted away from the equipment effectively in order to maintain the equipment in proper operating order or to prevent damage thereto. The problem can be especially significant when the components are enclosed in cabinets, because thermal energy generated thereby can concentrate within the equipment enclosure and cause the components to overheat and shut down. As equipment becomes more densely packed with electronics, the quantities of thermal energy have continued to increase in recent years, and thermal energy management has become a significant issue confronting today's rack, cabinet, frame and enclosure manufacturers, the manufacturers of the electronic equipment, and the users of such equipment.

Typically, multiple racks, frames, cabinets, and the like (sometimes collectively referred to hereinafter as "enclosures") are housed together in a data center. Because of the overheating problem, and particularly with multiple enclosures being placed in a single room or other enclosed space, thermal management of the data center is very important. A goal of data center thermal management is to maximize the performance, uptime and life expectancy of the active components being housed in the data center. This goal is generally accomplished by managing the cold air delivered to each component such that the internal temperature of the component does not exceed the manufacturer's maximum allowable operating temperature. Preferably, the cold air delivered to the component is at or below the manufacturer's recommended temperature and in sufficient volume to meet the airflow requirements of the component, which are typically measured in cubic feet per minute (CFM).

A common type of operating environment for enclosures and the equipment mounted therein is known as a "raised floor" system, wherein the enclosures are supported on a heavy-duty mechanical floor that is installed above the actual floor of the room at a given elevation. One significant advantage of this approach is that cables, wires, water pipes, and other utility connections may be routed to and from the enclosures via the space beneath the floor, thereby leaving the top surface of the raised floor clear for locating enclosures and traversal by users. Another significant advantage, however, is that the space beneath the top surface of the raised floor serves as a plenum through which cool air may likewise be distributed to the enclosures. Through open tiles or perforations or ventilations in the tiles comprising the surface of the raised floor, this cool air may be supplied to the enclosures and used to cool the equipment inside.

Unfortunately, the use of perforated floor tiles, typically located directly in front of enclosures to try to cause a maximum amount of cool air to be directed into the enclosures and not merely lost to the ambient room, have been found to be insufficient in cooling the equipment within the enclosures to the desired degree. Thus, a number of techniques and devices have been developed in recent years to more efficiently utilize the capabilities of the Computer Room Air Conditioner ("CRAC") and to put the available cool air to the most efficient use possible. Among others, these include improved strategies involving perforated panels, such as those described in the commonly-assigned U.S. Provisional Patent Application No. 60/725,511, filed Oct. 10, 2005 and entitled "EFFICIENT USE OF PERFORATED PANELS IN ELECTRONIC EQUIPMENT CABINETS," and also improved cool air distribution strategies, such as those described in the commonly-assigned U.S. Provisional Patent Application No. 60/743,148, filed Jan. 20, 2006 and entitled "INTERNAL AIR DUCT," the entirety of each of which is incorporated herein by reference.

The supply of cool air to the raised floor plenum, and the transfer of thermal energy from the electronic equipment, is conventionally handled by the CRAC. Airflow through the plenum and into the enclosures generally relies solely or at least primarily on the air pressure differential as measured between the raised floor plenum and the ambient room. However, active means are often used to push or pull heated air out of the enclosures.

For a particular component, thermal energy is transferred from its housing using forced air convection. More specifically, internal fans draw or push air through the housing from front-to-rear over the heated internal elements within the housing. The air absorbs the thermal energy from the internal elements and carries it away as it exits the housing.

Airflow through a particular component housing is primarily controlled by the internal fan installed by the manufacturer. While it is possible to reduce this throughput by constricting air flow through an enclosure, it is difficult to appreciably increase the airflow through a component housing.

In addition, the rate of transfer of thermal energy from the housing does not change very much for different intake air temperatures. Lowering the intake air temperature reduces the temperature of the processor(s) inside of the component, but the temperature change and the total cooling taking place for the component does not change for a constant airflow. Therefore, any enclosure that does not choke the airflow through the component mounted inside and that prevents recirculation should effectively dissipate most, if not all, of the thermal energy generated by the component.

Recent conventional thinking for the thermal management of data centers involves the use of an approach commonly referred to as the Hot Aisle/Cold Aisle approach. In this strategy, cold air aisles are segregated from hot air aisles by enclosures being positioned between them such that cold air aisles are in front of rows of enclosures and hot air aisles are behind these rows of enclosures. In this approach, the cold air and hot air aisles alternate. Ideally, air enters the enclosure from the cold air aisles and is exhausted from the enclosure into the hot air aisles.

This approach works well in low to medium density data center applications. However, it does not perform well in many medium density applications and can not support high density applications without extreme discipline and additional air flow management devices outside of the enclosures to prevent hot exhaust recirculation into the cold aisle.

Further, Hot Aisle/Cold Aisle data center environments typically do not operate at ideal conditions. Two common problems that affect thermal management in general, and Hot Aisle/Cold Aisle in particular, are recirculation and bypass. Recirculation occurs when hot exhaust air travels back into the component intake air stream. Recirculation can occur for a single component or for an entire enclosure. When this occurs, the exhaust airflow raises intake air temperatures and causes components to run at higher operating temperatures. Bypass occurs when cold source air bypasses the active component and travels directly into the hot exhaust air stream. Similarly to recirculation, bypass may occur for a single component or for a whole enclosure. Because cold source air is bypassing the active component, the air is not serving its intended purpose of transferring thermal energy away from the active component. As such, the bypassing air is essentially wasted, and the active component retains its thermal energy until additional cold source air contacts the active component thereby transferring the thermal energy away from the component. Based on the foregoing, it is readily apparent that bypass wastes energy. In addition, bypass contributes to humidity control problems, and can indirectly contribute to recirculation. Under ideal circumstances, all recirculation and bypass airflow can be eliminated.

Hot Aisle/Cold Aisle is a well-principled thermal management approach, i.e., segregating the cold source air in front of enclosures and hot exhaust air behind them does work. Unfortunately, maintaining the segregation is difficult. In order to maintain proper segregation, the airflow delivered to each enclosure must roughly equal the airflow required by all of the active components in each enclosure. In addition, strict discipline and careful airflow balancing are required to maintain this ideal operating condition in higher density data center environments. While an initial installation may realize these ideal conditions, moves, adds and changes, along with the demands for constantly monitoring and rebalancing, frequently make maintaining this ideal operating condition impractical, if not outright impossible.

For example, one known airflow balancing technique employs variable speed fans that are carefully monitored and controlled using appropriate control methodologies. A drawback to the controlled variable speed fan approach is the unpredictable nature of components, particularly server usage. For example if a server is suddenly heavily burdened by a particular software application, the server heats up, perhaps more quickly than expected, or more than can be handled quickly by a corresponding variable fan. The fan then quickly increases in speed in an attempt to respond to the sudden drastic increase in temperature of the server. The fan may not be able to sufficiently supply cooling air to the suddenly overheated server, and even if it is, such heat balancing procedure is difficult, at best, to manage. It would be better to avoid dependence on such a reactive approach to thermal management.

Cylindrical exhaust ducts have been added to enclosures in an effort to alleviate thermal management issues such as recirculation and bypass. The exhaust ducts generally extend upwardly away from a top surface of the enclosure near the rear of the enclosure and provide a path for hot exhaust air to be expelled. While available exhaust ducts are operative for their intended purpose, an improved design thereof would further aid in alleviating thermal management issues. In addition, it has been found that heated air tends to pool or collect in portions of the interior of enclosures rather than be guided to the exhaust ducts.

As such, a need exists for an improved design of exhaust ducts for component storage enclosures. Further, additional thermal management features are needed in these enclosures. This, and other needs, are addressed by one or more aspects of the present invention.

SUMMARY OF THE PRESENT INVENTION

The present invention includes many aspects and features. Moreover, while many aspects and features relate to, and are described in, the context of enclosures for storage of electronic equipment, the present invention is not limited to use only in enclosures for storage of electronic equipment, as will become apparent from the following summaries and detailed descriptions of aspects, features, and one or more embodiments of the present invention.

Broadly defined, the present invention according to one aspect includes an electronic equipment enclosure comprising a frame structure formed from a plurality of support posts and at least partially enclosed by a plurality of panels. The panels include at least side, top and back panels defining an enclosure having a top, a bottom and a rear thereof. The top panel includes an opening there through that is rectangular in shape. The equipment enclosure further comprises an exhaust air duct extending upward from the top panel of the enclosure. The exhaust air duct is rectangular in cross-section and is disposed in surrounding relation to, and in fluid communication with, the top panel opening. The exhaust air duct is adapted to segregate hot air being exhausted from the enclosure from cool air entering the enclosure, thereby improving thermal management of the enclosure.

In a feature of this aspect, the top panel opening is disposed toward the rear of the top panel. In accordance with this feature, the top panel opening is disposed substantially adjacent the back panel of the enclosure. With regard to this feature, the dimensions of the rectangular cross-section of the exhaust air duct are substantially similar to the dimensions of the top panel opening.

In another feature, the top panel opening is disposed toward the rear of the enclosure. In an additional feature, the exhaust air duct is self-supporting. In yet another feature, the exhaust air duct is adapted to be connected to a separate overhead structure in a room. With regard to this feature, the exhaust air duct is adapted to be connected to a return air duct. With further regard to this feature, the exhaust air duct has a top edge and a mounting flange extending around the periphery of the top edge for connection to a separate overhead structure in a room.

In yet another feature, the height of the exhaust air duct is adjustable, thereby adjusting the distance to which the exhaust air duct extends above the top panel of the enclosure. With regard to this feature, the exhaust air duct includes a first rectangular open-ended duct section that nests inside a second rectangular open-ended duct section, wherein the first duct section may be telescopically withdrawn from the second duct section.

In a further feature, the back panel is generally air-impervious to prevent heated air from escaping there through. In accordance with this feature, the back panel is a door panel that is connected at a connection point to the frame structure. Seals are disposed at the connection point between the back door panel and the frame structure. In furtherance of this feature, the seals are brackets. With regard to this feature, the seals are metal. It is preferred that rubber or foam gaskets are included with the seals.

In an additional feature, the plurality of panels includes a bottom panel that has a brush opening arranged therein.

Broadly defined, the present invention according to another aspect includes an electronic equipment enclosure comprising a frame structure formed from a plurality of support posts and at least partially enclosed by a plurality of panels. The panels include at least side, top and back panels defining an enclosure having a top, a bottom and a rear thereof. The top panel includes an opening there through. The equipment enclosure further comprises an exhaust air duct extending upward from the top panel of the enclosure. The exhaust air duct is disposed in generally surrounding relation to, and in fluid communication with, the top panel opening. The enclosure further comprises an air diverter, disposed near the rear of the enclosure and angled upward to redirect, toward the top of the enclosure, heated air moving rearward through the enclosure. The exhaust air duct and the air diverter cooperate to segregate hot air being exhausted from the enclosure from cool air entering the enclosure, thereby improving thermal management of the enclosure.

In a feature of this aspect, the top panel opening is rectangular in shape. In another feature, the top panel opening is disposed toward the rear of the top panel. In an additional feature, the top panel opening is disposed substantially adjacent the back panel of the enclosure. In accordance with this feature, the exhaust air duct is rectangular in cross-section, and the dimensions of the rectangular cross-section of the exhaust air duct are substantially similar to the dimensions of the top panel opening.

In yet another feature, the top panel opening is disposed toward the rear of the enclosure. In a further feature, the exhaust air duct is self-supporting. In still a further feature, the exhaust air duct is adapted to be connected to a separate overhead structure in a room. In accordance with this feature, the exhaust air duct is adapted to be connected to a return air duct. With further regard to this feature, the exhaust air duct has a top edge and a mounting flange extending around the periphery of the top edge for connection to a separate overhead structure in a room.

In an additional feature, the height of the exhaust air duct is adjustable, thereby adjusting the distance to which the exhaust air duct extends above the top panel of the enclosure. In furtherance of this feature, the exhaust air duct includes a first rectangular open-ended duct section that nests inside a second rectangular open-ended duct section, wherein the first duct section may be withdrawn from the second duct section by a predetermined amount.

In another feature, the back panel is generally air-impervious to prevent heated air from escaping there through. With regard to this feature, the back panel is a door panel that is connected at a connection point to the frame structure. Seals are disposed at the connection point between the back door panel and the frame structure. With further regard to this feature, the seals are brackets. It is preferred that the seals are metal. It is further preferred that rubber or foam gaskets are included with the seals.

In still yet another feature, the plurality of panels includes a bottom panel that has a brush opening arranged therein.

Broadly defined, the present invention according to yet another aspect includes an exhaust air duct adapted to segregate hot air being exhausted from an electronic equipment enclosure from cool air entering the enclosure, thereby improving thermal management of the enclosure, wherein the exhaust air duct includes four panels joined at side edges thereof to form a rectangular shaped exhaust duct. Each of at least two of the panels has a flange at a bottom edge thereof such that the exhaust air duct has a flange around a bottom periphery thereof.

In a feature of this aspect, each of all four of the panels has a flange at a bottom edge such that the exhaust air duct has a flange around a bottom periphery thereof. In another feature, the panels are constructed of a material that is self-supporting. In yet another feature, an upper end thereof is adapted to be connected to a separate overhead structure in a room. In accordance with this feature, the upper end thereof is adapted to be connected to a return air duct. With regard to this feature, the upper end thereof has a top edge and a mounting flange extending around the periphery of the top edge for connection to a separate overhead structure in a room.

In an additional feature, the height of the exhaust air duct is adjustable, thereby adjusting the distance to which the exhaust air duct extends above the top panel of the enclosure. With regard to this feature, the exhaust air duct includes a first rectangular open-ended duct section that nests inside a second rectangular open-ended duct section, wherein the first duct section may be telescopically withdrawn from the second duct section. In accordance with this feature, the telescopically withdrawn duct section is self-supporting. Further in accordance with this feature, the telescopically withdrawn duct section may be affixed to the second duct section at a user-controlled vertical disposition relative to the second duct section. It is preferred that at least one of the duct sections includes a plurality of columns of evenly-spaced openings adapted to facilitate the connection of the two duct sections together to effectuate the user-controlled vertical disposition.

Broadly defined, the present invention according to another aspect includes an electronic equipment enclosure having a frame structure at least partially enclosed by a plurality of panels defining a compartment in which one or more electronic components are mounted and an extendible exhaust air duct extending upward from the top panel of the compartment. The exhaust air duct is adapted to segregate hot air being exhausted from the compartment from cool air entering the compartment, thereby improving thermal management of the enclosure.

In a feature of this aspect, the extendible exhaust air duct is adapted to telescope in length.

Broadly defined, the present invention according to another aspect includes an electronic equipment enclosure for mounting one or more electronic components. The electronic equipment enclosure includes a frame structure formed from a plurality of support posts and at least partially enclosed by a plurality of panels, the panels including at least side, top and back panels defining a compartment in which the one or more electronic components are mounted. The compartment has a top, a bottom and a rear, and the top panel includes an opening therethrough that is rectangular in shape. The electronic equipment enclosure further includes an extendible exhaust air duct extending upward from the top panel of the compartment. The exhaust air duct is rectangular in cross-section and is disposed in surrounding relation to, and in fluid communication with, the top panel opening; and the exhaust air duct is adapted to segregate hot air being exhausted from the compartment from cool air entering the compartment, thereby improving thermal management of the enclosure.

In a feature of this aspect, the extendible exhaust air duct is adapted to telescope in length.

Broadly defined, the present invention according to another aspect includes an electronic equipment enclosure having a frame structure at least partially enclosed by a plurality of panels defining a compartment in which one or more electronic components are mounted and a collapsible exhaust air duct extending upward from the top panel of the compartment. The exhaust air duct is adapted to segregate hot air being exhausted from the compartment from cool air entering the compartment, thereby improving thermal management of the enclosure.

In features of this aspect, the collapsible exhaust air duct is adapted to telescope in length. In another feature of this aspect, and the collapsible exhaust air duct includes four side panels that are hinged relative to each other, thereby facilitating the collapse of the exhaust air duct from a use state to a flattened state.

In other features of this aspect, the four side panels are connected at their corners by a hinged corner fitting; a corner lock is coupled to one of the corner fittings and adapted to maintain the side panels in the use state; each corner lock includes a main body, a lock plate, and a lock screw; each corner fitting extends substantially along the length of each of an edge of a respective panel and an edge of a respective adjacent panel; an upper edge of each side panel is flared outward; and a respective seal is attached to the upper edge of each side panel to limit air escaping from between an upper end of the duct section and a ceiling structure.

Broadly defined, the present invention according to another aspect includes an electronic equipment enclosure for mounting one or more electronic components. The electronic equipment enclosure includes a frame structure formed from a plurality of support posts and at least partially enclosed by a plurality of panels, the panels including at least side, top and back panels defining a compartment in which the one or more electronic components are mounted. The compartment has a top, a bottom and a rear, and the top panel includes an opening therethrough that is rectangular in shape. The electronic equipment enclosure further includes a collapsible exhaust air duct extending upward from the top panel of the compartment. The exhaust air duct is rectangular in cross-section and is disposed in surrounding relation to, and in fluid communication with, the top panel opening; and the exhaust air duct is adapted to segregate hot air being exhausted from the compartment from cool air entering the compartment, thereby improving thermal management of the enclosure.

In features of this aspect, the collapsible exhaust air duct is adapted to telescope in length, and the collapsible exhaust air duct includes four side panels that are hinged relative to each other, thereby facilitating the collapse of the exhaust air duct from a use state to a flattened state.

In other features of this aspect, the four air duct panels are connected at their corners by a hinged corner fitting; a corner lock is coupled to one of the corner fittings and adapted to maintain the air duct panels in the use state; each corner lock includes a main body, a lock plate, and a lock screw; each corner fitting extends substantially along the length of each of an edge of a respective panel and an edge of a respective adjacent panel; an upper edge of each air duct panel is flared outward; and a respective seal is attached to the upper edge of each air duct panel to limit air escaping from between an upper end of the duct section and a ceiling structure.

Broadly defined, the present invention according to another aspect includes an electronic equipment enclosure, including a frame structure at least partially enclosed by a plurality of panels defining a compartment in which one or more electronic components are mounted and an exhaust air duct with a lower duct section extending upward from the top panel of the compartment and an upper duct section extending upward from an upper end of the lower duct section. The exhaust air duct is adapted to segregate hot air being exhausted from the compartment from cool air entering the compartment, thereby improving thermal management of the enclosure.

In features of this aspect, the upper duct section is adapted to telescope from the lower duct section; each duct section includes four flat side panels connected at their corners by a corner fitting; each corner fitting is hinged; each corner fitting in the lower duct section is slidably coupled to a respective corner fitting in the upper duct section; a corner lock is coupled to one of the corner fittings and adapted to maintain the position of the upper duct section relative to the lower duct section; each corner lock includes a main body, a lock plate, and a lock screw; each corner fitting includes a pair of clamp fingers on the outer side thereof for engaging the respective corner lock; each corner fitting includes a pair of fingers defining a panel channel in which an edge of a side panel is inserted and retained; each side panel includes a plurality of raised structures along its lateral edges, and the structures are engaged within the panel channel; each raised structure is a boss; and each corner fitting extends substantially along the length of each of an edge of a respective panel and an edge of a respective adjacent panel.

In other features of this aspect, the upper duct section telescopes from within the lower duct section; a respective seal is attached to an upper edge of each panel of the lower duct section to limit air escaping from between the upper end of the lower duct section and a lower end of the upper duct section; each side panel includes a plurality of raised structures along its upper edge, and the structures are engaged within a channel of the seal; and each raised structure is an outwardly-extending tab.

In still other features of this aspect, the upper duct section telescopes from around the periphery of the lower duct section, and a respective seal is attached to a lower edge of each panel of the upper duct section to limit air escaping from between the upper end of the lower duct section and a lower end of the upper duct section.

In still yet another feature of this aspect, at least one panel in a first of the two duct sections includes a column of openings, and a respective corresponding panel in a second of the two duct sections includes a corresponding mounting feature such that when the first duct section and the second duct section are telescopically assembled to each other, the mounting feature of the second duct section may be aligned with any opening of the column of openings, thereby facilitating the attachment of the second duct section to the first duct section at a desired height.

Broadly defined, the present invention according to another aspect includes an electronic equipment enclosure for mounting one or more electronic components, including a frame structure formed from a plurality of support posts and at least partially enclosed by a plurality of panels. The panels include at least side, top and back panels defining a compartment in which the one or more electronic components are mounted. The compartment has a top, a bottom and a rear, and the top panel includes an opening therethrough that is rectangular in shape. The electronic equipment enclosure further includes an exhaust air duct with a lower duct section extending upward from the top panel of the compartment, and an upper duct section extending upward from an upper end of the lower duct section. Each duct section is rectangular in cross-section, and a lower end of the lower duct section is disposed in surrounding relation to, and in fluid communication with, the top panel opening. The exhaust air duct is adapted to segregate hot air being exhausted from the compartment from cool air entering the compartment, thereby improving thermal management of the enclosure.

In features of this aspect, the upper duct section is adapted to telescope from the lower duct section; each duct section includes four flat side panels connected at their corners by a corner fitting; each corner fitting is hinged; each corner fitting in the lower duct section is slidably coupled to a respective corner fitting in the upper duct section; a corner lock is coupled to one of the corner fittings and adapted to maintain the position of the upper duct section relative to the lower duct section; each corner lock includes a main body, a lock plate, and a lock screw; and each corner fitting includes a pair of clamp fingers on the outer side thereof for engaging the respective corner lock.

In other features of this aspect, each corner fitting includes a pair of fingers defining a panel channel in which an edge of an air duct panel is inserted and retained; each air duct panel includes a plurality of raised structures along its lateral edges, and the structures are engaged within the panel channel; and each raised structure is a boss.

In another feature of this aspect, each corner fitting extends substantially along the length of each of an edge of a respective panel and an edge of a respective adjacent panel.

In still other features of this aspect, the upper duct section telescopes from within the lower duct section; a respective seal is attached to an upper edge of each panel of the lower duct section to limit air escaping from between the upper end of the lower duct section and a lower end of the upper duct section; each air duct panel includes a plurality of raised structures along its upper edge, and the structures are engaged within a channel of the seal; each raised structure is an outwardly-extending tab; the upper duct section telescopes from around the periphery of the lower duct section; and a respective seal is attached to a lower edge of each panel of the upper duct section to limit air escaping from between the upper end of the lower duct section and a lower end of the upper duct section.

In still yet another feature of this aspect, at least one panel in a first of the two duct sections includes a column of openings. A respective corresponding panel in a second of the two duct sections includes a corresponding mounting feature such that when the first duct section and the second duct section are telescopically assembled to each other, the mounting feature of the second duct section may be aligned with any opening of the column of openings, thereby facilitating the attachment of the second duct section to the first duct section at a desired height.

Broadly defined, the present invention according to another aspect includes an electronic equipment enclosure, including a frame structure at least partially enclosed by a plurality of panels defining a compartment in which one or more electronic components are mounted, and an exhaust air duct, having four side panels connected by four corner fittings, extending upward from the top panel of the compartment. The exhaust air duct is adapted to segregate hot air being exhausted from the compartment from cool air entering the compartment, thereby improving thermal management of the enclosure.

In features of this aspect, each corner fitting extends substantially along the length of each of an edge of a respective panel and an edge of a respective adjacent panel; the exhaust air duct is adapted to telescope in length; the corner fittings include hinges, thereby facilitating the collapse of the exhaust air duct from a use state to a flattened state; each hinge is a living hinge; ach corner fitting is formed in an extrusion process; each corner fitting has a uniform cross-section; and each panel of the exhaust air duct is planar in form.

In other features of this aspect, a corner lock is coupled to one of the corner fittings and adapted to maintain the side panels in the use state; each corner lock includes a main body, a lock plate, and a lock screw; an upper edge of each side panel is flared outward; and a respective seal is attached to the upper edge of each side panel to limit air escaping from between an upper end of the duct section and a ceiling structure.

In other features of this aspect, each corner fitting includes two finger arrays connected together by the hinge; each finger array includes a pair of fingers defining a channel; and each pair of fingers includes a latch finger with a hook adapted to fit over a raised structure on a side panel.

In still other features of this aspect, each corner fitting is formed in a co-extrusion process using a first material for the hinge and a second material for the remainder of the corner fitting, and each corner fitting has a uniform cross-section.

In still yet other features of this aspect, each corner fitting includes a pair of fingers defining a panel channel in which an edge of a side panel is inserted and retained; and each side panel includes a plurality of raised structures along its lateral edges, and the structures are engaged within the panel channel.

Broadly defined, the present invention according to another aspect includes an electronic equipment enclosure for mounting one or more electronic components, including a frame structure formed from a plurality of support posts and at least partially enclosed by a plurality of panels. The panels include at least side, top and back panels defining a compartment in which the one or more electronic components are mounted. The compartment has a top, a bottom and a rear, and the top panel includes an opening therethrough that is rectangular in shape. The electronic equipment enclosure further includes an exhaust air duct, having four side panels connected by four corner fittings, extending upward from the top panel of the compartment. The exhaust air duct is rectangular in cross-section and is disposed in surrounding relation to, and in fluid communication with, the top panel opening, and the exhaust air duct is adapted to segregate hot air being exhausted from the compartment from cool air entering the compartment, thereby improving thermal management of the enclosure.

In features of this aspect, each corner fitting extends substantially along the length of each of an edge of a respective panel and an edge of a respective adjacent panel; the exhaust air duct is adapted to telescope in length; each corner fitting is formed in an extrusion process; each corner fitting has a uniform cross-section; and each panel of the exhaust air duct is planar in form.

In other features of this aspect, the corner fittings include hinges, thereby facilitating the collapse of the exhaust air duct from a use state to a flattened state; a corner lock is coupled to one of the corner fittings and adapted to maintain the air duct panels in the use state; each corner lock includes a main body, a lock plate, and a lock screw; an upper edge of each air duct panel is flared outward; a respective seal is attached to the upper edge of each air duct panel to limit air escaping from between an upper end of the duct section and a ceiling structure; each hinge is a living hinge; each corner fitting includes two finger arrays connected together by the hinge; each finger array includes a pair of fingers defining a channel; each pair of fingers includes a latch finger with a hook adapted to fit over a raised structure on an air duct panel; each corner fitting is formed in a co-extrusion process using a first material for the hinge and a second material for the remainder of the corner fitting; and each corner fitting has a uniform cross-section.

In still other features of this aspect, each corner fitting includes a pair of fingers defining a panel channel in which an edge of an air duct panel is inserted and retained; and each air duct panel includes a plurality of raised structures along its lateral edges, and the structures are engaged within the panel channel.

Broadly defined, the present invention according to another aspect includes an extendible exhaust air duct, for an electronic equipment enclosure having a frame structure at least partially enclosed by a plurality of panels defining a compartment in which one or more electronic components are mounted, that is adapted to extend upward from the top panel of the compartment, and that is adapted to segregate hot air being exhausted from the compartment from cool air entering the compartment, thereby improving thermal management of the enclosure.

In a feature of this aspect, the extendible exhaust air duct is adapted to telescope in length.

Broadly defined, the present invention according to another aspect includes an extendible exhaust air duct for an electronic equipment enclosure that includes a frame structure formed from a plurality of support posts and at least partially enclosed by a plurality of panels. The panels include at least side, top and back panels defining a compartment in which the one or more electronic components are mounted. The compartment has a top, a bottom and a rear, and the top panel includes an opening therethrough that is rectangular in shape. The extendible exhaust air duct is adapted to extend upward from the top panel of the compartment; the exhaust air duct is rectangular in cross-section and is disposed in surrounding relation to, and in fluid communication with, the top panel opening; and the exhaust air duct is adapted to segregate hot air being exhausted from the compartment from cool air entering the compartment, thereby improving thermal management of the enclosure.

In a feature of this aspect, the extendible exhaust air duct is adapted to telescope in length.

Broadly defined, the present invention according to another aspect includes a collapsible exhaust duct, for an electronic equipment enclosure having a frame structure at least partially enclosed by a plurality of panels defining a compartment in which one or more electronic components are mounted, that is adapted to extend upward from the top panel of the compartment, and that is adapted to segregate hot air being exhausted from the compartment from cool air entering the compartment, thereby improving thermal management of the enclosure.

In a feature of this aspect, the collapsible exhaust duct is adapted to telescope in length.

In other features of this aspect, the collapsible exhaust duct includes four side panels that are hinged relative to each other, thereby facilitating the collapse of the exhaust duct from a use state to a flattened state; the four side panels are connected at their corners by a hinged corner fitting; a corner lock is coupled to one of the corner fittings and adapted to maintain the exhaust duct panels in the use state; each corner lock includes a main body, a lock plate, and a lock screw; each corner fitting extends substantially along the length of each of an edge of a respective panel and an edge of a respective adjacent panel; an upper edge of each exhaust duct panel is flared outward; and a respective seal is attached to the upper edge of each exhaust duct panel to limit air escaping from between an upper end of the duct section and a ceiling structure.

Broadly defined, the present invention according to another aspect includes a collapsible exhaust duct for an electronic equipment enclosure having a frame structure formed from a plurality of support posts and at least partially enclosed by a plurality of panels. The panels include at least side, top and back panels defining a compartment in which the one or more electronic components are mounted. The compartment has a top, a bottom and a rear, and the top panel includes an opening therethrough that is rectangular in shape. The collapsible exhaust duct is adapted to extend upward from the top panel of the compartment; the exhaust duct is rectangular in cross-section and is disposed in surrounding relation to, and in fluid communication with, the top panel opening; and the exhaust duct is adapted to segregate hot air being exhausted from the compartment from cool air entering the compartment, thereby improving thermal management of the enclosure.

In a feature of this aspect, the collapsible exhaust duct is adapted to telescope in length.

In other features of this aspect, the collapsible exhaust duct includes four side panels that are hinged relative to each other, thereby facilitating the collapse of the exhaust duct from a use state to a flattened state; the four exhaust duct panels are connected at their corners by a hinged corner fitting; a corner lock is coupled to one of the corner fittings and adapted to maintain the exhaust duct panels in the use state; each corner lock includes a main body, a lock plate, and a lock screw; each corner fitting extends substantially along the length of each of an edge of a respective panel and an edge of a respective adjacent panel; an upper edge of each exhaust duct panel is flared outward; and a respective seal is attached to the upper edge of each exhaust duct panel to limit air escaping from between an upper end of the duct section and a ceiling structure.

Broadly defined, the present invention according to another aspect includes an exhaust duct for an electronic equipment enclosure having a frame structure at least partially enclosed by a plurality of panels defining a compartment in which one or more electronic components are mounted. The exhaust duct includes a lower duct section extending upward from the top panel of the compartment and an upper duct section extending upward from an upper end of the lower duct section. The exhaust duct is adapted to segregate hot air being exhausted from the compartment from cool air entering the compartment, thereby improving thermal management of the enclosure.

In a feature of this aspect, the upper duct section is adapted to telescope from the lower duct section.

In other features of this aspect, each duct section includes four flat side panels connected at their corners by a corner fitting; each corner fitting is hinged; each corner fitting in the lower duct section is slidably coupled to a respective corner fitting in the upper duct section; a corner lock is coupled to one of the corner fittings and adapted to maintain the position of the upper duct section relative to the lower duct section; each corner lock includes a main body, a lock plate, and a lock screw; each corner fitting includes a pair of clamp fingers on the outer side thereof for engaging the respective corner lock; each corner fitting includes a pair of fingers defining a panel channel in which an edge of an exhaust duct panel is inserted and retained; each panel includes a plurality of raised structures along its lateral edges, and the structures are engaged within the panel channel; each raised structure is a boss; and each corner fitting extends substantially along the length of each of an edge of a respective panel and an edge of a respective adjacent panel.

In other features of this aspect, the upper duct section telescopes from within the lower duct section; a respective seal is attached to an upper edge of each panel of the lower duct section to limit air escaping from between the upper end of the lower duct section and a lower end of the upper duct section; each exhaust duct panel includes a plurality of raised structures along its upper edge, and the structures are engaged within a channel of the seal; and each raised structure is an outwardly-extending tab.

In still other features of this aspect, the upper duct section telescopes from around the periphery of the lower duct section, and a respective seal is attached to a lower edge of each panel of the upper duct section to limit air escaping from between the upper end of the lower duct section and a lower end of the upper duct section.

In still yet another feature of this aspect, at least one panel in a first of the two duct sections includes a column of openings, and a respective corresponding panel in a second of the two duct sections includes a corresponding mounting feature such that when the first duct section and the second duct section are telescopically assembled to each other, the mounting feature of the second duct section may be aligned with any opening of the column of openings, thereby facilitating the attachment of the second duct section to the first duct section at a desired height.

Broadly defined, the present invention according to another aspect includes an exhaust duct for an electronic equipment enclosure having a frame structure formed from a plurality of support posts and at least partially enclosed by a plurality of panels. The panels include at least side, top and back panels defining a compartment in which the one or more electronic components are mounted. The compartment has a top, a bottom and a rear, and the top panel includes an opening therethrough that is rectangular in shape. The exhaust duct includes a lower duct section extending upward from the top panel of the compartment and an upper duct section extending upward from an upper end of the lower duct section. Each duct section is rectangular in cross-section; and, when disposed in surrounding relation to, and in fluid communication with, the top panel opening, the exhaust duct is adapted to segregate hot air being exhausted from the compartment from cool air entering the compartment, thereby improving thermal management of the enclosure.

In a feature of this aspect, the upper duct section is adapted to telescope from the lower duct section.

In other features of this aspect, each duct section includes four flat side panels connected at their corners by a corner fitting; each corner fitting is hinged; each corner fitting in the lower duct section is slidably coupled to a respective corner fitting in the upper duct section; a corner lock is coupled to one of the corner fittings and adapted to maintain the position of the upper duct section relative to the lower duct section; each corner lock includes a main body, a lock plate, and a lock screw; each corner fitting includes a pair of clamp fingers on the outer side thereof for engaging the respective corner lock; each corner fitting includes a pair of fingers defining a panel channel in which an edge of an exhaust duct panel is inserted and retained; each panel includes a plurality of raised structures along its lateral edges, and the structures are engaged within the panel channel; each raised structure is a boss; and each corner fitting extends substantially along the length of each of an edge of a respective exhaust duct panel and an edge of a respective adjacent exhaust duct panel.

In other features of this aspect, the upper duct section telescopes from within the lower duct section; a respective seal is attached to an upper edge of each panel of the lower duct section to limit air escaping from between the upper end of the lower duct section and a lower end of the upper duct section; each exhaust duct panel includes a plurality of raised structures along its upper edge, and the structures are engaged within a channel of the seal; and each raised structure is an outwardly-extending tab.

In still other features of this aspect, the upper duct section telescopes from around the periphery of the lower duct section, and a respective seal is attached to a lower edge of each panel of the upper duct section to limit air escaping from between the upper end of the lower duct section and a lower end of the upper duct section.

In still yet another feature of this aspect, at least one panel in a first of the two duct sections includes a column of openings, and a respective corresponding panel in a second of the two duct sections includes a corresponding mounting feature such that when the first duct section and the second duct section are telescopically assembled to each other, the mounting feature of the second duct section may be aligned with any opening of the column of openings, thereby facilitating the attachment of the second duct section to the first duct section at a desired height.

Broadly defined, the present invention according to another aspect includes an exhaust duct for an electronic equipment enclosure having a frame structure at least partially enclosed by a plurality of panels defining a compartment in which one or more electronic components are mounted. The exhaust duct includes four side panels connected by four corner fittings, adapted to extend upward from the top panel of the compartment, and the exhaust duct is adapted to segregate hot air being exhausted from the compartment from cool air entering the compartment, thereby improving thermal management of the enclosure.

In features of this aspect, each corner fitting extends substantially along the length of each of an edge of a respective panel and an edge of a respective adjacent panel; the exhaust duct is adapted to telescope in length; each corner fitting is formed in an extrusion process; and each corner fitting has a uniform cross-section.

In other features of this aspect, the corner fittings include hinges, thereby facilitating the collapse of the exhaust duct from a use state to a flattened state; a corner lock is coupled to one of the corner fittings and adapted to maintain the exhaust duct panels in the use state; each corner lock includes a main body, a lock plate, and a lock screw; an upper edge of each exhaust duct panel is flared outward; a respective seal is attached to the upper edge of each exhaust duct panel to limit air escaping from between an upper end of the duct section and a ceiling structure; each hinge is a living hinge; each corner fitting includes two finger arrays connected together by the hinge; each finger array includes a pair of fingers defining a channel; each pair of fingers includes a latch finger with a hook adapted to fit over a raised structure on an exhaust duct panel; each corner fitting is formed in a co-extrusion process using a first material for the hinge and a second material for the remainder of the corner fitting; and each corner fitting has a uniform cross-section.

In still other features of this aspect, each corner fitting includes a pair of fingers defining a panel channel in which an edge of an exhaust duct panel is inserted and retained, and each exhaust duct panel includes a plurality of raised structures along its lateral edges, and the structures are engaged within the panel channel.

Broadly defined, the present invention according to another aspect includes an exhaust duct for an electronic equipment enclosure having a frame structure formed from a plurality of support posts and at least partially enclosed by a plurality of panels. The panels include at least side, top and back panels defining a compartment in which the one or more electronic components are mounted. The compartment has a top, a bottom and a rear, and the top panel includes an opening therethrough that is rectangular in shape. The exhaust duct includes four side panels connected by four corner fittings, and is adapted to extend upward from the top panel of the compartment. Furthermore, the exhaust duct is rectangular in cross-section; and, when disposed in surrounding relation to, and in fluid communication with, the top panel opening, the exhaust duct is adapted to segregate hot air being exhausted from the compartment from cool air entering the compartment, thereby improving thermal management of the enclosure.

In features of this aspect, each corner fitting extends substantially along the length of each of an edge of a respective panel and an edge of a respective adjacent panel; the exhaust duct is adapted to telescope in length; each corner fitting is formed in an extrusion process; and each corner fitting has a uniform cross-section.

In other features of this aspect, the corner fittings include hinges, thereby facilitating the collapse of the exhaust duct from a use state to a flattened state; a corner lock is coupled to one of the corner fittings and adapted to maintain the exhaust duct panels in the use state; each corner lock includes a main body, a lock plate, and a lock screw; an upper edge of each exhaust duct panel is flared outward; a respective seal is attached to the upper edge of each exhaust duct panel to limit air escaping from between an upper end of the duct section and a ceiling structure; each hinge is a living hinge; each corner fitting includes two finger arrays connected together by the hinge; each finger array includes a pair of fingers defining a channel; each pair of fingers includes a latch finger with a hook adapted to fit over a raised structure on an exhaust duct panel; each corner fitting is formed in a co-extrusion process using a first material for the hinge and a second material for the remainder of the corner fitting; and each corner fitting has a uniform cross-section.

In still other features of this aspect, each corner fitting includes a pair of fingers defining a panel channel in which an edge of an exhaust duct panel is inserted and retained, and each exhaust duct panel includes a plurality of raised structures along its lateral edges, and the structures are engaged within the panel channel.

Broadly defined, the present invention according to another aspect includes a method of installing an exhaust duct on an electronic equipment enclosure having a frame structure formed from a plurality of support posts and at least partially enclosed by a plurality of panels. The panels include at least side, top and back panels defining a compartment in which the one or more electronic components are mounted. The compartment has a top, a bottom and a rear, and the top panel includes an opening therethrough that is rectangular in shape. The method includes the steps of providing an exhaust duct, having four side panels connected to one another by hinges, in a collapsed state; opening the exhaust duct by rotating the panels relative to each other, about the hinges, to place the exhaust duct in a use state; and attaching a lower end of the exhaust duct to the equipment enclosure such that an interior of the exhaust duct is in fluid communication with an interior of the compartment via the opening in the top panel of the enclosure.

In a feature of this aspect, in the use state, the exhaust duct has a rectangular cross-section.

In other features of this aspect, the providing step includes shipping the exhaust duct to an installation site, and the providing step includes, prior to shipping the exhaust duct to an installation site, connecting a corner fitting, incorporating at least one of the hinges, to a lateral edge of a first panel and a lateral edge of a second panel.

Broadly defined, the present invention according to still another aspect includes an electronic equipment enclosure for mounting one or more electronic components having a frame structure formed from a plurality of support posts and at least partially enclosed by a plurality of panels. The panels include at least side, top and back panels defining a compartment in which the one or more electronic components are mounted. The compartment has a top, a bottom and a rear, and the top panel includes an opening therethrough that is rectangular in shape. The electronic equipment enclosure includes an exhaust air duct having at least one duct section having four side panels, each side panel having an outwardly flared portion at an upper edge thereof, extending upward from the top panel of the compartment. The exhaust air duct is rectangular in cross-section and is disposed in surrounding relation to, and in fluid communication with, the top panel opening. The exhaust air duct is adapted to segregate hot air being exhausted from the compartment from cool air entering the compartment, thereby improving thermal management of the enclosure.

In features of this aspect, each outwardly flared portion includes an outwardly angled portion of a respective upper portion of a side panel; the electronic equipment enclosure further comprises a top seal mounted on each respective upper edge; and each air duct side panel is generally planar in form, and each outwardly flared portion includes an outwardly flared top seal mounted on an upper edge of a respective air duct side panel.

Broadly defined, the present invention according to still yet another aspect includes an exhaust duct for an electronic equipment enclosure having a frame structure formed from a plurality of support posts and at least partially enclosed by a plurality of panels. The panels include at least side, top and back panels defining a compartment in which the one or more electronic components are mounted. The compartment has a top, a bottom and a rear, and the top panel includes an opening therethrough that is rectangular in shape. The exhaust duct includes at least one duct section having four side panels, each side having an outwardly flared portion at an upper edge thereof. The exhaust duct is adapted to extend upward from the top panel of the compartment; the exhaust duct is rectangular in cross-section; and when disposed in surrounding relation to, and in fluid communication with, the top panel opening, the exhaust duct is adapted to segregate hot air being exhausted from the compartment from cool air entering the compartment, thereby improving thermal management of the enclosure.

In features of this aspect, each outwardly flared portion includes an outwardly angled portion of a respective upper portion of a side panel; the exhaust duct further comprises a top seal mounted on each respective upper edge; and each air duct side panel is generally planar in form, and each outwardly flared portion includes an outwardly flared top seal mounted on an upper edge of a respective air duct side panel.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

Further features, embodiments, and advantages of the present invention will become apparent from the following detailed description with reference to the drawings, wherein.

DETAILED DESCRIPTION OF THE PREFERRED EMBODIMENTS

Figure 1:
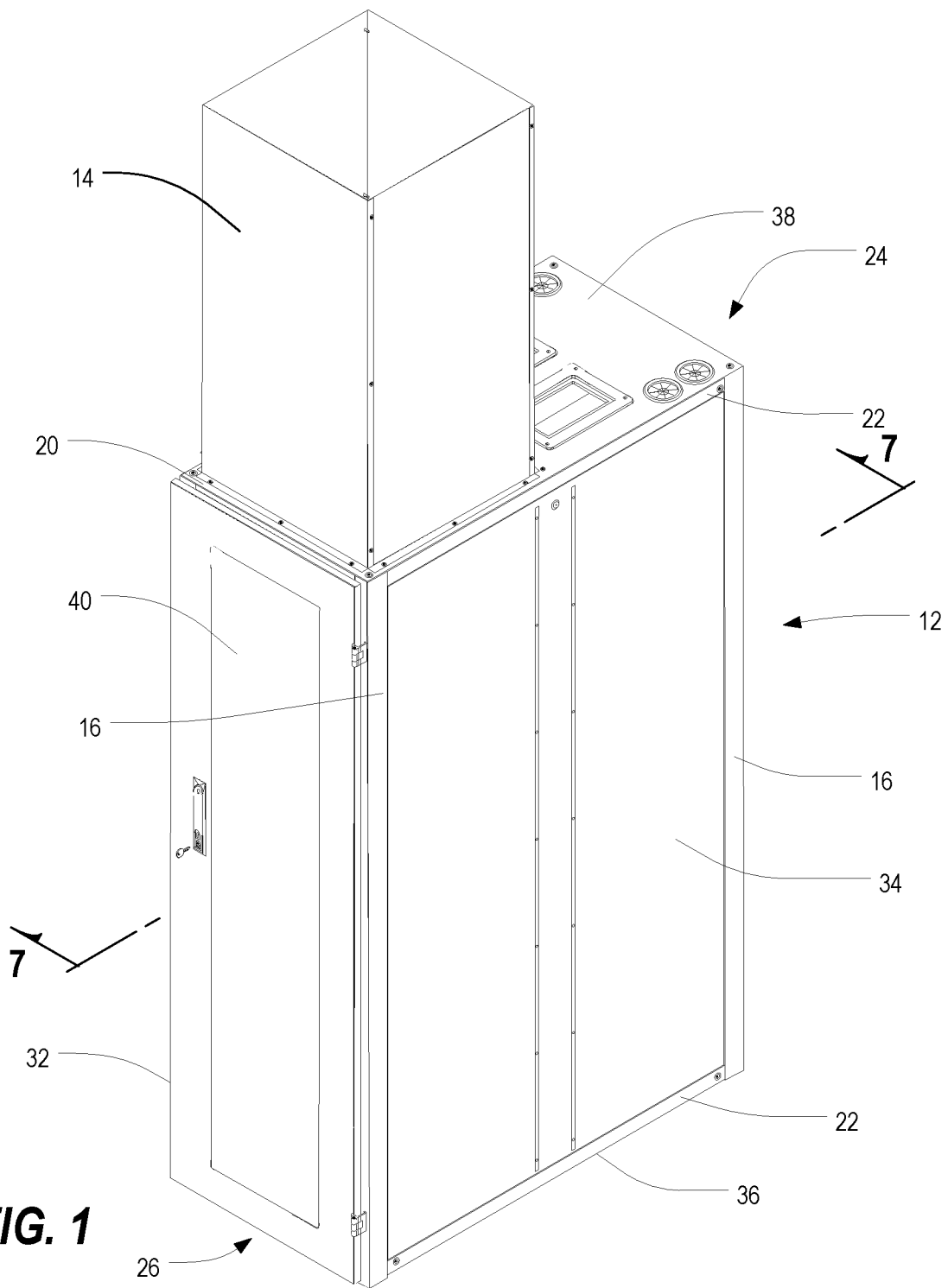
FIG. 1 is a rear isometric view of a ducted exhaust equipment enclosure in accordance with a preferred embodiment of the present invention.
Figure 2:
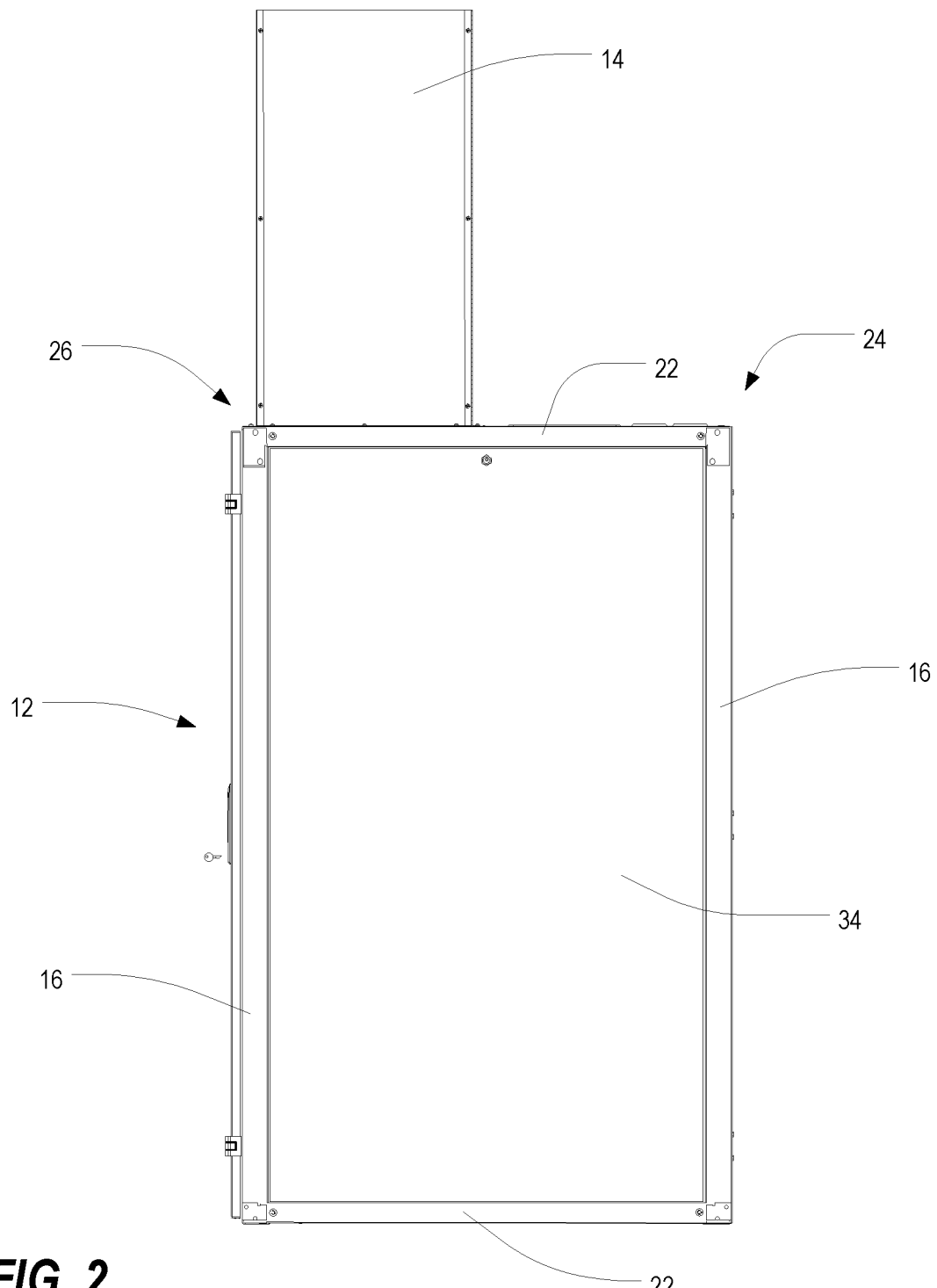
FIG. 2 is a left plan view of the ducted exhaust equipment enclosure of FIG. 1.
Figure 3:
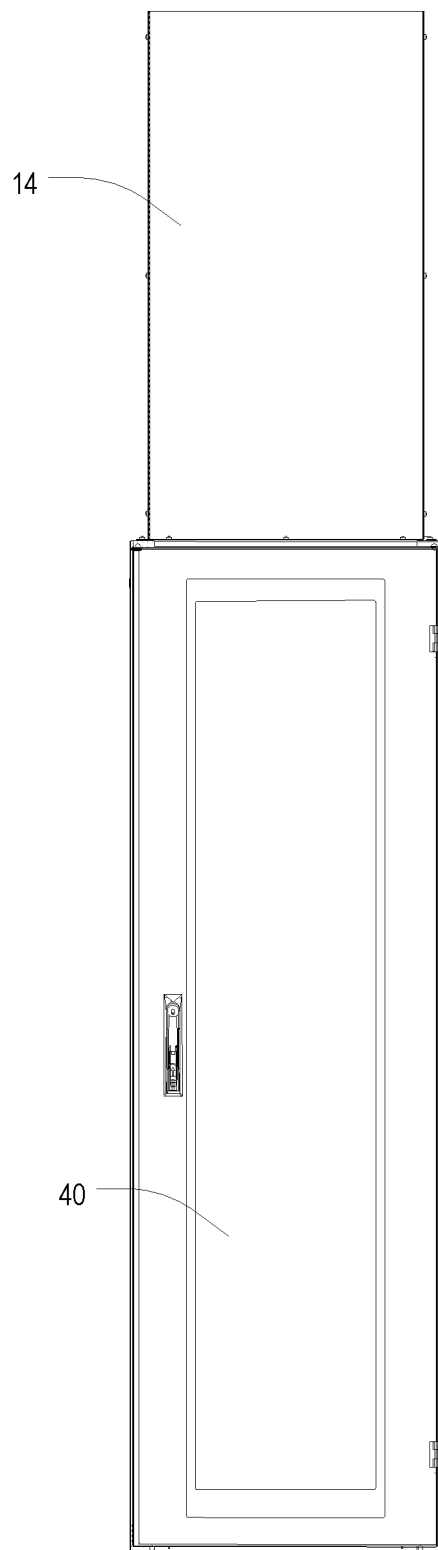
FIG. 3 is a rear plan view of the ducted exhaust equipment enclosure of FIG. 1.

As a preliminary matter, it will readily be understood by one having ordinary skill in the relevant art ("Ordinary Artisan") that the present invention has broad utility and application. Furthermore, any embodiment discussed and identified as being "preferred" is considered to be part of a best mode contemplated for carrying out the present invention. Other embodiments also may be discussed for additional illustrative purposes in providing a full and enabling disclosure of the present invention. Moreover, many embodiments, such as adaptations, variations, modifications, and equivalent arrangements, will be implicitly disclosed by the embodiments described herein and fall within the scope of the present invention.

Accordingly, while the present invention is described herein in detail in relation to one or more embodiments, it is to be understood that this disclosure is illustrative and exemplary of the present invention, and is made merely for the purposes of providing a full and enabling disclosure of the present invention. The detailed disclosure herein of one or more embodiments is not intended, nor is to be construed, to limit the scope of patent protection afforded the present invention, which scope is to be defined by the claims and the equivalents thereof. It is not intended that the scope of patent protection afforded the present invention be defined by reading into any claim a limitation found herein that does not explicitly appear in the claim itself.

Thus, for example, any sequence(s) and/or temporal order of steps of various processes or methods that are described herein are illustrative and not restrictive. Accordingly, it should be understood that, although steps of various processes or methods may be shown and described as being in a sequence or temporal order, the steps of any such processes or methods are not limited to being carried out in any particular sequence or order, absent an indication otherwise. Indeed, the steps in such processes or methods generally may be carried out in various different sequences and orders while still falling within the scope of the present invention. Accordingly, it is intended that the scope of patent protection afforded the present invention is to be defined by the appended claims rather than the description set forth herein.

Additionally, it is important to note that each term used herein refers to that which the Ordinary Artisan would understand such term to mean based on the contextual use of such term herein. To the extent that the meaning of a term used herein—as understood by the Ordinary Artisan based on the contextual use of such term—differs in any way from any particular dictionary definition of such term, it is intended that the meaning of the term as understood by the Ordinary Artisan should prevail.

Furthermore, it is important to note that, as used herein, "a" and "an" each generally denotes "at least one," but does not exclude a plurality unless the contextual use dictates otherwise. Thus, reference to "a picnic basket having an apple" describes "a picnic basket having at least one apple" as well as "a picnic basket having apples." In contrast, reference to "a picnic basket having a single apple" describes "a picnic basket having only one apple."

When used herein to join a list of items, "or" denotes "at least one of the items," but does not exclude a plurality of items of the list. Thus, reference to "a picnic basket having cheese or crackers" describes "a picnic basket having cheese without crackers", "a picnic basket having crackers without cheese", and "a picnic basket having both cheese and crackers." Finally, when used herein to join a list of items, "and" denotes "all of the items of the list." Thus, reference to "a picnic basket having cheese and crackers" describes "a picnic basket having cheese, wherein the picnic basket further has crackers," as well as describes "a picnic basket having crackers, wherein the picnic basket further has cheese."

Referring now to the drawings, in which like numerals represent like components throughout the several views, the preferred embodiments of the present invention are next described. The following description of the preferred embodiment(s) is merely exemplary in nature and is in no way intended to limit the invention, its application, or uses.

FIGS. 1-6 are various views of a ducted exhaust equipment enclosure 10 in accordance with a preferred embodiment of the present invention. More particularly, FIG. 1 is a rear isometric view of such a ducted exhaust equipment enclosure 10, and FIGS. 2-6 are a left plan view, rear plan view, front plan view, top plan view and bottom plan view, respectively, of the ducted exhaust equipment enclosure of FIG. 1. As shown therein, the ducted exhaust equipment enclosure 10 includes a four post frame structure 12 having panels 32, 34, 36, 38, 40, more fully described hereinbelow, partially enclosing the enclosure 10, attached thereto and an exhaust air duct 14 extending upwardly from the top of the enclosure 10.

The four post frame structure 12 may be of conventional design and construction. As shown and described, the four post frame structure 12 includes four vertical support posts 16, upper and lower front cross members 18, upper and lower rear cross members 20 and two pairs of upper and lower side cross members 22. Each vertical support post 16 includes a plurality of cross member attachment apertures at each end. Two of the vertical support posts 16 are connected together at their upper and lower ends by the upper and lower front cross members 18, respectively, and the other two support posts 16 are connected together at their upper and lower ends by the upper and lower rear cross members 20, respectively. The front cross members 18 and their respective support posts 16 thus define a front frame 24, and the rear cross members 20 and their respective support posts 16 define a rear frame 26. The front and rear frames 24, 26 may then be connected together at their respective corners by the upper and lower side cross members 22.

Any known connection means may be used to join the various members together. One example of such a connection means is illustrated in FIGS. 1-6. Although not illustrated herein, at least one other example of conventional connection means is described in commonly-assigned U.S. Pat. No. 6,185,098, the entirety of which is incorporated herein by reference. Although likewise not illustrated herein, the precision and the stability of each of the corners of at least some types of four post frame structures may be enhanced by utilizing a self-squaring corner attachment bracket such as that disclosed by the commonly-assigned U.S. Pat. No. 5,997,117 entitled "RACK FRAME CABINET," the entirety of which is hereby incorporated by reference.

It will be evident to the Ordinary Artisan that other structures may be used to form a frame structure on which panels may be mounted to form an enclosure. For example, in at least one embodiment (not illustrated), a frame structure may be formed from only two support posts.

Figure 7:
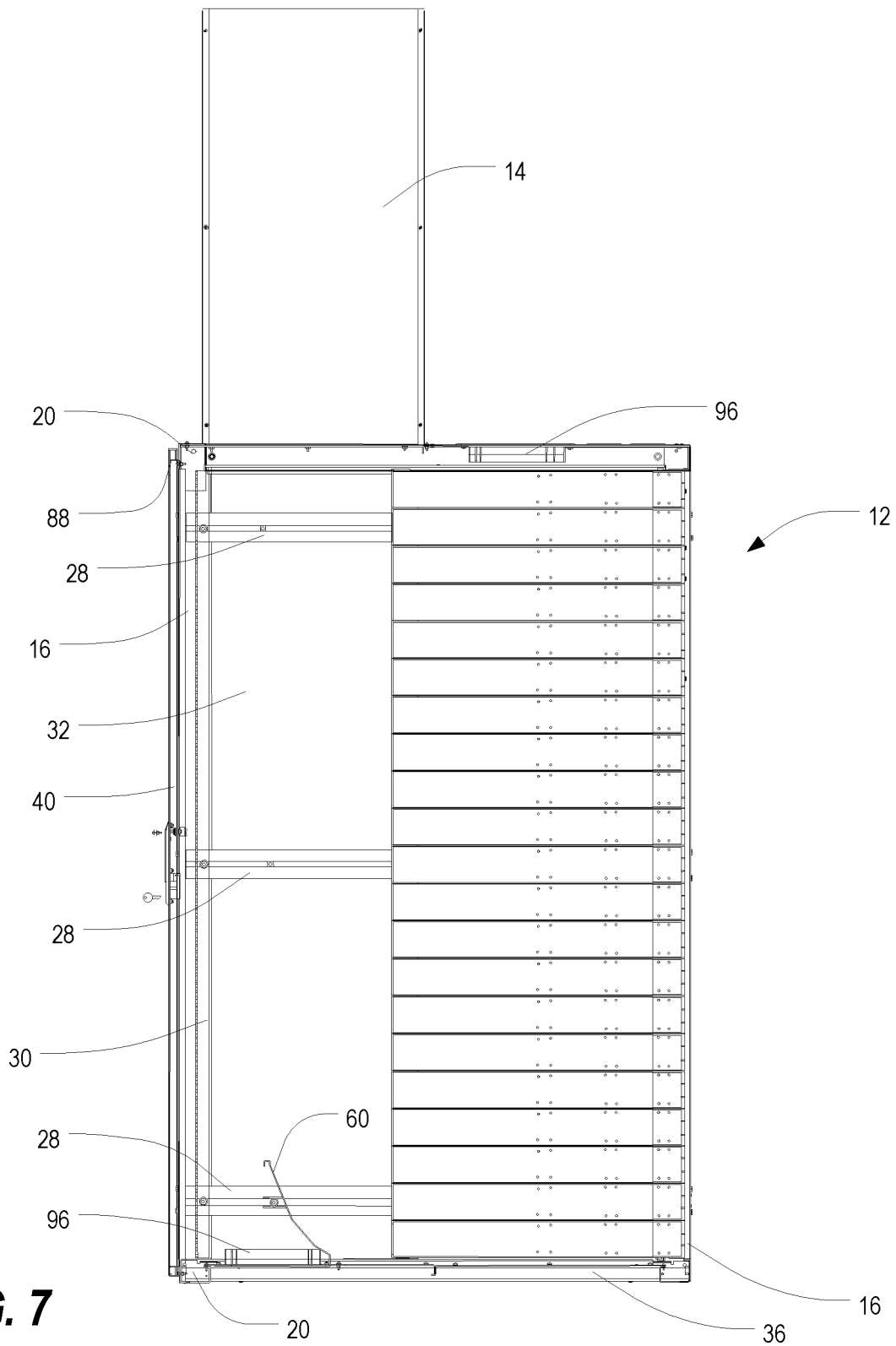
FIG. 7 is a left side cross-sectional view of the ducted exhaust equipment enclosure of FIG. 1, taken along the line 7-7.

FIG. 7 is a left side cross-sectional view of the ducted exhaust equipment enclosure 10 of FIG. 1, taken along the line 7-7. As perhaps best seen in FIG. 7, the four post frame structure 12 further comprises three pairs of horizontal mounting rails 28. Each horizontal mounting rail 28 includes a slot running substantially its entire length. In addition, three pairs of vertical mounting rails 30 are mounted to the horizontal mounting rails 28 using suitable fasteners held in place in the slots of the horizontal mounting rails 28. Each vertical mounting rail 30 preferably includes a series of threaded mounting apertures, arranged in evenly-spaced sets, extending along substantially its entire length for use in mounting electronic components, peripheral devices, cable brackets, additional mounting members, or the like thereto. It is contemplated that the number of horizontal and vertical mounting rails is variable. For example, an enclosure may include two horizontal mounting rails and two vertical mounting rails. Further, although the number of horizontal mounting rails is equal to the number of vertical mounting rails in the two examples mentioned herein, it is not necessary that the number of mounting rails be equal. It is further contemplated that, alternatively, each horizontal mounting rail may include one or more rows of mounting apertures extending along its length.

Figure 4:
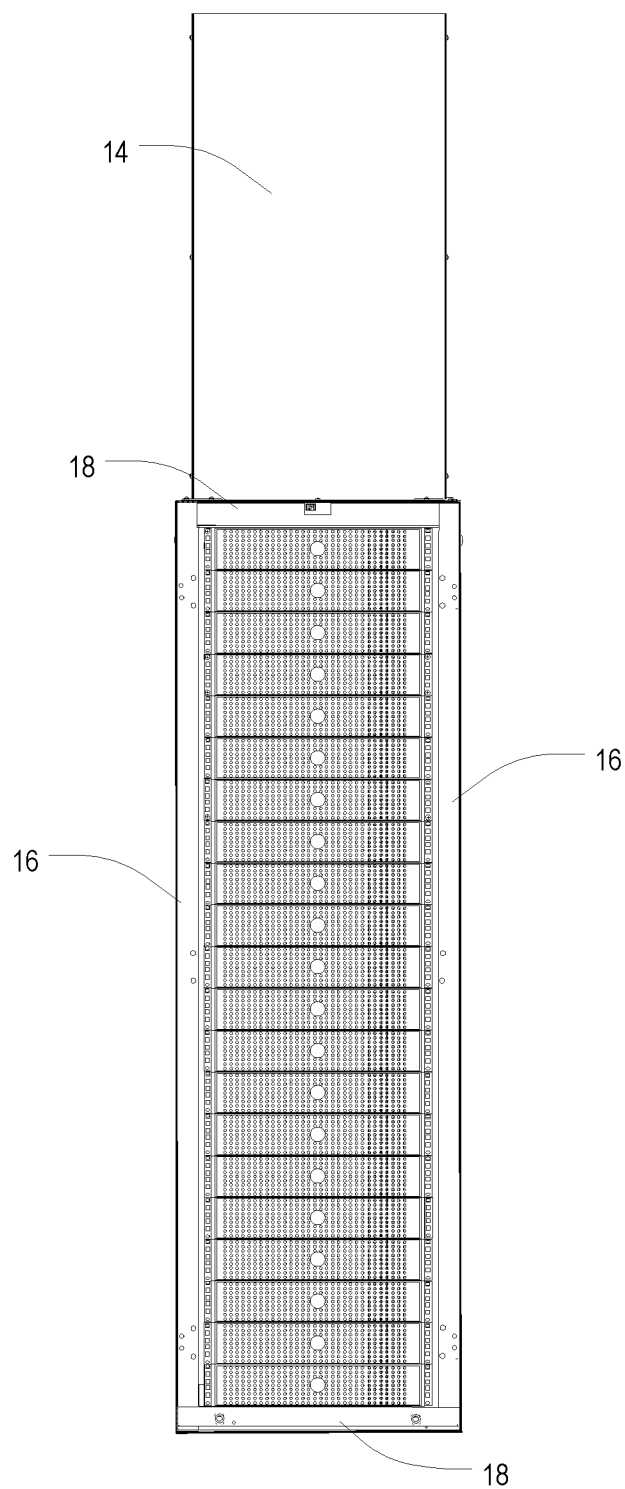
FIG. 4 is a front plan view of the ducted exhaust equipment enclosure of FIG. 1.
Figure 6:
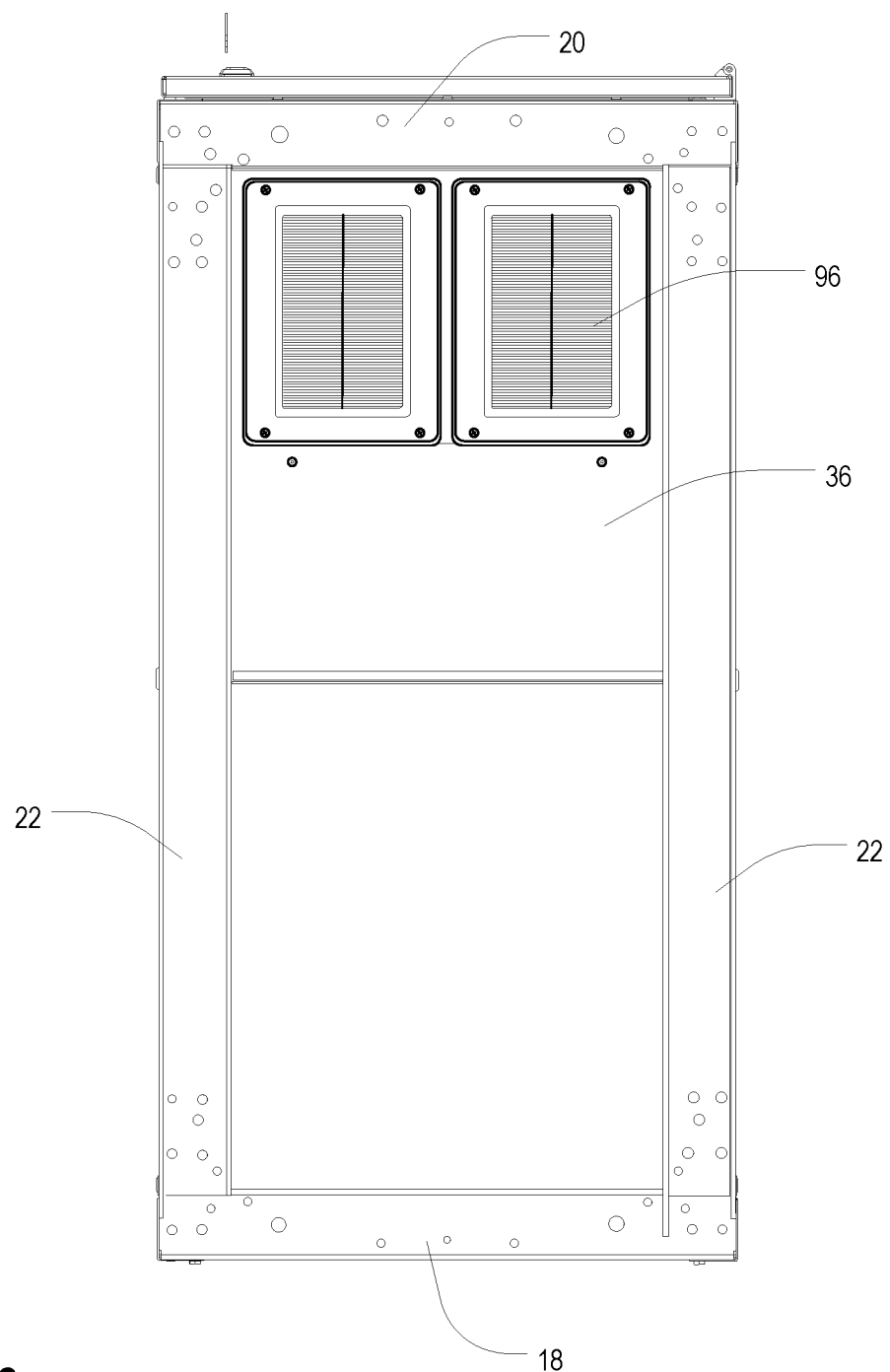
FIG. 6 is a bottom plan view of the ducted exhaust equipment enclosure of FIG. 1.

With particular reference to FIGS. 1 and 6, the enclosure 10 includes a right panel 32, a left panel 34, a bottom panel 36, a top panel 38 and a back panel 40, all attached to the frame structure 12, which partially enclose the enclosure 10. The right and left panels 32, 34 are similarly dimensioned and the bottom and top panels 36, 38 are similarly dimensioned, though differently constructed. As is shown in FIG. 4, a front of the enclosure 10 is open, therefore, the enclosure 10 is not completely enclosed. In a contemplated variation, the enclosure 10 may include a perforated or ventilated front panel (not illustrated). The Ordinary Artisan will understand that either variation of a front panel is operative to provide a path for air to enter the enclosure 10 for cooling the components contained therein. Further, although in the illustrated arrangement the back panel 40 is, in fact, a lockable door, it will be evident to the Ordinary Artisan that alternatively other types of doors and panels may be substituted for the various panels, and that one or more of the illustrated panels (such as one or both side panels 32, 34) may in some cases be omitted altogether (such as in a row of two or more adjoining enclosures 10). It is, however, preferred that the back panel be solid, i.e., substantially air impervious, so that heated air is prevented from escaping through the door as further described hereinbelow. Any known connection means may be used to join the panels to the frame structure 12, including the back door panel 40.

Figure 5:
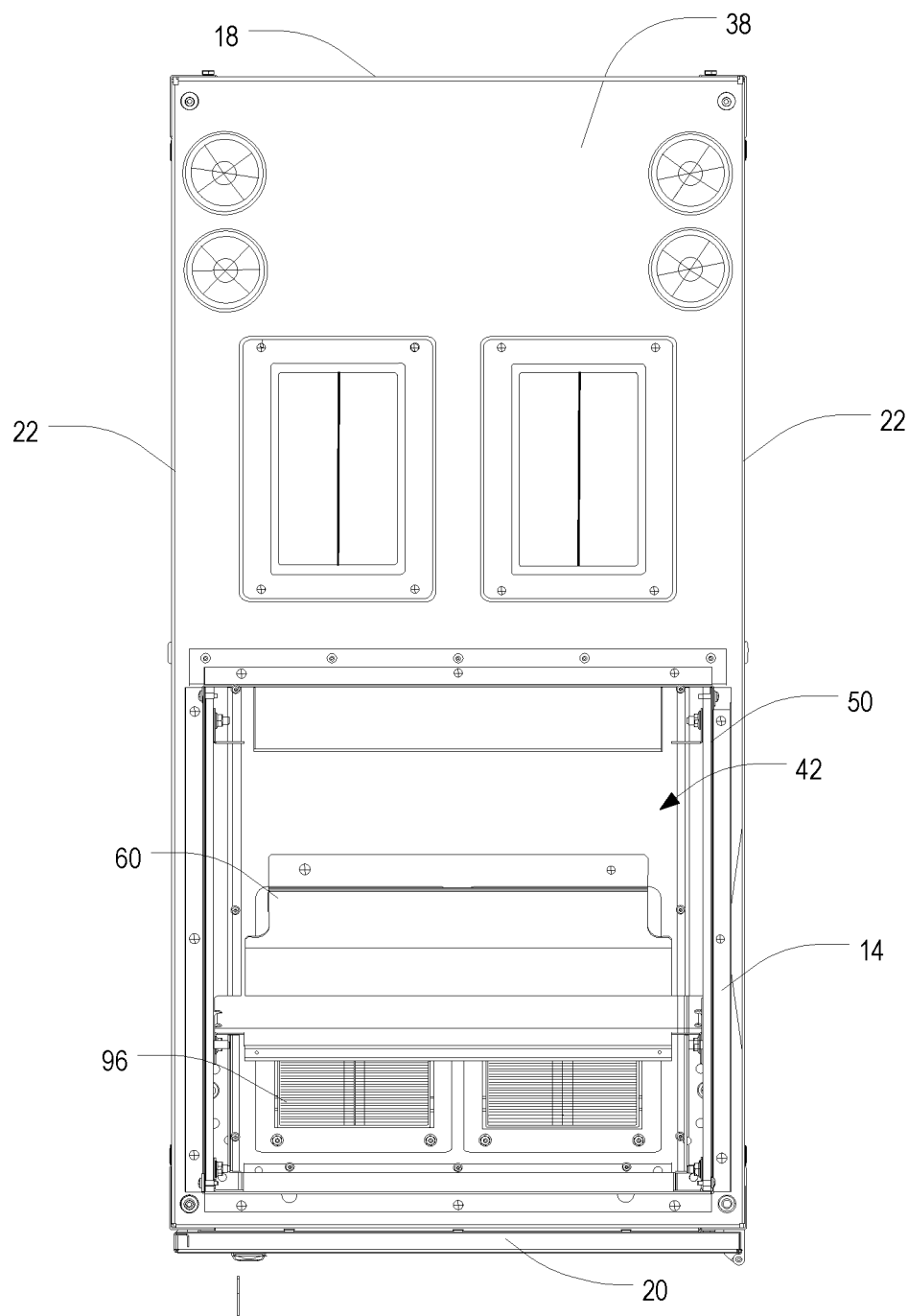
FIG. 5 is a top plan view of the ducted exhaust equipment enclosure of FIG. 1.

With reference to FIG. 5, the top panel 38 of the enclosure 10 includes a rectangular shaped opening 42 disposed adjacent the rear of the enclosure 10. The opening 42 is an exhaust opening and is intended to provided an outlet for air being exhausted from the enclosure 10, as further described hereinbelow.

Figure 8:
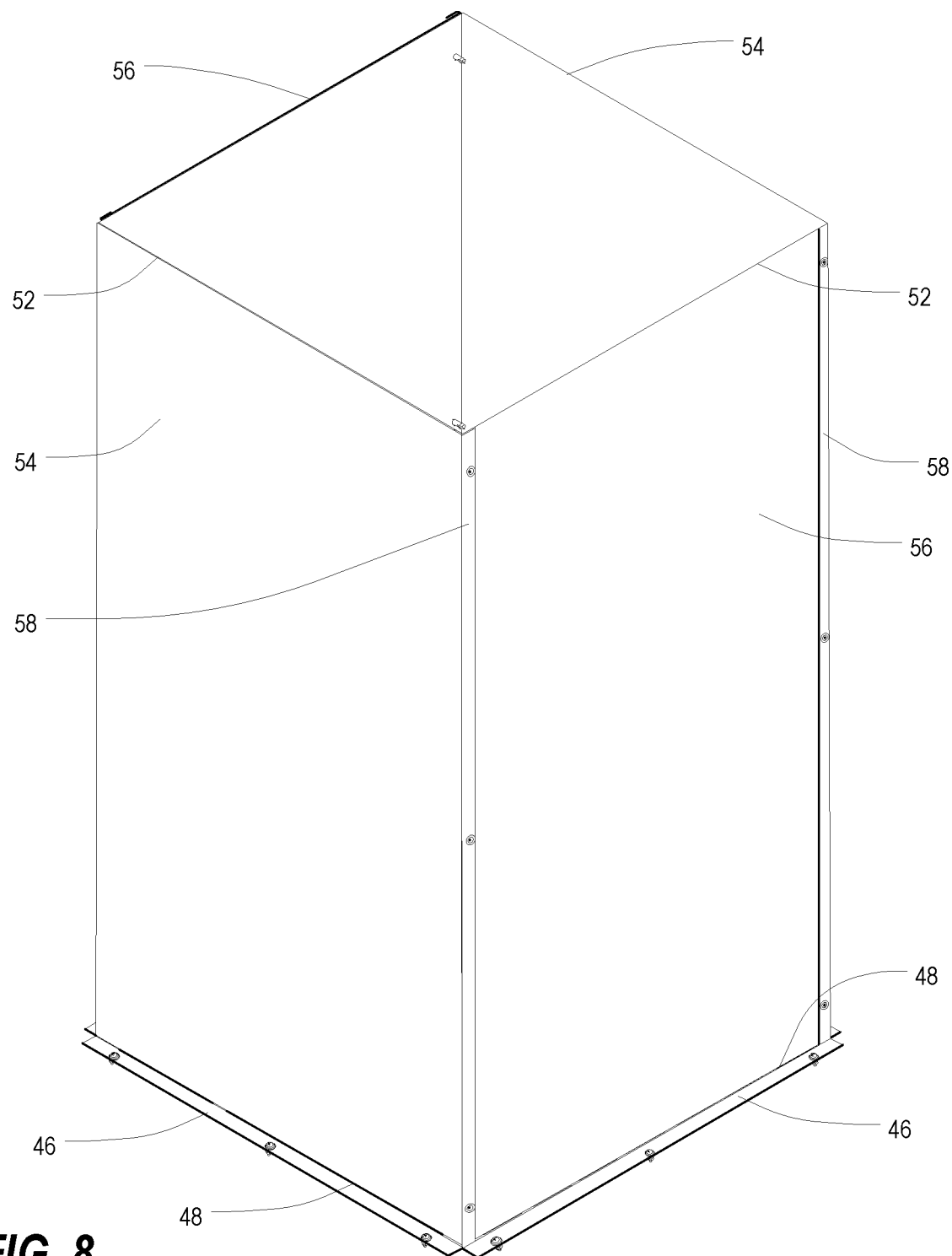
FIG. 8 is an isometric view of the exhaust air duct of FIG. 1.

As perhaps best seen in FIG. 1, the opening 42 of the top panel 38 is surrounded by, and in fluid communication with, the exhaust air duct 14. FIG. 8 is an isometric view of the exhaust air duct 14 of FIG. 1. The exhaust air duct 14 is generally rectangular in cross-section and has four generally planar panels 54, 56 of substantially similar length forming a body thereof. The width of the front and rear panels 54 is selected to correspond to the width of the enclosure 10, with the width being as wide as possible and still be mountable to the top of the enclosure 10. The width of the side panels 56 of the exhaust air duct 14 are dependent on the length or depth of the enclosure 10 and in some cases the distance between the rear of equipment mounted inside and the rear of the enclosure 10. The panels 54, 56 are preferably constructed of a smooth, stiff material providing a low-restriction exhaust air duct 14 that is self-supporting. Examples include, but are not limited to, aluminum or steel of a sufficient gauge to permit self-support. Significantly, unlike corrugated air ducts, the smooth nature of the material provides a surface that encourages, rather than hinders air flow. The exhaust air duct 14 is open at a bottom and top thereof to allow for unencumbered air passage there through. The rectangular cross-section and large size of the exhaust air duct 14 provides for a considerably larger cross-section than that of conventional cylindrical exhaust air ducts, and thus much greater flow-through. Further, the cross-section of the exhaust air duct 14 is therefore substantially the same as that of the top panel opening 42 to allow air to flow from the top panel opening 42 through the exhaust air duct 14 without encountering any obstruction. The exhaust air duct 14 segregates the hot exhaust air from cool air entering the enclosure 10 by directing it up and away from the enclosure 10.

Front and back panels 54 of the exhaust air duct 14 include flanges 58 at side edges thereof. The flanges 58 of the front and back panels 54 fold around side edges of the right and left panels 56 at the corners of the rectangular shaped exhaust air duct 14. Any known connection means, such as screws, may be used to join the exhaust air duct panels 54, 56 using the flanges 58 of the front and back panels 54. This arrangement further improves the rigidity of the exhaust air duct 14.

Each of the panels 54, 56 of the exhaust air duct 14 has an additional flange 46 at a bottom edge 48 thereof for attachment to the top panel 38 of the enclosure 10 around a rim 50 of the top panel opening 42. Furthermore, a top edge 52 of the exhaust air duct 14 may be connected to a room's return air duct, as shown schematically in FIG. 25. As will be evident to the Ordinary Artisan, it may be desirable to include additional features at the top edge 52 of the duct 14, such as a mounting flange (not shown) extending around the periphery thereof, to facilitate such connection. However, the self-supporting nature of the exhaust air duct 14 enables it to be positioned upright without any support from such a return air duct. Still more preferably, the height of exhaust air duct 14 may be adjustable for use in rooms with varying ceiling heights. In order to facilitate such adjustability, the exhaust air duct 14 may have a telescoping design or some other design capable of adjustability. Such adjustability may be further enhanced by the self-supporting nature of the exhaust air duct 14. In contrast, conventional air ducts must be attached at either end to a support because they are not self-supporting, therefore, conventional air ducts lose the freedom of adjustability that is available in the exhaust air duct 14 of the present invention.

Figure 9:
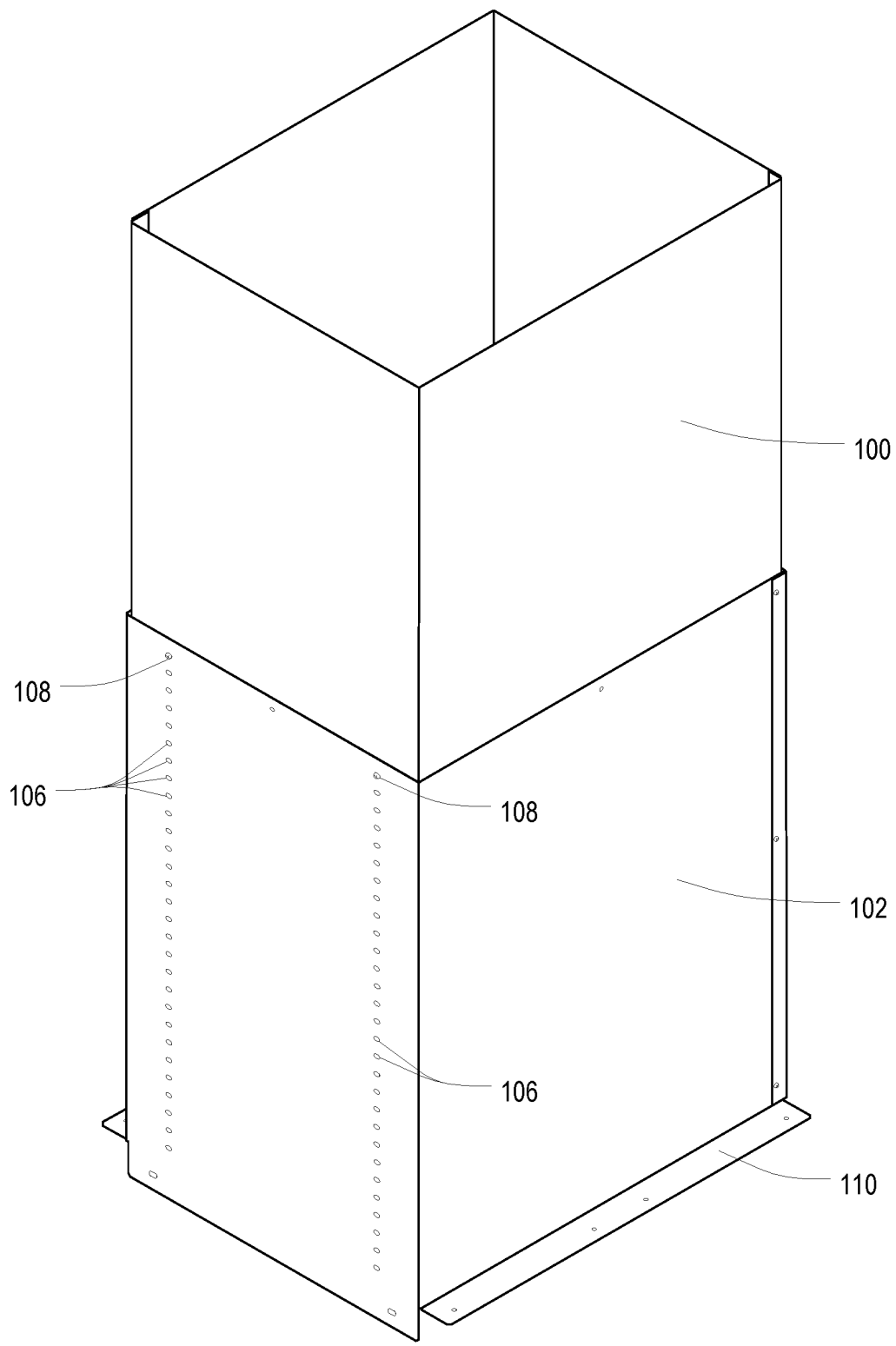
FIG. 9 is an isometric view of an exemplary telescoping exhaust air duct, for use with the ducted exhaust equipment enclosure of FIG. 1, in accordance with one or more preferred embodiments of the present invention.

FIG. 9 is an isometric view of an exemplary telescoping exhaust air duct 98, for use with the ducted exhaust equipment enclosure 10 of FIG. 1, in accordance with one or more preferred embodiments of the present invention. The telescoping duct 98 comprises two duct sections 100, 102 having a somewhat similar construction to that described above for the exhaust air duct 14. More particularly, both duct sections 100, 102 are open-ended and have a rectangular cross-section defined by front and back panels and left and right panels. The telescoping duct 98 includes a first duct section 100 with a rectangular cross-section that is slightly smaller in cross-section than a second duct section 102, within which the first duct section 100 nests. The telescoping duct 98 preferably includes a means for fixing the total height of the duct 98 once it has been adjusted, i.e., once the relation of the first duct section 100 to the second duct section 102 has been decided. In the present embodiment, each of two opposing panels of the first duct section 100 includes a pair of openings (not shown), with each opening being disposed near opposite lower corners of the panels. These openings may be disposed in front and back panels or left and right panels, depending on the orientation of the telescoping duct 98 when it is installed in the enclosure 10. Each of two opposing panels of the second duct section 102 includes a pair of columns of openings 106, preferably evenly-spaced, that are disposed near side edges of the panels. When the telescoping duct 98 is assembled, the opposing panels of the first duct section 100 having the pair of openings described above are aligned with the opposing panels of the second duct section 102 having the columns of corresponding openings 106. In this arrangement, the openings of the first duct section 100 may be adjusted vertically until the openings are aligned with a desired set of openings 106 of the second duct section 102. Thus, the first duct section 100 may be moved upwardly or downwardly, thereby increasing or decreasing the height of the telescoping duct 98, until the desired height is reached. At this point, the four openings of the first duct section 100 should be aligned with four openings 106 of the second duct section 102 that lie in the same horizontal plane. Bolts or other fasteners 208, or some other similarly functioning connection means (such as a spring-loaded pin or the like) may be inserted through the aligned openings of the first 100 and second duct sections 102 to fix the height of the telescoping duct 98. If it is subsequently desired to adjust the height, the bolts 208 may be removed and the first duct section 100 slid upwardly or downwardly until the new desired height is reached.

In the telescoping duct 98, the second duct section 102 may include a flange 210 at bottom edges of the opposing panels that do not have the columns of openings 106. The telescoping duct 98 may be connected to the enclosure 10 using the flanges 210. In addition, the panels that include the columns of openings 106 may have a bottom edge that extends slightly lower than the bottom edges of the other panels. These bottom edges may extend into the opening 42 of the top panel 38 of the enclosure 10. As will be evident to the Ordinary Artisan, the dispositions of these elements may be changed as desired.

Figure 10:
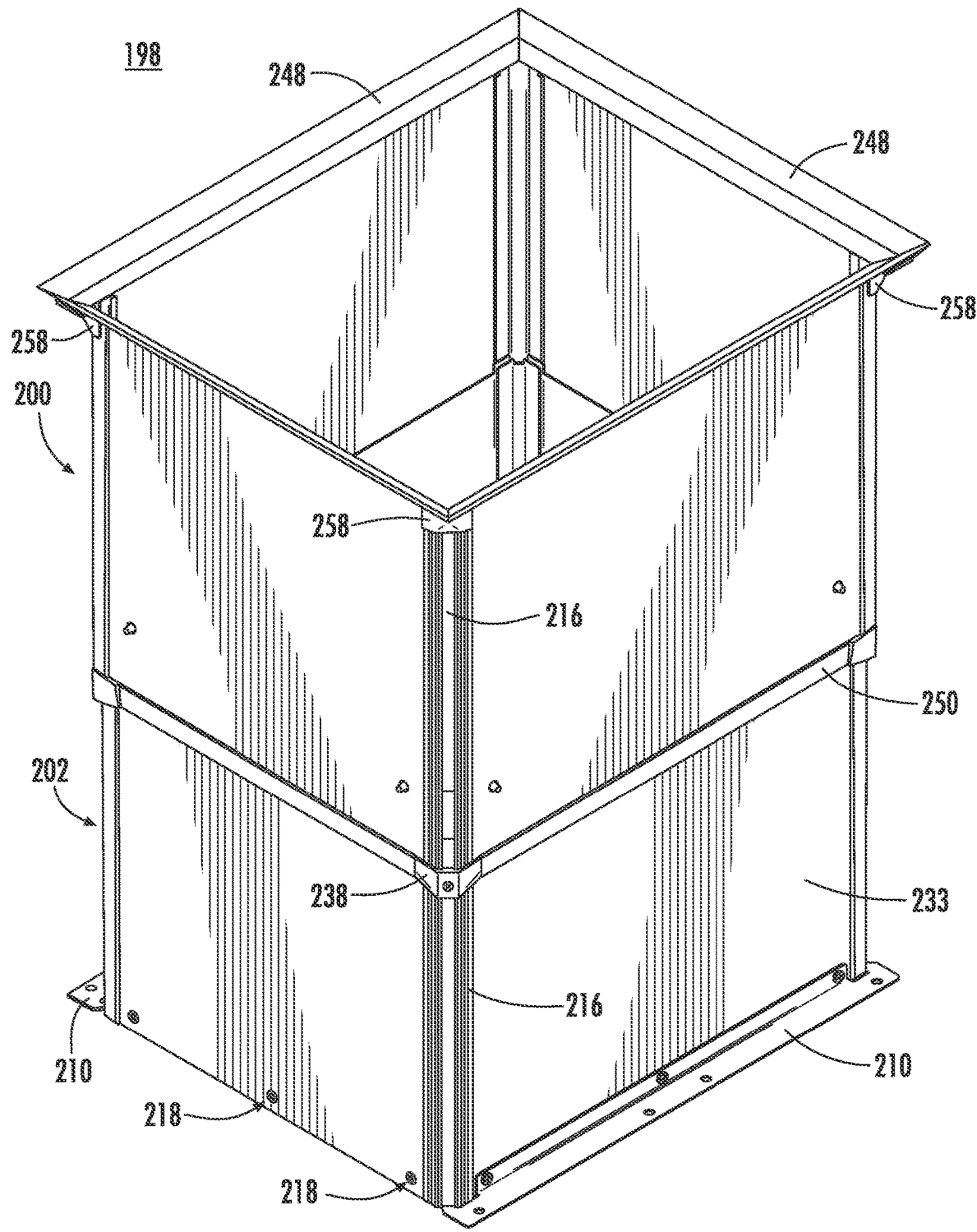
FIG. 10 is an isometric view of another exemplary telescoping exhaust air duct, for use with the ducted exhaust equipment enclosure of FIG. 1, in accordance with one or more preferred embodiments of the present invention.

FIG. 10 is an isometric view of another exemplary telescoping exhaust air duct 198, for use with the ducted exhaust equipment enclosure 10 of FIG. 1, in accordance with one or more preferred embodiments of the present invention. The telescoping duct 198 comprises two duct sections 200, 202 whose construction has some similarities to that described above for the exhaust air duct 14. More particularly, both duct sections 200, 202 are open-ended and have a rectangular cross-section defined by front and back panels and left and right panels. The lower duct section 202 has a rectangular cross-section that is slightly smaller in cross-section than the upper duct section 200, within which the lower duct section 202 nests. The telescoping duct 198 preferably includes a means for fixing the total height of the duct 198 once it has been adjusted, i.e., once the relation of the upper duct section 200 to the lower duct section 202 has been decided. Thus, the upper duct section 200 may be moved upwardly or downwardly relative to the lower duct section 202, thereby increasing or decreasing the height of the telescoping duct 198, until the desired height is reached. That and other features of the telescoping duct 198 of FIG. 10 are further described hereinbelow.

Figure 11:
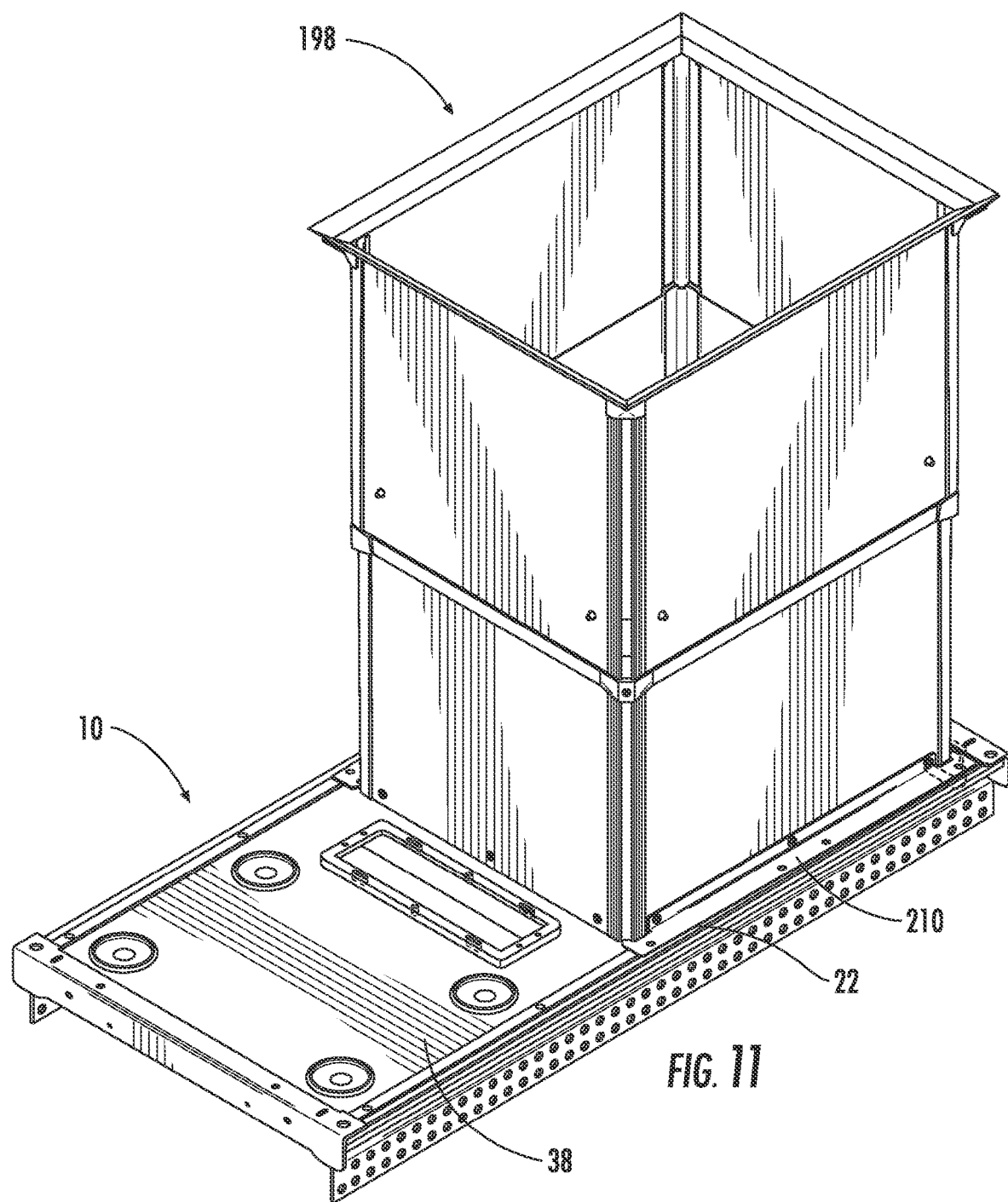
FIG. 11 is an isometric view of the telescoping exhaust air duct shown installed on the ducted exhaust equipment enclosure of FIG. 1.

FIG. 11 is an isometric view of the telescoping exhaust air duct 198 shown installed on the ducted exhaust equipment enclosure 10 of FIG. 1. With reference to FIG. 5, the duct 198 is installed on the top of the enclosure 10 such that the rectangular shaped opening 42, arranged in the top panel 38 of the enclosure 10 adjacent the rear thereof, is surrounded by, and in fluid communication with, the exhaust air duct 14. The duct 198 is thus disposed adjacent the rear of the enclosure 10, and because of the correspondence of its size and shape to that of the top or footprint of the enclosure 10, the duct 198 thus occupies a very large proportion of the rear area of the enclosure top. It will be appreciated that the front area of the top panel 38 of the enclosure 10 may include one or more cable openings for routing cables from the interior of the enclosure 10 up through the top panel 38. In the particular arrangement shown in FIG. 11, four small circular cable openings and one larger rectangular cable opening (not numbered) are shown, but other numbers and types of cable openings are likewise possible.

Figure 12:
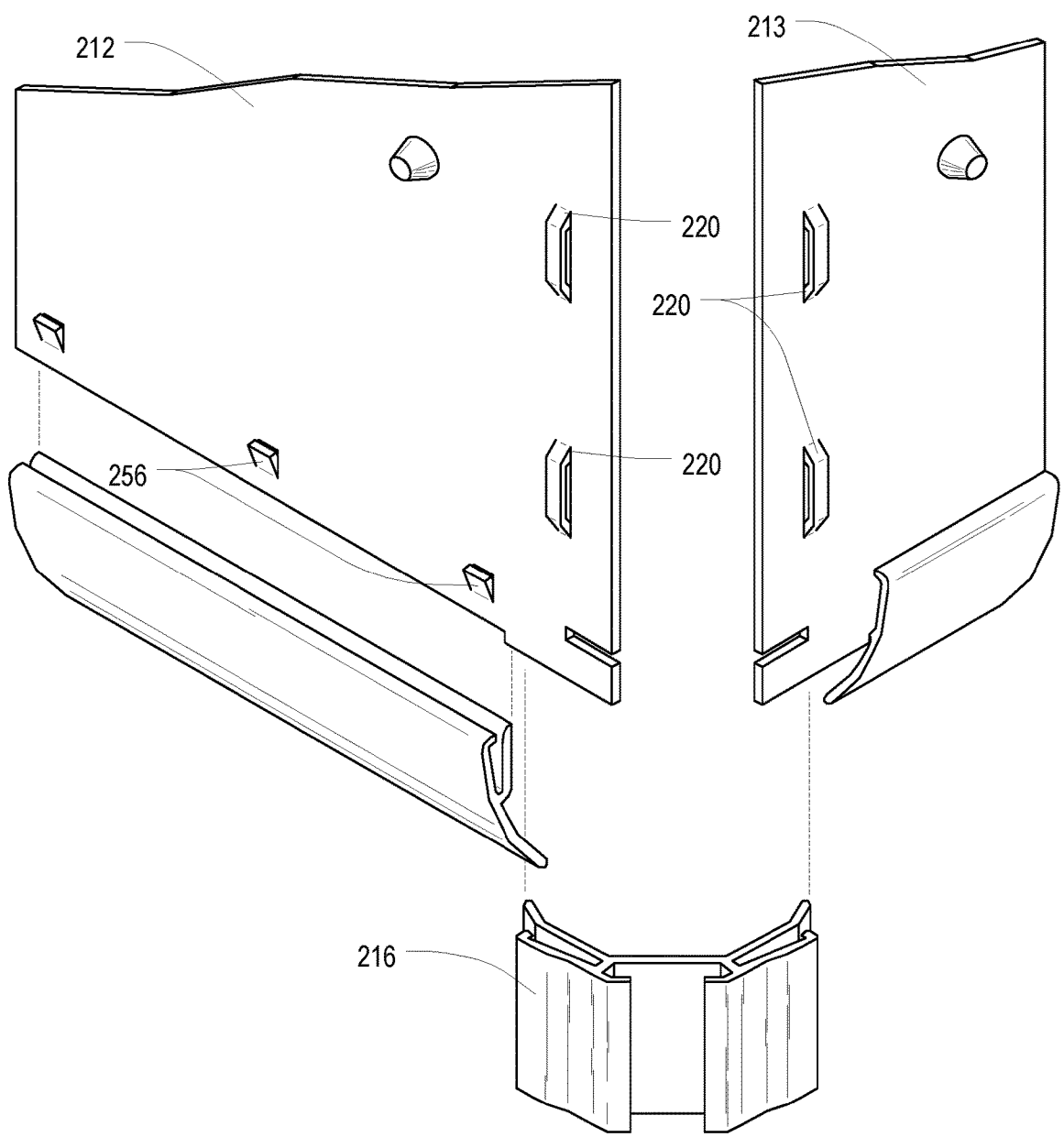
FIG. 12 is a partially exploded isometric view of some of the elements of the upper duct section of the telescoping exhaust air duct of FIG. 10.
Figure 13:
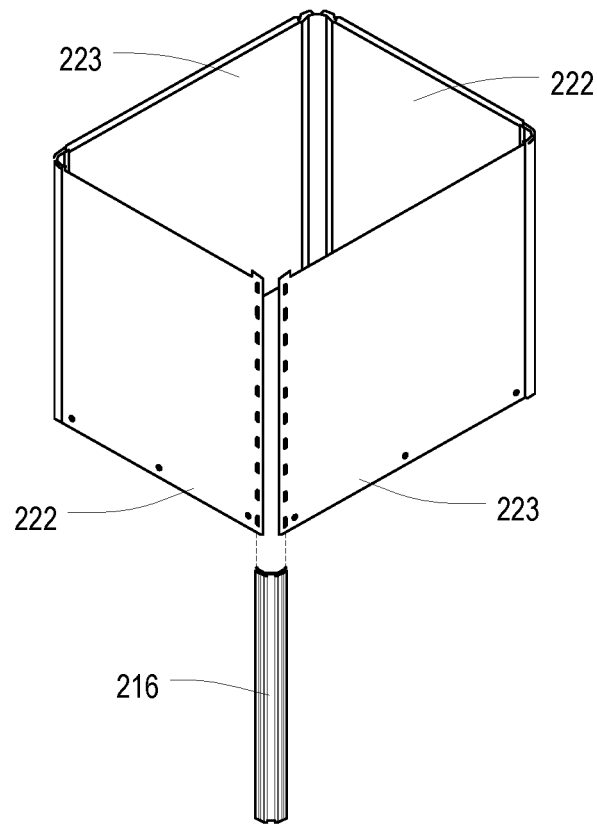
FIG. 13 is a partially exploded isometric view of some of the elements of the lower duct section of the telescoping exhaust air duct of FIG. 10.
Figure 14:
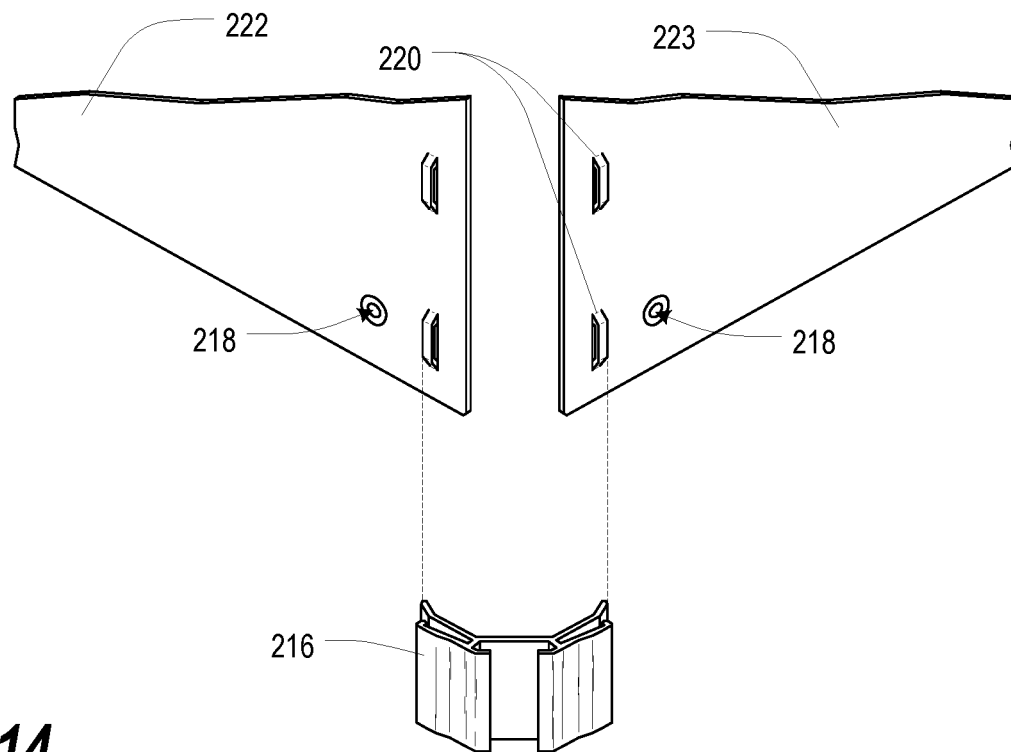
FIG. 14 is an enlarged, partially exploded isometric view of portions of the elements of FIG. 13.

FIG. 12 is a partially exploded isometric view of some of the elements of the upper duct section 200 of the telescoping exhaust air duct 198 of FIG. 10, while FIG. 13 is a partially exploded isometric view of some of the elements of the lower duct section 202 of the telescoping exhaust air duct 198 of FIG. 10, and FIG. 14 is an enlarged, partially exploded isometric view of portions of the elements of FIG. 13. With reference to FIG. 10, the upper duct section 200 includes two pairs of panels 212, 213 connected together by corner fittings 216. Each panel 212, 213, which may be constructed from sheet metal, plastic laminate, plastic, or the like, or combinations thereof, preferably includes a series of raised bosses 220 along each of its lateral edges. Similarly, the lower duct section 202 includes two pairs of panels 222, 223 connected together by corner fittings 216, and each panel 222, 223, which likewise may be constructed from sheet metal, plastic laminates, plastic, or the like, or combinations thereof, preferably includes a series of raised bosses 220, perhaps best shown in FIG. 14, along each of its lateral edges. Each of the panels 222, 223 of the lower duct section preferably also includes one or more mounting apertures 218 along its base.

Figure 15:
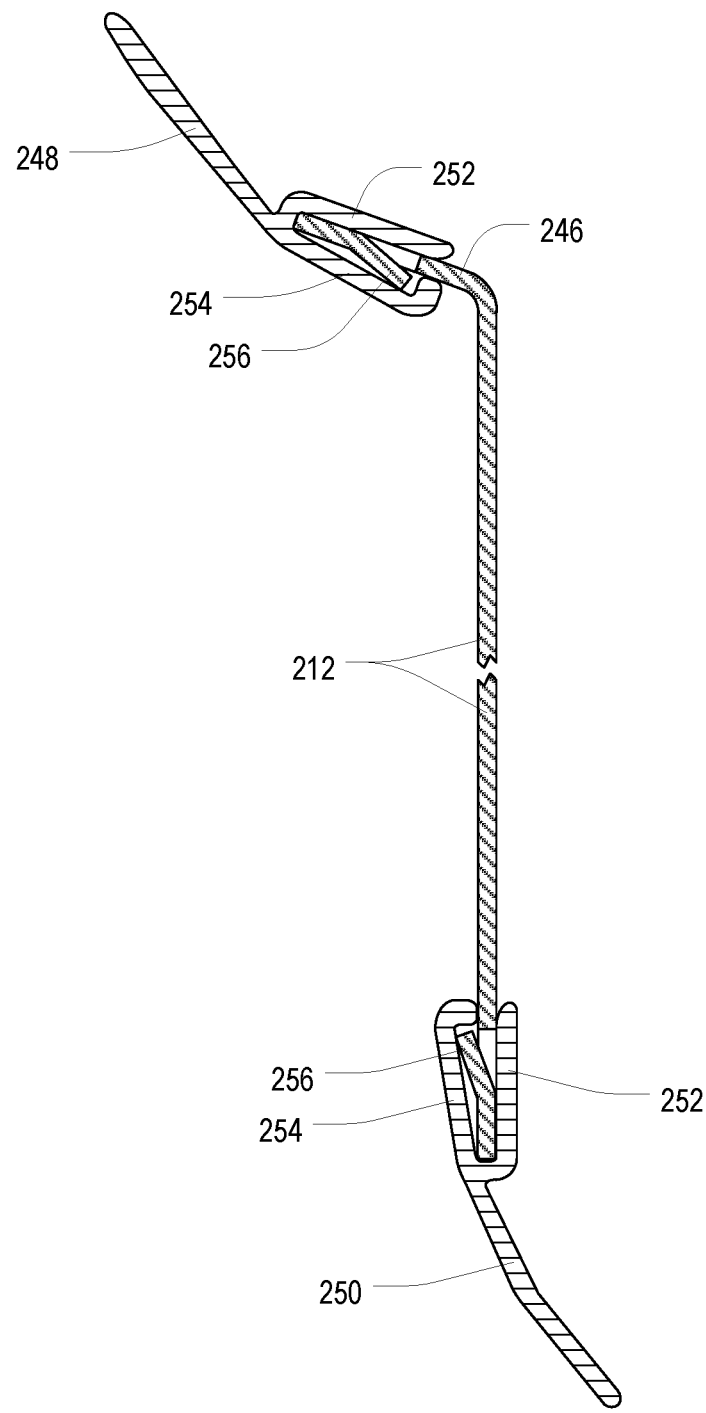
FIG. 15 is a side cross-sectional view of one of the panels of the upper duct section.

FIG. 15 is a side cross-sectional view of one of the panels 212 of the upper duct section 200. As shown therein, the upper edge of the panel 212 includes an outwardly flared portion 246 on which a top seal or gasket 248 is mounted. In particular, the outwardly flared portion 246 is angled relative to the rest of the panel 212, but alternatively may be more gradually flared, angled, curved or the like. Furthermore, in at least one alternative embodiment, the upper edge of the panel 212 is not flared, but the top seal (not shown) mounted thereon is flared. A bottom seal 250 is mounted along the lower edge of the panel 212. Viewed from one end, each seal 248, 250 includes two fingers 252, 254 that define a channel into which fits a respective edge of the panel 212. One finger 254 is hooked to fit over and engage a series of outwardly-extending tabs 256 along a respective upper or lower edge of the panel 212. Referring to FIG. 10, the top seals 248 are angled at their ends in the form of a miter edge such that each top seal 248 fits against the top seals 248 on the sides of the upper duct section 200 that are adjacent to it. The bottom seals 250 are sized to fit close to the corner locks 238, described below. All of the seals 248, 250 are generally intended to close off air gaps, either between the lower duct section 202 and the upper duct section 200 or between the upper duct section 200 and the ceiling or other structure above the enclosure 10 on which the telescoping duct 198 is mounted. The top seals 248, at least, are at least partially flexible and thus may be flexed as necessary to fit or butt against an uneven or misaligned ceiling or ceiling duct. Gaps in the upper corners, which may exist between the ends of the top seals 248 and the upper corners of the panels 212, 213, may be closed using a small plastic filler piece 258 (shown in FIG. 10) or the like.

Figure 16:
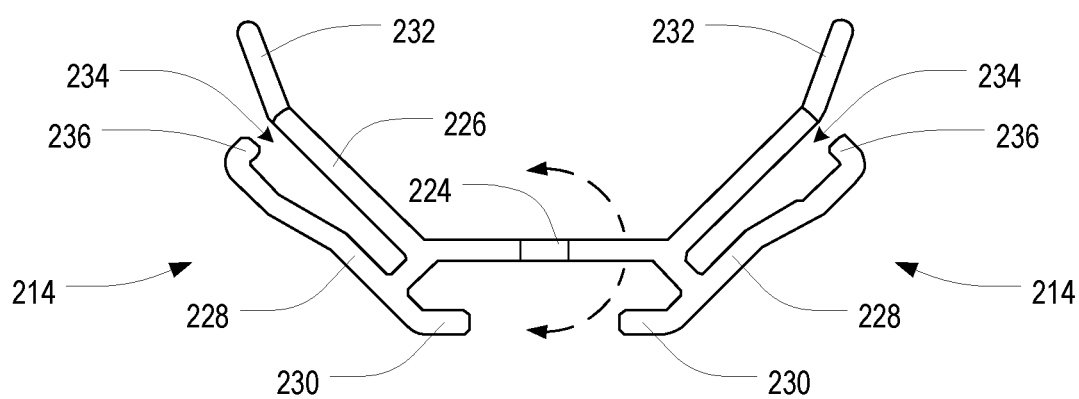
FIG. 16 is an end plan view of one of the corner fittings of FIG. 10.
Figure 17:
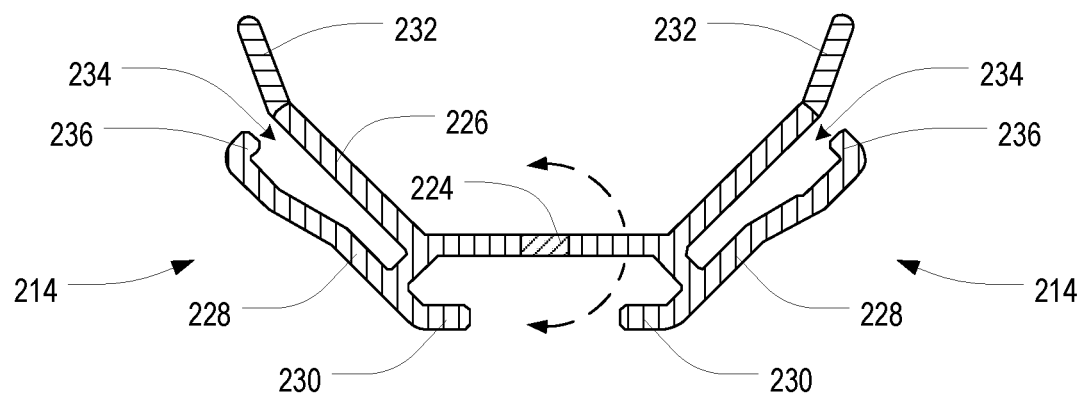
FIG. 17 is an end cross-sectional view of one of the corner fittings of FIG. 10.

FIGS. 16 and 17 are an end plan view and an end cross-sectional view, respectively, of one of the corner fittings 216 of FIG. 10. In at least some embodiments, each corner fitting 216 is of identical construction. As shown in FIGS. 16 and 17, each corner fitting 216 includes two finger arrays 214 connected together by a hinge 224. Each finger array 214 includes a guide finger 226, a latch finger 228 and a clamp finger 230. The guide finger 226 preferably includes a flexible finger tip 232 disposed at the end of a rigid portion. The guide finger 226 and latch finger 228 together define a panel channel 234 into which the lateral edge of a panel 212, 213, 222, 223 may be inserted. The latch finger 228 includes a hook 236 adapted to fit over the raised bosses 220 on the edge of any of the panels 212, 213, 222, 223 and thereby retain the panel edge in the channel 234. Preferably, each corner fitting 216 is formed in a co-extrusion process using flexible polyvinyl chloride ("PVC") for the flexible finger tips 232 and the central hinge 224 and rigid PVC for all other portions.

Figure 18:
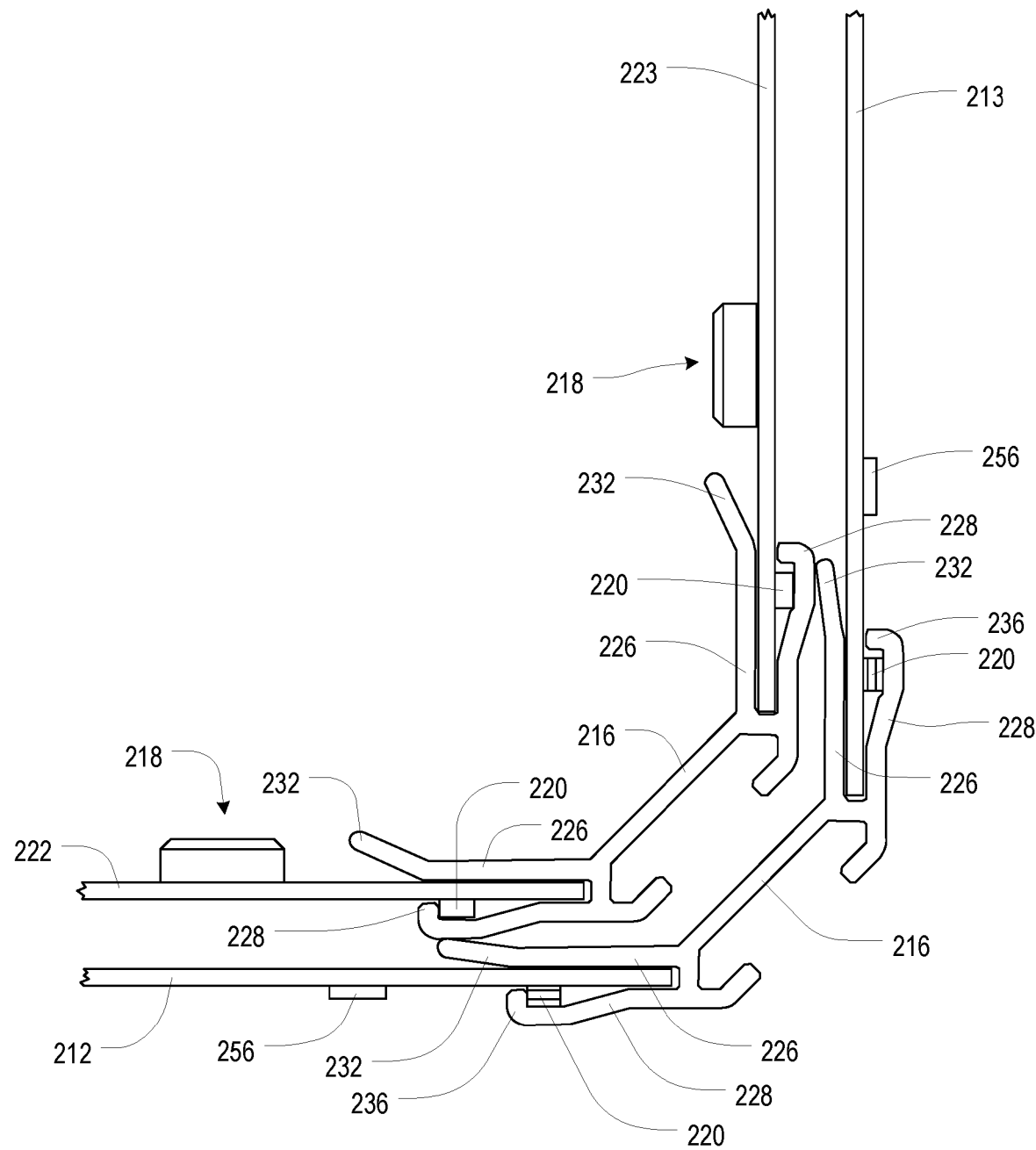
FIG. 18 is an enlarged end view of a portion of the telescoping exhaust air duct of FIG. 10.

FIG. 18 is an enlarged end view of a portion of the telescoping exhaust air duct 198 of FIG. 10. As shown therein, each corner fitting 216 connects two panels 212, 213 or 222, 223 together. The lateral edge of each panel fits snugly into a respective panel channel 234 (identified in FIGS. 16 and 17) defined between a guide finger 226 and the latch finger 228 adjacent thereto. The panel is retained in the channel 234 not only by the friction of the guide and latch fingers 226, 228 but by the hook 236 at the end of the latch finger 228, which, when the panel is seated properly within the channel 234, fits over the line of raised bosses 220.

With the corner fittings 216 in place on the edges of the panels 212, 213, 222, 223, the two duct sections 200, 202 may be assembled by inserting the lower duct section 202 within the upper duct section 200. In order to accomplish this, the guide fingers 226 on the corner fittings 216 of the upper duct section 200 make contact with the latch fingers 228 on the corner fittings 216 of the lower duct section, thereby causing the guide fingers 226 of the upper duct section 200, and particularly the finger tips 232, to be deflected slightly as shown in FIG. 18. This helps provide a snug fit between the respective corner fittings 216 but still permits the upper duct section 200 to be telescoped relative to the lower duct section 202 to a desired length.

Figure 19:
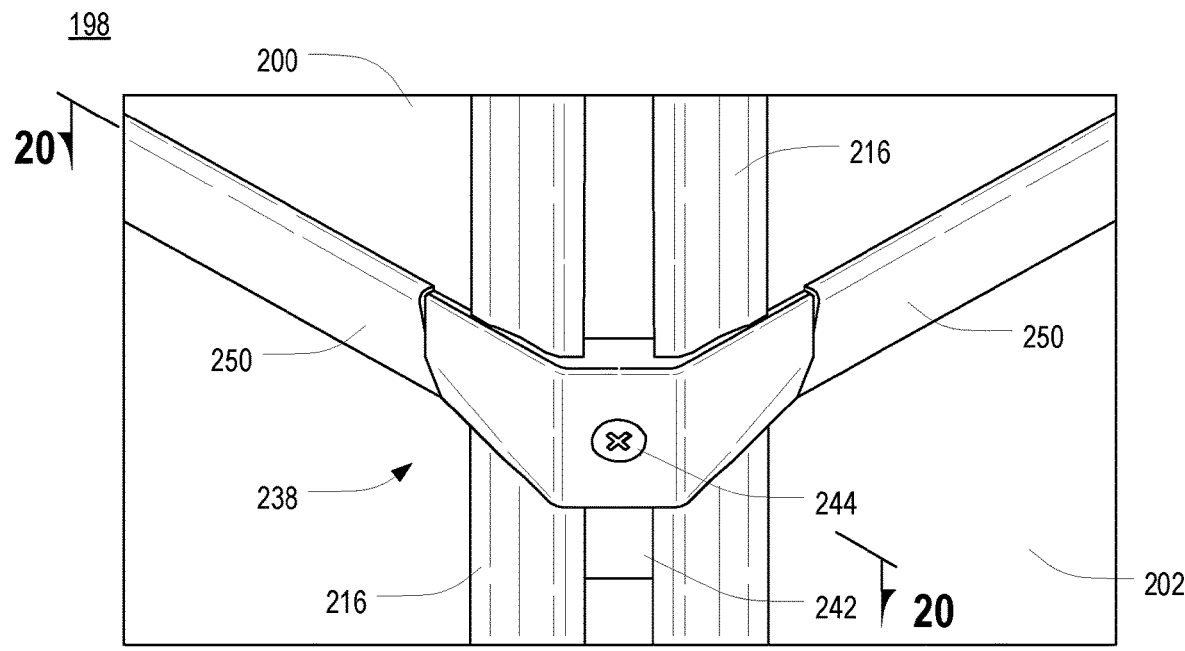
FIG. 19 is an enlarged isometric view of a portion of the telescoping exhaust air duct of FIG. 10.
Figure 20:
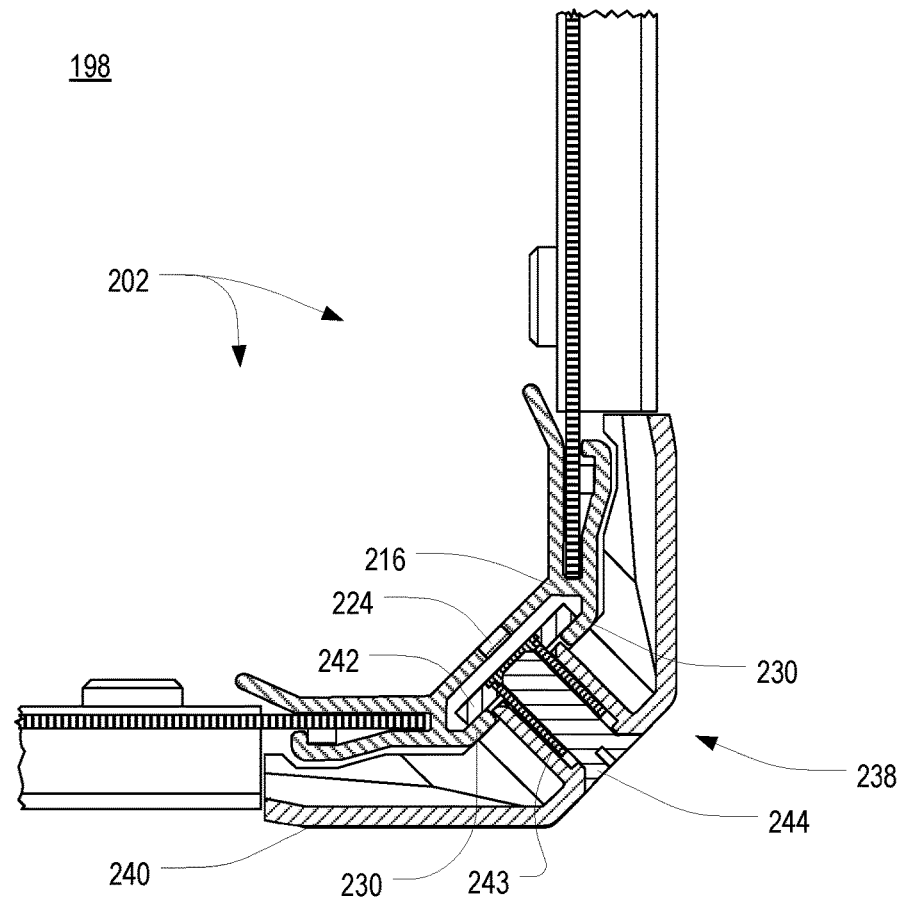
FIG. 20 is an enlarged cross-sectional view of a portion of the telescoping exhaust air duct of FIG. 10, taken along line 20-20.

FIG. 19 is an enlarged isometric view of a portion of the telescoping exhaust air duct 198 of FIG. 10. In particular, FIG. 19 illustrates one of four corner locks 238 in its disposition at the lower end of one of the corner fittings 216 on the upper duct section 200. The same corner lock 238 is shown in FIG. 20, which is an enlarged cross-sectional view of a portion of the telescoping exhaust air duct 198 of FIG. 19, taken along line 20-20. As shown in FIGS. 19 and 20, the corner lock 238 includes a main body 240, a lock plate 242, and a lock screw 244. The lock screw 244 is received in a threaded insert 243 carried in an opening penetrating the main body 240 such that the head of the screw 244 is accessible from the outside of the main body 240, as shown in FIG. 19, and the distal end of the screw 244 is received and held in the lock plate 242. The corner lock 238 is coupled to one of the corner fittings 216 on the lower duct section 202 by loosening the lock screw 244 and positioning the lock plate 242 within the space or channel created between the hinge 224 and the clamp fingers 230 of the lower corner fitting 216, as shown in FIG. 20. With the lock plate 242 in position, the lock screw 244 may be tightened to clamp the clamp fingers 230 of the lower corner fitting 216 between the lock plate 242 and an inner surface of the main body 240 of the corner lock 238.

Once all four corner locks 238 are properly coupled to the lower corner fittings 216, the upper duct section 200 may be telescoped relative to the lower duct section 202 by loosening the lock screws 244 in all four corner locks 238, sliding the upper corner fittings 216, including the corner locks 238, relative to the lower corner fittings 216, and tightening the lock screws 244 to secure the corner locks 238 to the lower corner fittings 216 once more. In this way, the upper duct section 200 may be precisely extended any desired amount from the top of the lower duct section 202, thereby providing infinite adjustability along the extent of the upper and lower corner fittings 216.

With reference to FIGS. 10 and 11, one or more angle brackets 210 may be utilized to attach the lower duct section 202 to the top of the enclosure 10. One member of each angle bracket 210 may be attached to an upper side cross member 22, the top panel 38 or another part of the top of the enclosure 10, while the other member of the angle bracket 210 may be attached to the bottom of the one of the panels 223 of the lower duct section 202 using the apertures 218 provided for that purpose. It is not necessary for all four sides of the lower duct section 202 to be attached to the enclosure 10.

Figure 21A:
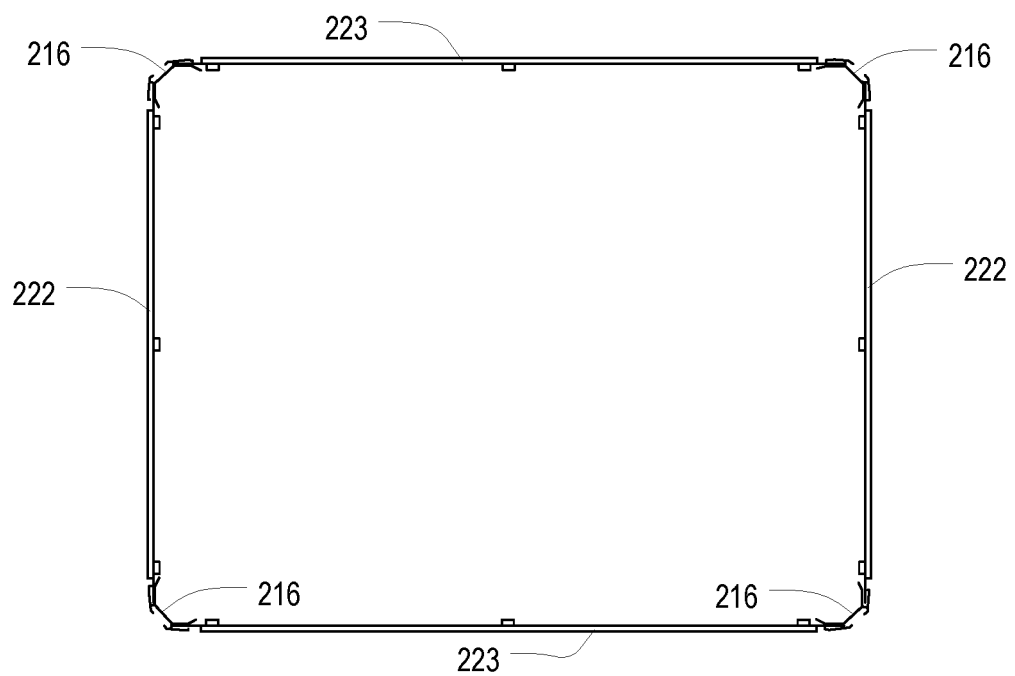
FIGS. 21A-21D are a series of end views of one of the duct sections of FIG. 10, illustrating its collapsibility feature.
Figure 21B:
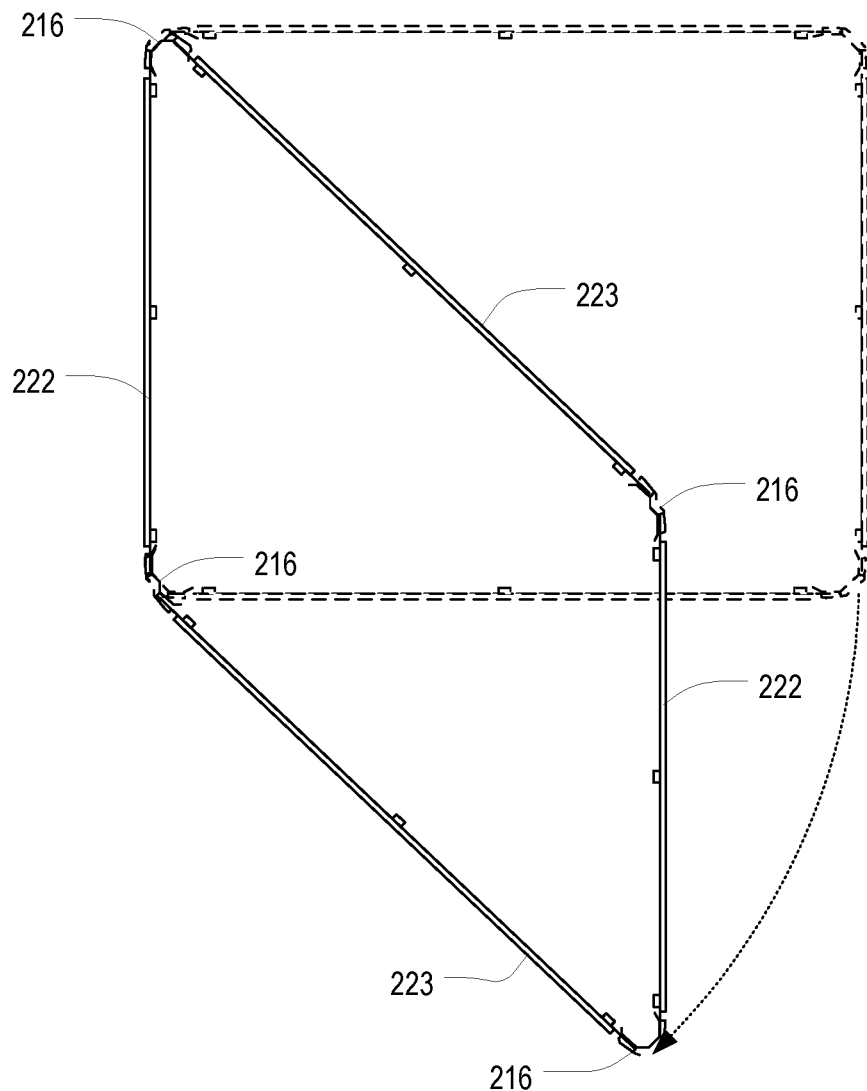
Figure 21C:
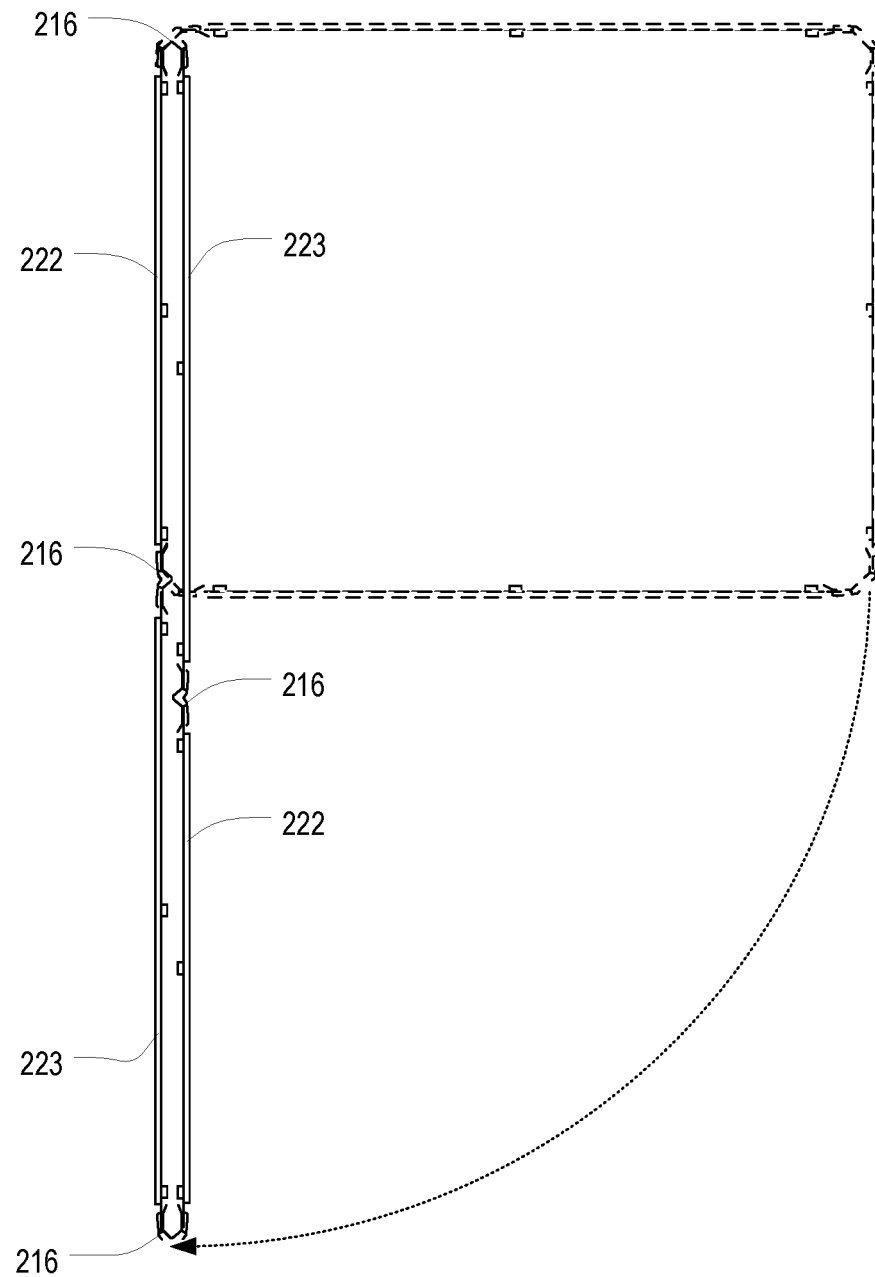
Figure 21D:
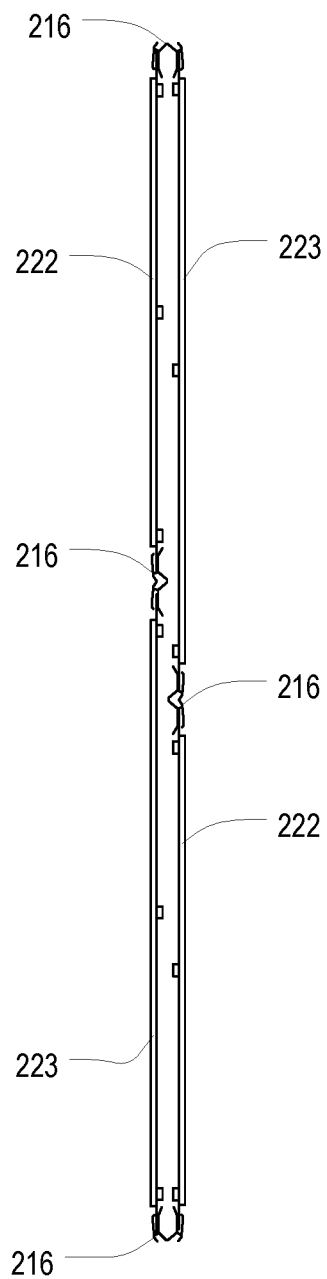

As described previously and illustrated in FIGS. 16 and 17, each corner fitting 216 includes a central hinge 224. FIGS. 21A-21D are a series of end views of one of the duct sections 200, 202 of FIG. 10, illustrating its collapsibility feature. More particularly, FIG. 21A is an end view of the lower duct section 202, shown in its normal use position, while FIG. 21B is an end view end view of the lower duct section 202 illustrating its partial collapse, FIG. 21C is an end view of the lower duct section 202 illustrating its complete collapse, and FIG. 21D is an end view of the lower duct section 202, shown in its completely collapsed position. The central hinges 224 of the various corner fittings 216 permit the lower duct section 202 (as well as the upper duct section 200), which takes the form in this respect of a parallelogram, to be collapsed completely to a relatively flat state, shown in FIG. 21D. This feature advantageously permits each duct section 200, 202 to be assembled at the point of manufacturing, placed in its completely collapsed state, and shipped flat to its destination, where it may be expanded to its normal use position by an installer or user. Each duct section 200, 202 may be readied for installation by rotation or manipulation of the respective panels about the central hinges 224 to place the duct section in the use state shown in FIG. 21A. It will be appreciated that similar construction may be utilized to provide a single (non-extendible) duct section that may likewise be collapsed for shipment or the like and opened or expanded for use.

FIGS. 8, 9 and 10 thus illustrate three different exhaust air ducts 14, 98, 198, but only the first and third of the three are illustrated installed on top of an enclosure 10. Nonetheless, in the descriptions that follow, it will be appreciated that in at least some embodiments, any of the latter two telescoping exhaust air ducts 98, 198 may be substituted for the first exhaust air duct 14 without departing from the scope of the present invention. Thus, although only the first air duct 14 is further described in use hereinbelow, it will be understood that the following descriptions are equally applicable to the other air ducts 98, 198 unless otherwise indicated.

Figure 22:
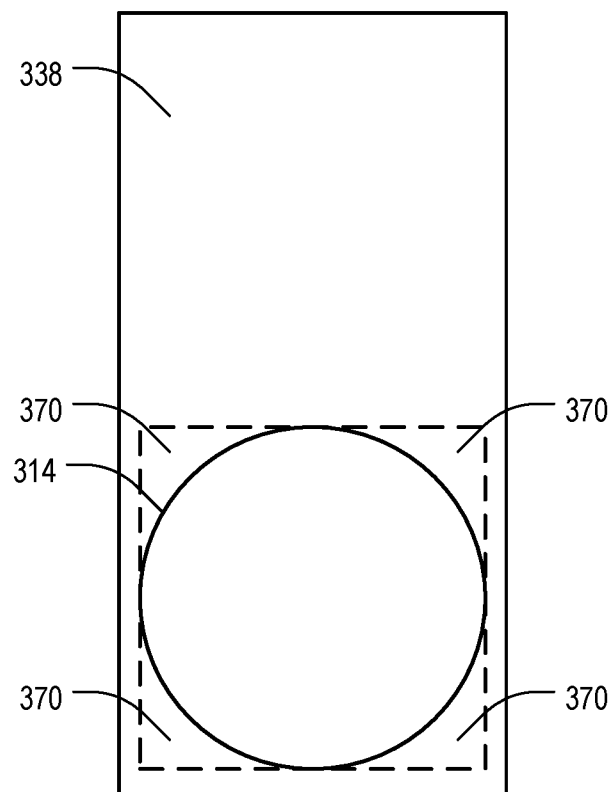
FIG. 22 is a schematic diagram illustrating a top view of a cylindrical exhaust duct mounted on the top panel of an enclosure.

Because of the positioning of the exhaust air duct 14 on the enclosure 10, the back panel 54 thereof is nearly vertically aligned with a vertical plane of the back panel 40 of the enclosure 10. Further, because the rectangular shape of the exhaust air duct 10 is similar to the rectangular shape of the back of the enclosure 10, exhaust air flows freely through the exhaust air duct 14. In contrast, in a conventional cylindrical exhaust air duct, air from the back of the angularly shaped enclosure, particularly the corners of the enclosure, must take a tortuous and winding path in order to exit the server enclosure. This relatively complex air flow scheme decreases the rate at which and the amount of air that may exit the enclosure. Further because the rectangular exhaust air duct 14 is similar in shape to the back of the enclosure 10 itself, it can be made larger in cross-section than conventional cylindrical ducts, thus allowing for more airflow through the exhaust air duct 14. This is illustrated in FIG. 22, which is a schematic diagram illustrating a top view of a cylindrical exhaust duct 314 mounted on the top panel 338 of an enclosure. As shown therein, corner areas 370 of the top panel 338 block the free flow of air out of the top of the enclosure. Accordingly, the rectangular cross-section of the exhaust air duct 14 facilitates increased transfer of thermal energy from the enclosure 10 in comparison to conventional enclosures with conventional exhaust air ducts 14 because of the increased exhaust air flow rate and the decreased resistance to flow permitted by the size, shape and smooth panels of the rectangular exhaust air duct 14. These benefits are particularly well-achieved when the width of the top opening 42 is at least 75% as wide as the width of the top panel 38, and/or when the front-to-back depth of the top opening 42 is at least 30% as deep as the front-to-back depth of the top panel 38, is more particularly well-achieved when the width of the top opening 42 is at least 80% as wide as the width of the top panel 38, and/or when the front-to-back depth of the top opening 42 is at least 35% as deep as the front-to-back depth of the top panel 38, and even more particularly well-achieved when the width of the top opening 42 is at least 85% as wide as the width of the top panel 38, and/or when the front-to-back depth of the top opening 42 is at least 40% as deep as the front-to-back depth of the top panel 38.

Figure 26:
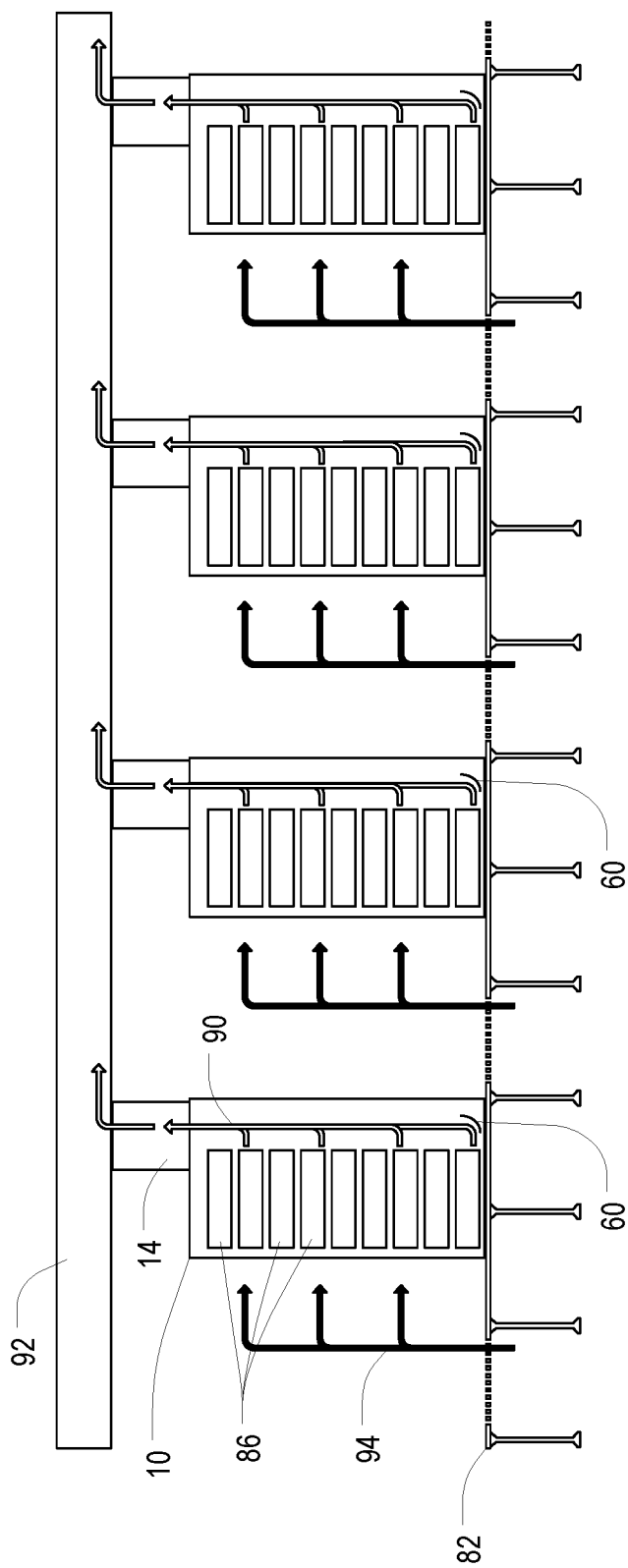
FIG. 26 is a schematic illustration of a series of ducted exhaust equipment enclosures.

As shown in FIG. 26 (described below), the exhaust air duct 14 may be connected to a room's exhaust air removal system, which commonly includes a return air duct. However, the exhaust air duct 14 does not have to be connected to a return air duct. The enclosure 10 may vent directly into the room into which the enclosure 10 is placed. This approach is more useful in rooms that have high ceilings into which to vent the hot air, however, the natural buoyancy of hot air will keep the hot vented air at or near the top of the room into which it is vented.

The enclosure 10 may be used in connection with a hot aisle/cold aisle configuration of a data center or computer room. If a series of enclosures 10 are arranged in a row in such configuration, the exhaust air ducts 14 form a vertical wall rising from the tops of the enclosures 10 due to their size and shape. This vertical wall may serve as a barrier to recirculation, thereby improving the performance of the hot aisle/cold aisle thermal system.

Figure 23:
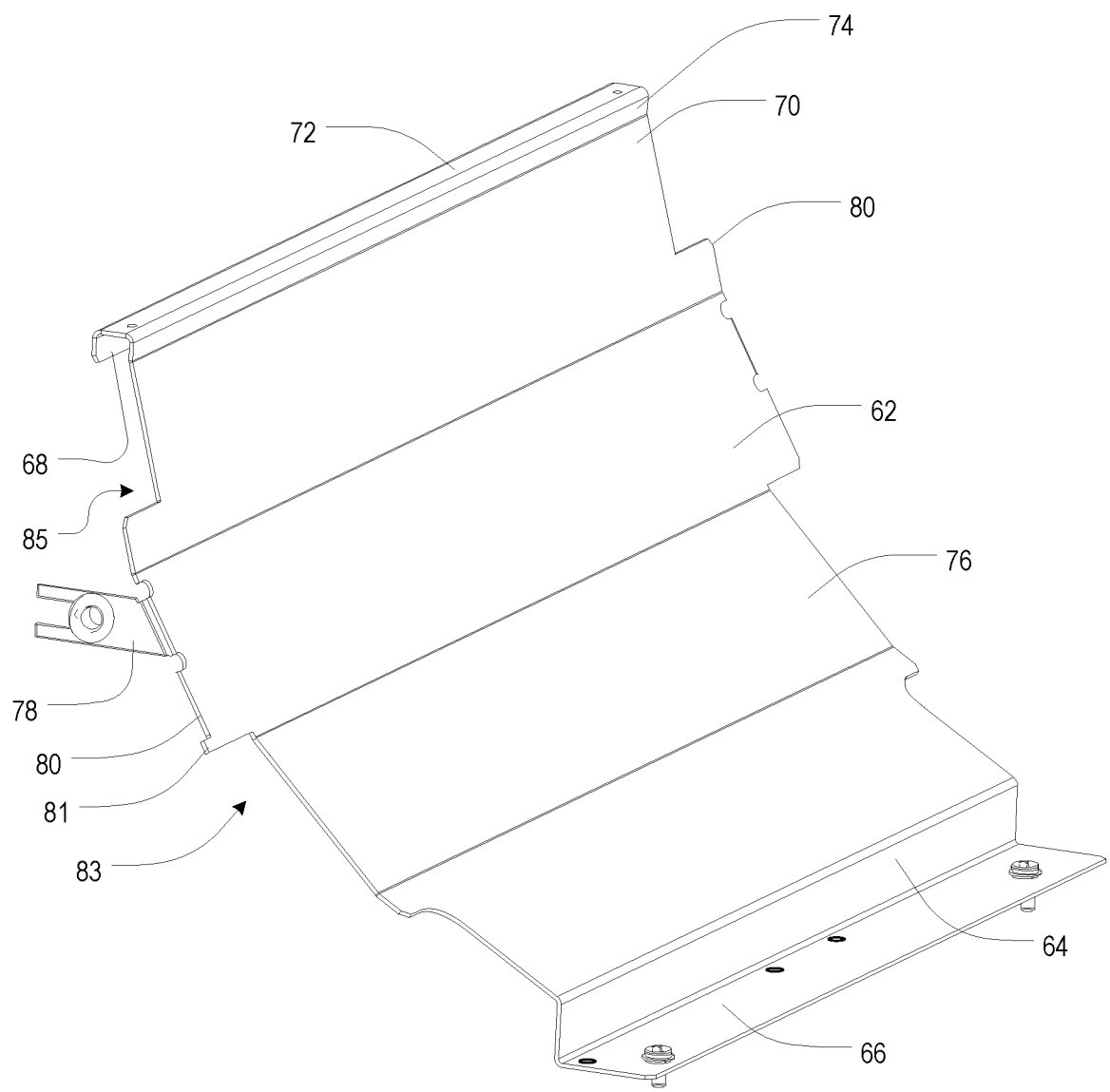
FIG. 23 is a front orthogonal view of the scoop of FIG. 7.

As seen in FIG. 7, the enclosure 10 may also include an air flow director or air diverter 60 located near the bottom of the enclosure 10 and generally directly beneath the opening 42 for the exhaust air duct 14. FIG. 23 is a front orthogonal view of the air diverter 60 of FIG. 7. As shown therein, the air diverter 60 comprises a planar panel 62 having a series of creases or bends therein so as to create a generally scoop-shaped structure. Preferably, the creases or bends are generally regularly spaced such that cross-section of the structure approximates an arc, as evident from FIG. 7. Of course, it will be evident to the Ordinary Artisan that alternatively the structure may, in fact, have a uniformly curved (non-planar) cross-section, but the use of a planar panel 62 that is bent or creased to approximate an arc cross-section may improve manufacturability. Further, it will be evident that while the present embodiment comprises a generally curved structure, it is important to note that the air diverter 60 may comprise any shape that creates a scoop effect for air flowing through the enclosure 10.

The air diverter 60 has a width that at its maximum is substantially the same as the distance between the horizontal mounting rails 28. The air diverter 60 includes a pair of wing elements 80 disposed opposite one another on opposite side edges of the air diverter 60. The wing elements 80 extend beyond the side edges of the air diverter 60 such that they essentially span the entire distance between the horizontal mounting rails 28. A bottom edge 64 of the air diverter 60 has a flange 66 for connecting the air diverter 60 to the bottom panel 36 of the enclosure 10. Any known connection means may be used to join the air diverter 60 to the bottom panel 36 of the enclosure 10. Alternatively, the air diverter 60 may be left unfastened to the bottom panel 36, thereby permitting the air diverter 60 to be relocated forward or backward from the location illustrated in FIG. 7. If left unfastened, it is useful to include means for preventing the air diverter 60 from being rotated upward by the forces applied by cables as described hereinbelow. One such means is a small protuberance 81 that may be included on the wing elements and that hooks underneath the horizontal mounting rails 28 to which the diverter 60 is attached as described below.

The air diverter 60 further includes a "U"-shaped channel member 68 disposed at a top edge 70 thereof. The channel member 68 includes a top surface 72 and two side surfaces 74 extending from the top surface 72. One of the side surfaces 74 is attached to the top edge 70 of the air diverter 60. The channel member 68 is arranged such that the top surface 72 thereof extends away from a front surface 76 of the air diverter 60. The channel member 68 provides rigidity for the air diverter 60.

The channel member 68 also serves another purpose, as next described. As can be seen in FIG. 7, the enclosure 10 includes a cable openings 96 located behind and beneath the air diverter 60 and in the top panel 38. Cables (not shown) used to power components or supply data to or from components stored in the enclosure 10 can be routed through the cable openings 96. In particular, it is contemplated that a substantial number of cables may be disposed between the back panel 40 of the enclosure 10 and the air diverter 60, and in fact, the back of the air diverter 60 may aid in forcing the cables toward the rear of the enclosure 10. Such cables may exert a considerable amount of tension on the back of the air diverter and particularly on the uppermost and/or rearmost surfaces of the channel member 68. If these surfaces are rough, they could potentially cause considerable chafing on the surfaces of the cables, thereby damaging them. Advantageously, because the distal edge of the channel member 68 is pointed downward, the cables instead make contact with the relatively smooth surfaces of the top and side surfaces 72, 74, thereby protecting the cables from damage. In this regard, in at least one alternative embodiment (not illustrated), the channel member 68 may be replaced by an arcuate member that provides a minimum radius of curvature, thereby preventing cables from being bent unnecessarily.

The air diverter 60 further includes a pair of connection tabs 78 disposed on the wing elements 80 thereof. The wing elements 80 are generally positioned at a height corresponding to the elevation of the lowermost horizontal mounting rail 28 within the enclosure 10, and the tabs 78 therefore provide a means for the air diverter 60 to be connected to a pair of horizontal mounting rails 28 of the enclosure 10 using the mounting rail slots, described previously and visible in FIG. 7. Further, any known connection means may be used to connect the air diverter 60 to the bottom panel 36 of the enclosure 10 as desired.

Notably, although not shown, because the wing elements 80 extend out from the side edges of the air diverter 60, the vertical mounting rails 30 may alternatively be disposed between the side edges of the air diverter 60 and the horizontal mounting rails 28 in the inset areas 83, 85 located above and below the wing elements 80. Thus, the vertical mounting rails may be arranged by a user at nearly any location along the horizontal mounting rails 28 from the front to the back of the enclosure 10, other than where the wing elements 80 are present. The lower inset area 85 also provides another function, in that cables entering the bottom of the enclosure 10 may be routed forward almost immediately after entering the enclosure using the space provided by the lower inset area 85. In the absence of such a space, cables would have to be routed up and over the wing elements, thus making the cables unnecessarily long.

Figure 24:
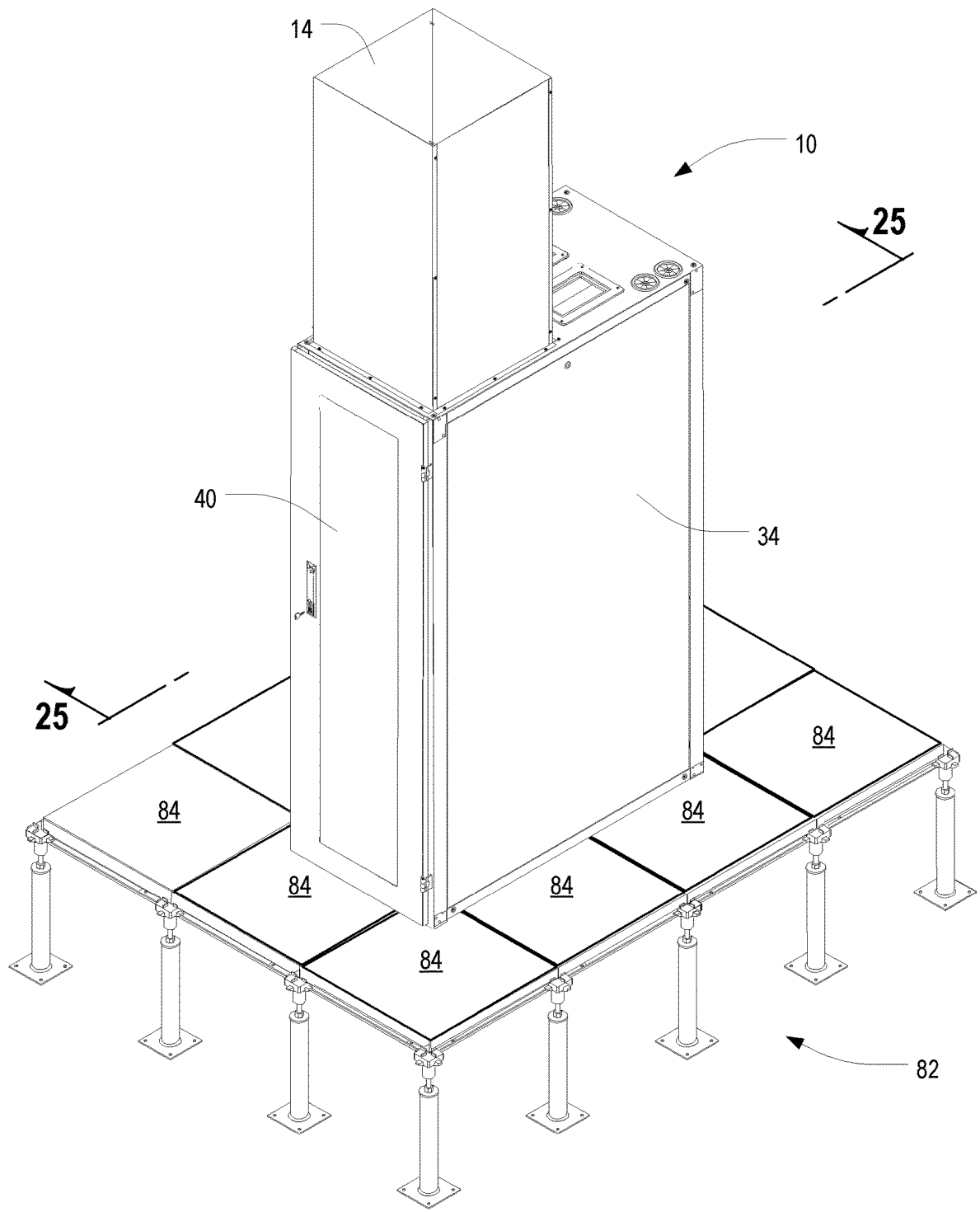
FIG. 24 is a rear isometric view of the ducted exhaust equipment enclosure of FIG. 1, shown installed on a raised floor.
Figure 25:
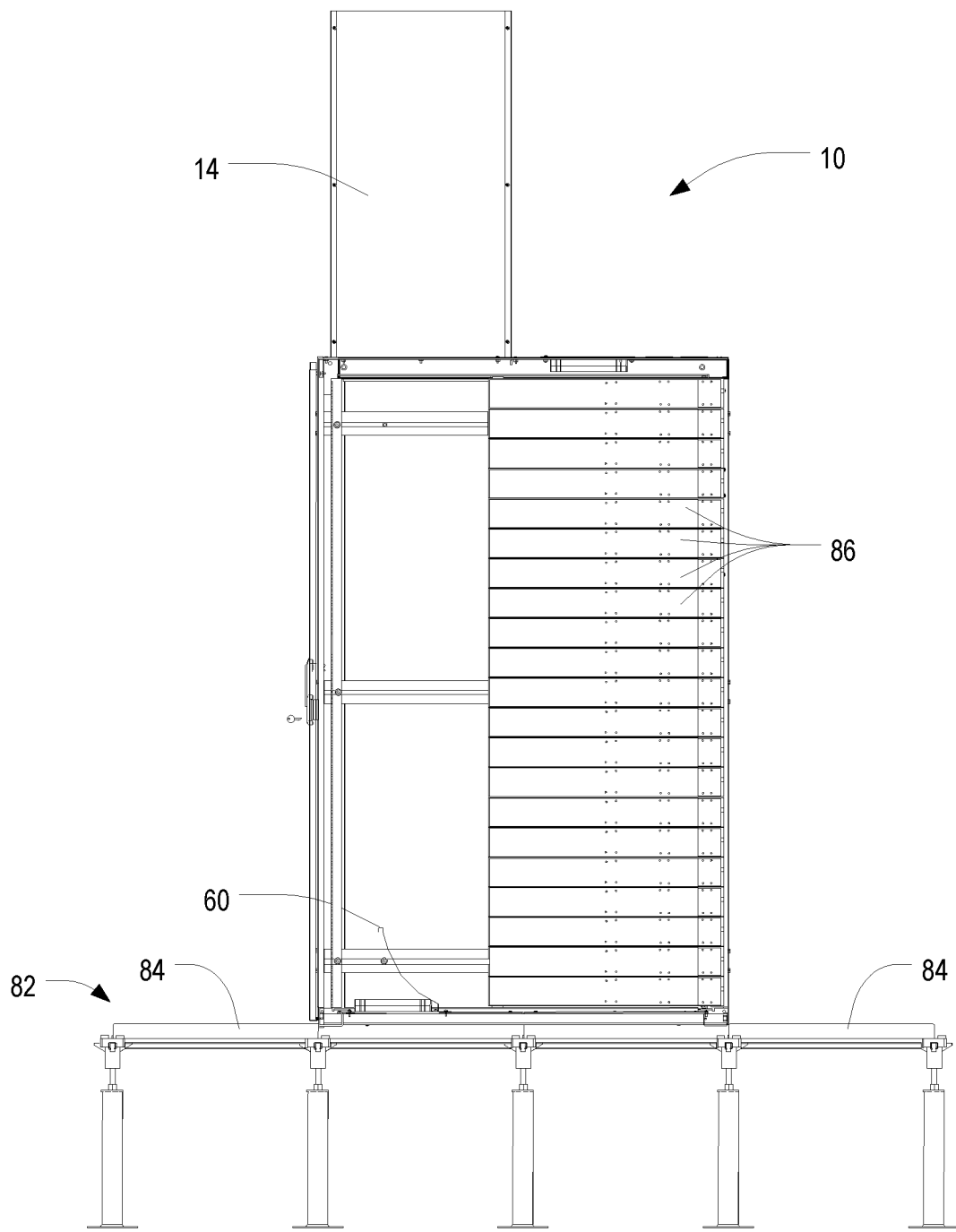
FIG. 25 is a side cross-sectional view of the ducted exhaust equipment enclosure of FIG. 24, taken along the line 25-25.

In use, the ducted exhaust equipment enclosure 10 is typically, though not always, installed on a raised floor 82. FIG. 24 is a rear isometric view of the ducted exhaust equipment enclosure 10 of FIG. 1, shown installed on a raised floor 82, and FIG. 25 is a side cross-sectional view of the ducted exhaust equipment enclosure 10 of FIG. 24, taken along the line 25-25. The raised floor 82 includes a plurality of floor panels or tiles 84 of standard size and conventional design, all supported above the permanent floor at a desired height. The floor tiles 84 conventionally include solid tiles as well as perforated or ventilated tiles, the latter of which are designed to permit cool air supplied from the space beneath the floor 82, commonly referred to as the raised floor plenum, to flow therethrough. In particular, a ventilated tile may be located directly in front of the enclosure 10 to provide the most direct path to the interior of the enclosure and the air intakes for the equipment 86 located inside. Further, although not specifically illustrated herein, the area directly underneath such an enclosure 10 is often left fully or partially open by eliminating one or more tiles 84, by using tiles 84 with large openings therein, or by using tiles 84 that are less than full-size.

FIG. 26 is a schematic illustration of a series of ducted exhaust equipment enclosures 10 showing cool air flowing in and hot return air flowing out. As shown in FIGS. 24 and 25, once one or more enclosures 10 are installed on the raised floor 82, electronic equipment 86 is installed in the various equipment enclosures 10, typically by attaching the equipment 86 to the vertical mounting rails 30, and operated normally. As described previously, the equipment 86 generates considerable thermal energy while it operates. The thermal energy is carried by air currents which may be forced or forcibly drawn out of the rear of the various active pieces of equipment 86 by internal fans (not shown), often supplemented by separate fans (not shown) mounted in or on the enclosures 10. The air-impervious rear door 40 prevents heated air from escaping out the rear of the enclosure 10 where it would mix with cool air outside and be drawn back through the enclosures 10. Heated air near the bottom of each enclosure 10 is further redirected upward by the air diverters 60. The heated air is then exhausted through the exhaust air ducts 14 as represented by arrows 90, and into the return air duct 92. Once there, the heated air is handled by the CRAC, sometimes in combination with additional ducts, fans, partitions, and/or other equipment (not shown).

At the same time, cool air, represented by arrows 94, flows up through the perforated tiles 84 and in through the front of the enclosure 10, thereby facilitating the flow of air through the enclosure 10 and cooling the equipment 86 mounted therein. Although not shown, cool air is often also guided through the openings directly beneath the enclosure 10. Care must be taken to force such air to the front of the equipment 86 to avoid letting it escape immediately up the back of the enclosure 10.

Thus, the ducted exhaust equipment enclosure 10 allows the components 86 stored therein to draw the required volume of air through the enclosure 10, and then directs the exhaust out of and away from the enclosure 10 thereby eliminating the problem of air recirculation. The ducted exhaust equipment enclosure 10 segregates hot exhaust air by directing it up an exhaust air duct 14 at the top rear of the enclosure 10. This approach delivers enhanced cooling of components resulting in a more efficient use of available cool air and better overall heat transfer away from components.

Preferably, and as shown in FIG. 26, the exhaust air duct 14 is connected to a drop ceiling return air plenum. However, this is not necessary where high ceilings can offer sufficient clearance for the return air to stratify above the cold air in the room.

Several benefits become obvious with this architecture. For example, enclosures 10 do not have to be oriented front-to-front and back-to-back along hot aisle/cold aisle rows, as they do with conventional hot aisle/cold aisle arrangements. This freedom allows enclosure arrangements to be driven by other infrastructure requirements. In addition, up to 100% of the exposed floor can be perforated. Perforated tiles 84 can be located anywhere in the room. Using ducted exhaust equipment enclosures 10 allows the entire data center to be cold, i.e., no more hot zones. Cold intake air can be pulled from anywhere in the room. An enclosure 10 no longer has to obtain all of the airflow needed from the raised floor tile directly in front or adjacent to it. As such, airflow balancing issues are significantly reduced, if not, alleviated. By enabling cold air to be delivered through 100% of the tile in the raised floor 82, it is contemplated that the airflow available to any given enclosure 10 can be doubled thereby doubling the heat load capacity of the enclosure 10.

It is important to note that because the ducted exhaust equipment enclosures can be used in data centers both with raised floors 82 or without raised floors 82, they are extremely versatile. The ducted exhaust equipment enclosures 10 can be used in rooms with or without a raised floor 82 and can be partially or completely cooled using a raised floor plenum or by an alternative cooling means such as ducts within a data center. Accordingly, the following scenarios are possible with the ducted exhaust equipment enclosures: 1) a data center wherein cold air is supplied using only a raised floor approach, 2) a data center wherein no raised floor is present and cold air is supplied using only alternative approaches to a raised floor, e.g., ducts in the room, 3) a data center wherein a raised floor 82 is present but cold air is supplied by ducts in the room, and 4) a data center wherein cold air is partially supplied by ducts in the room and partially supplied by a raised floor plenum.

Use of the ducted exhaust equipment enclosures 10 also creates the opportunity to deploy high density applications in a non-raised floor environment because cold air can be delivered directly into the room rather than through a raised floor. In addition, the use of ducted exhaust equipment enclosures 10 avoids any dependency on booster fans, with the accompanying concerns over additional heat loads, fan failure and redundancy, thereby reducing the cost of equipping a data center.

In the process described above, each air diverter 60 reduces or eliminates eddies that would otherwise be present in the hot return air at the bottom rear of the enclosure 10. Such eddies can cause computer components mounted at the bottom of the enclosure 10 to operate at a higher temperature than components mounted higher up in the enclosure 10. The air diverter 60 reduces or eliminates such eddies by turning hot return air upward in the direction of primary flow of hot return air. It is contemplated that intermediate half-scoop air diverters (not shown) may also be added at various vertical spacing locations along the back of the enclosure 10. These intermediate half-scoops of various sizes and shapes may be used to further improve air flow and air balance. Advantageously, although the exhaust air duct 14 may be used by itself, the various scoops help start the vertical flow of heated air up toward the duct 14, thereby making it function more efficiently than if used by itself.

The enclosure 10 may include additional features to aid in airflow management of the enclosure 10. One such feature is the inclusion of metal bracket seals 88 around the connection means used to connect the back door panel 40 to the enclosure 10. The seals 88 further ensure that exhaust air exits the enclosure 10 via the exhaust air duct 14 rather than through small openings around the connection means or edges of the door. Further, foam or rubber gaskets (not shown) may be added to, or may replace, the metal bracket seals 88 to create a further barrier to air release.

Another contemplated feature is a brush opening in the bottom panel 36 of the enclosure 10. Often an enclosure will have an opening in the bottom panel thereof for receipt of cables that provide power and other input or output to the components stored in the enclosure. Unfortunately, air is able to flow freely through the opening thereby altering the intended airflow scheme of the enclosure. It is possible to include a plurality of bristles extending inwardly from opposing sides of the opening such that exterior ends of the bristles are touching. The bristles essentially cover the opening thereby preventing air from flowing there through.

In the same instance, the cables are still able to pass through the opening by displacing the bristles for their passage there through. Although the brushes are not shown in FIG. 7, it is contemplated that the cable opening 96 of the enclosure 10 will be a brush opening.

Based on the foregoing information, it is readily understood by those persons skilled in the art that the present invention is susceptible of broad utility and application. Many embodiments and adaptations of the present invention other than those specifically described herein, as well as many variations, modifications, and equivalent arrangements, will be apparent from or reasonably suggested by the present invention and the foregoing descriptions thereof, without departing from the substance or scope of the present invention.

Accordingly, while the present invention has been described herein in detail in relation to its preferred embodiment, it is to be understood that this disclosure is only illustrative and exemplary of the present invention and is made merely for the purpose of providing a full and enabling disclosure of the invention. The foregoing disclosure is not intended to be construed to limit the present invention or otherwise exclude any such other embodiments, adaptations, variations, modifications or equivalent arrangements; the present invention being limited only by the claims appended hereto and the equivalents thereof. Although specific terms are employed herein, they are used in a generic and descriptive sense only and not for the purpose of limitation.

What is claimed is:

1. An arrangement of ducted exhaust equipment enclosures, comprising:
   (a) a row of electronic equipment enclosures, each including:
      (i) a frame structure formed from a plurality of support posts and cross members, and
      (ii) a plurality of panels, including a top panel, at least partially enclosing the frame structure and defining a single compartment for mounting an electronic component,
      (iii) wherein the top panel and upper portions of the frame structure forming a top of the electronic equipment enclosure, the electronic equipment enclosure top having a rectangular opening therein and also an outer perimeter, and
      (iv) wherein the rectangular opening has a side side-to-side width that is at least 75% of a side-to-side width of the electronic equipment enclosure top perimeter; and
   (b) a row of exhaust air ducts, each extending upward from a respective electronic equipment enclosure top, for exhausting hot air from the compartment of the respective electronic equipment enclosure, wherein:
      (i) at least a lower section of the exhaust air duct is rectangular in cross-section,
      (ii) the side-to-side width of the exhaust air duct cross-section is substantially the same as the side-to-side width of the rectangular opening in the electronic equipment enclosure top, and
      (iii) the lower section of the exhaust air duct is disposed in surrounding relation to, in fluid communication with, and aligned with, the opening in the electronic equipment enclosure top such that an interior of the exhaust air duct is in direct and unobstructed fluid communication with the interior of the single compartment;
   (c) wherein the exhaust air ducts form a vertical wall rising from the tops of the electronic equipment enclosures.

2. The arrangement of ducted exhaust equipment enclosures of claim 1, wherein the side-to-side width of the rectangular opening in each electronic equipment enclosure top is at least 80% of the side-to-side width of the perimeter of the electronic equipment enclosure top.

3. The arrangement of ducted exhaust equipment enclosures of claim 2, wherein the side-to-side width of the rectangular opening in each electronic equipment enclosure top is at least 85% of the side-to-side width of the perimeter of the electronic equipment enclosure top.

4. The arrangement of ducted exhaust equipment enclosures of claim 1, wherein the rectangular opening in each electronic equipment enclosure top is disposed toward the rear of the compartment.

5. The arrangement of ducted exhaust equipment enclosures of claim 4, wherein the rectangular opening in each electronic equipment enclosure top is disposed entirely in a rear half of the electronic equipment enclosure top.

6. The arrangement of ducted exhaust equipment enclosures of claim 5, wherein the rectangular opening in each respective electronic equipment enclosure top has a front-to-back length, and wherein the front-to-back length of the rectangular opening is at least 30% of the front-to-back length of the perimeter of the respective electronic equipment enclosure top.

7. The arrangement of ducted exhaust equipment enclosures of claim 6, wherein the front-to-back length of the rectangular opening in the electronic equipment enclosure top is at least 35% of the front-to-back length of the perimeter of the electronic equipment enclosure top.

8. The arrangement of ducted exhaust equipment enclosures of claim 7, wherein the front-to-back length of each rectangular opening is at least 40% of the front-to-back length of the perimeter of the electronic equipment enclosure top.

9. The arrangement of ducted exhaust equipment enclosures of claim 1, wherein each electronic equipment enclosure has a back panel that is generally air-impervious to prevent heated air from escaping therethrough.

10. The arrangement of ducted exhaust equipment enclosures of claim 1, wherein the side-to-side width of each exhaust air duct is selected to correspond to the width of the respective enclosure such that the width is as wide as possible and still be mountable to the top of the enclosure.

11. The arrangement of ducted exhaust equipment enclosures of claim 1, wherein the lower section of each exhaust air duct has a bottom opening that is substantially the same size and shape as a size and shape of the rectangular opening of the respective electronic equipment enclosure top.

12. The arrangement of ducted exhaust equipment enclosures of claim 1, wherein a respective narrow portion of each electronic equipment enclosure top extends along each side of the rectangular opening.

13. The arrangement of ducted exhaust equipment enclosures of claim 12, wherein the respective exhaust air duct is attached to the respective narrow portions of the electronic equipment enclosure top via mounting flanges attached directly thereto.

14. The arrangement of ducted exhaust equipment enclosures of claim 1, wherein, in each electronic equipment enclosure, an air plenum is defined by an interior of a back panel, interiors of side panels, and a rear of equipment mounted in the enclosure, wherein the air plenum extends vertically within the enclosure, wherein the air plenum has a side-to-side width, and wherein the side-to-side width of the rectangular opening is substantially as wide as the side-to-side width of the air plenum.

15. The arrangement of ducted exhaust equipment enclosures of claim 14, wherein the rectangular opening in each respective electronic equipment enclosure top has a front-to-back length, wherein the air plenum in the respective electronic equipment enclosure has a front-to-back length, and wherein the front-to-back length of the rectangular opening is substantially as long as the front-to-back length of the air plenum.

16. The arrangement of ducted exhaust equipment enclosures of claim 14, wherein the side-to-side width of each exhaust air duct is substantially as wide as the side-to-side width of the respective air plenum.

17. An arrangement of ducted exhaust equipment enclosures, comprising:
 (a) a row of electronic equipment enclosures, each including:
  (i) a frame structure formed from a plurality of support posts and cross members, the frame structure having a front-to-back length and a side-to-side width, and
  (ii) a plurality of panels, including a top panel, at least partially enclosing the frame structure and defining a single compartment for mounting an electronic component,
  (iii) wherein the top panel and upper portions of the frame structure forming a top of the electronic equipment enclosure, the electronic equipment enclosure top having a rectangular opening therein and also an outer perimeter,
  (iv) wherein the rectangular opening has a side side-to-side width that is at least 75% of a side-to-side width of the perimeter of the electronic equipment enclosure, and
  (v) an air plenum is formed behind a rear of equipment mounted in the enclosure, wherein the air plenum extends vertically within the enclosure, wherein the air plenum has a side-to-side width, and wherein the side-to-side width of the rectangular opening in the electronic equipment enclosure top is substantially as wide as the side-to-side width of the air plenum; and
 (b) a row of exhaust air ducts, each extending upward from a respective electronic equipment enclosure top, for exhausting hot air from the compartment of the respective electronic equipment enclosure, wherein:
  (i) at least a lower section of the exhaust air duct is rectangular in cross-section, and
  (ii) the side-to-side width of the exhaust air duct cross-section is substantially the same as the side-to-side width of the rectangular opening in the electronic equipment enclosure top; and
 (c) wherein the exhaust air ducts form a vertical wall rising from the tops of the electronic equipment enclosures.

18. The arrangement of ducted exhaust equipment enclosures of claim 17, wherein a respective narrow portion of each electronic equipment enclosure top extends along each side of the respective rectangular opening.

19. The arrangement of ducted exhaust equipment enclosures of claim 18, wherein each exhaust air duct is attached to the respective narrow portions of the electronic equipment enclosure top via mounting flanges attached directly thereto.

20. The arrangement of ducted exhaust equipment enclosures of claim 17, wherein the rectangular opening in each respective electronic equipment enclosure top has a front-to-back length, and wherein the front-to-back length of the rectangular opening is at least 30% of the front-to-back length of the perimeter of the respective electronic equipment enclosure top.

* * * * *